(12) United States Patent
Baretz

(10) Patent No.: US 10,957,827 B2
(45) Date of Patent: Mar. 23, 2021

(54) LIGHT EMITTING DIODE

(71) Applicant: Bruce H. Baretz, Montclair, NJ (US)

(72) Inventor: Bruce H. Baretz, Montclair, NJ (US)

(*) Notice: Subject to any disclaimer, the term of this patent is extended or adjusted under 35 U.S.C. 154(b) by 0 days.

(21) Appl. No.: 16/657,297

(22) Filed: Oct. 18, 2019

(65) Prior Publication Data

US 2020/0119234 A1    Apr. 16, 2020

Related U.S. Application Data

(63) Continuation of application No. 10/979,677, filed on Nov. 2, 2004.

(60) Provisional application No. 60/569,007, filed on May 7, 2004.

(51) Int. Cl.
| | | |
|---|---|---|
| *H01L 33/52* | (2010.01) | |
| *H01L 33/50* | (2010.01) | |
| *H01L 33/48* | (2010.01) | |
| *F21K 9/232* | (2016.01) | |

(52) U.S. Cl.
CPC .......... *H01L 33/504* (2013.01); *H01L 33/483* (2013.01); *H01L 33/52* (2013.01); *F21K 9/232* (2016.08)

(58) Field of Classification Search
CPC ...... H01L 33/483; H01L 33/504; H01L 33/52
See application file for complete search history.

(56) References Cited

U.S. PATENT DOCUMENTS

| | | |
|---|---|---|
| 1,180,159 A | 4/1916 | Langmuir |
| 1,246,118 A | 11/1917 | Langmuir |
| 2,182,732 A | 12/1939 | Friedrich |
| 2,259,040 A | 10/1941 | Inman |
| 2,854,600 A | 9/1958 | Van De Weij |
| 3,973,155 A | 8/1976 | Warren et al. |

(Continued)

FOREIGN PATENT DOCUMENTS

| | | |
|---|---|---|
| CA | 470923 | 1/1951 |
| CA | 507420 | 11/1954 |

(Continued)

OTHER PUBLICATIONS

A.J. Steckl, et. al.; Compound Semiconductor, 2000, 6 (1), 48.

(Continued)

*Primary Examiner* — Cuong Q Nguyen

(57) ABSTRACT

A light emitting assembly comprising a solid state device, when and if coupleable with a power supply constructed and arranged to power the solid state device to emit from the solid state device a first wavelength radiation, and an enveloping vessel enhancing the luminescence of the solid-state device and providing a mechanism for arranging luminophoric medium in receiving relationship to said first, radiation, and which in exposure to said first radiation, is excited to responsively emit second wavelength radiation or to otherwise transfer its energy without radiation to a third radiative component. In a specific embodiment, monochromatic blue or UV light output from a light-emitting diode is converted to achromatic light without hue by packaging the diode with fluorescent organic and/or inorganic fluorescers and phosphors on the walls of the solid-state light envelope which keeps the diode and the fluorescers and phosphors under a vacuum or a rare or Noble gas.

12 Claims, 4 Drawing Sheets

(56) References Cited

U.S. PATENT DOCUMENTS

| | | | |
|---|---|---|---|
| 4,469,980 | A | 9/1984 | Johnson |
| 4,535,269 | A | 8/1985 | Tschetter et al. |
| 4,992,704 | A | 2/1991 | Stinson |
| 5,254,477 | A | 10/1993 | Walt |
| 5,334,855 | A | 8/1994 | Moyer et al. |
| 5,424,006 | A | 6/1995 | Murayama et al. |
| 5,583,349 | A | 12/1996 | Norman et al. |
| 5,660,461 | A | 8/1997 | Ignatius et al. |
| 5,714,835 | A | 2/1998 | Zachau et al. |
| 5,754,337 | A | 5/1998 | Burns et al. |
| 5,813,752 | A | 9/1998 | Singer et al. |
| 5,813,753 | A | 9/1998 | Vriens et al. |
| 5,847,507 | A | 12/1998 | Butterworth et al. |
| 5,869,929 | A | 2/1999 | Eida et al. |
| 5,874,803 | A | 2/1999 | Garbuzov et al. |
| 5,895,932 | A | 4/1999 | Bojarczuk, Jr. et al. |
| 5,898,185 | A | 4/1999 | Bojarczuk, Jr. et al. |
| 5,966,393 | A | 10/1999 | Hide et al. |
| 5,998,925 | A | 12/1999 | Shimizu et al. |
| 6,028,694 | A | 2/2000 | Schmidt |
| 6,066,861 | A | 5/2000 | Hohn et al. |
| 6,069,440 | A | 5/2000 | Shimizu et al. |
| 6,084,250 | A | 7/2000 | Justel et al. |
| 6,245,259 | B1 | 6/2001 | Hohn et al. |
| 6,277,301 | B1 | 8/2001 | Hohn et al. |
| 6,576,930 | B2 | 6/2003 | Reeh et al. |
| 6,592,780 | B2 | 7/2003 | Hohn et al. |
| 6,600,175 | B1 * | 7/2003 | Baretz .................. H01L 33/504 257/100 |
| 6,603,258 | B1 | 8/2003 | Mueller-Mach et al. |
| 6,613,247 | B1 | 9/2003 | Hohn et al. |
| 6,791,259 | B1 | 9/2004 | Stokes et al. |
| 2003/0025449 | A1 | 2/2003 | Rossner |
| 2003/0039119 | A1 * | 2/2003 | Cao ......................... F21K 9/232 362/227 |
| 2003/0222268 | A1 | 12/2003 | Yocom et al. |
| 2004/0016938 | A1 | 1/2004 | Baretz et al. |
| 2004/0135154 | A1 | 7/2004 | Doxsee et al. |
| 2004/0173807 | A1 | 9/2004 | Tian et al. |
| 2005/0212397 | A1 * | 9/2005 | Murazaki ........... C09K 11/7734 313/487 |
| 2005/0230691 | A1 * | 10/2005 | Amiotti .................. H01L 33/44 257/79 |

FOREIGN PATENT DOCUMENTS

| | | |
|---|---|---|
| CA | 2448514 | 1/2003 |
| GB | 190308147 | 1/1904 |
| GB | 190424470 | 2/1905 |
| GB | 190409718 | 3/1905 |
| GB | 190609253 | 9/1906 |
| GB | 191208086 | 10/1912 |
| GB | 191417326 | 4/1915 |
| GB | 284746 | 1/1928 |
| GB | 448887 | 6/1936 |
| GB | 454348 | 9/1936 |
| GB | 474297 | 10/1937 |

OTHER PUBLICATIONS

Demand for Jury Trial: *Nichia* vs. *Sharper Image*; published by the United States District Court Northern District of California; Case No. C04-1360.

Diana Lynne Bull, "A study of fluorescent nanoparticles: Quantum dots and silica dots"; A thesis presented to the Faculty of the Graduate School of Cornell University in partial fulfillment of the requirements for the Degree of Master of Science, Aug. 2004.

Documents associated with Complaint of Osram GmbH and Osram Opto Semiconductors GmbH under Section 337 of the Tariff Act of 1930; "In the Matter of Certain Light-Emitting Diodes and Products Containing the Same": oublished bv United States International Trade Commission. Investiaation No. 337-TA-512.

Loiykowski, et. al.; "Photoluminescence and cathodoluminescence of GaN doped with Praseodymium", MRS Internet Journal, Nitiride Semiconductor Research 5S1, W11.64, 2000.

Nadir Farchtchian, Bert Braune, Herbert Brunner; Phosphor-converted LEDs take on industrial applications, Laser Focus World, Sep. 2004, vol. 40, Issue 9; Penn Well Corporation, Nashua, New Hampshire.

P. Schlotter et. al.; "Luminescence conversion of blue light emitting diodes"; Applied Physics A 64, 417 (1997).

P. Schlotter et. al.; Materials Science and Engineering B59 !1999), 390-394.

U. Kaufmann et. al.; "Single Chip White LEDs", physica status solidi, vol. 192, Issue 2; pp. 246-253; published online: Jul. 12, 2002 by Wiley-VCH Verlag Berlin GmbH, Federal Republic of Germany.

* cited by examiner

LIGHT EMITTING DIODE

CROSS REFERENCE TO RELATED APPLICATIONS

This application is a Continuation of U.S. Nonprovisional application Ser. No. 10/979,677 filed 2 Nov. 2004; which claims the benefit of U.S. Provisional Application Ser. No. 60/569,007 filed 7 May 2004; each of which is incorporated herein by reference in its entirety.

FIELD OF THE INVENTION

This invention relates to solid state light emitting devices such as light emitting diodes, also called LEDs, and more particularly to such devices which produce achromatic light without hue (white light) or chromatic light with hue (colored light). The present invention is based on the discovery that a highly efficient achromatic, chromatic and non-visible light emitting device may be simply and economically fabricated utilizing a solid state light emitting diode die that in the absence of certain elements of the following generates primary radiation which transfers its energy, radiatively or non-radiatively, to secondary luminescent elements where the diode die and or the secondary luminescent elements are in an enhancing and or protecting enclosure. The invention enhances and protects both the p-n junction and or luminescent elements associated with light generation instantaneously and over the long term.

BACKGROUND OF THE INVENTION

General illumination is a basic need of society which becomes most evident when it is not otherwise available. Throughout the history of lighting innovation, the challenge facing the inventor and those engaged to practice the inventions have been to 1) coax more light from the device of interest, 2) produce the light more efficiently, 3) effect the produced light in a manner that is physiologically preferred, 4) produce the aforementioned maximal light for longer periods of time and 5) manufacture the device that meets the first four criteria in a lowest possible competitive cost. In almost all cases, the advancement of the art for nascent lighting devices has taken a long a tortuous path requiring innovation from a multitude of inventors and scientists and the practicable application of these innovations in manufacturing and ultimately in the marketplace. The more recent discovery of white light solid-state lighting from a single light emitting diode die (B. H. Baretz et. al., U.S. Pat. No. 6,600,175, filed on 26 Mar. 1996, issued on 29 Jul. 2003; hereinafter "Baretz et. al. [2003]") has elevated the heretofore chromatic solid-state lights unsuitable for general illumination into a lighting innovation with providence; it is expected, to be an alternative device for indoor and outdoor lighting. It is the present day desire to improve the performance of achromatic solid-state lights, primarily, and chromatic light secondarily so that the current deficiencies for these devices based on p-n junction be resolved. The invention that I have made is a dramatic improvement in the utility of solid-state lights based on semiconductor p-n junctions in the context of 1) light output, 2) light efficiency, 3) light projection and utility, 4) light generation durability and 5) the physiological appreciation of the light so produced.

The aforementioned invention of Baretz et. al. [2003] allows white light for general illumination to be generated using photons emanating from at least one p-n junction which, when connected to a power supply with a suitable electrical current, initially generates the aforesaid photons through a hole-electron recombination at the p-n junction. In contrast, earlier advances in general illumination allowed for white light to be generated using photons emanating from a heated wire where the heat is generated by electrical current flowing through the wire or an arc is passed through a medium with elements excitable by the electrical current.

My current invention solves many of the problems that solid-state lighting presently experiences when using light-emitting diode die with a semiconductor p-n junction for the generation of achromatic and chromatic light, as defined hereinafter. My present invention focuses on certain elements of the design of the lamp and allows for a broader implementation of achromatic light formation from a single diode die capable of producing primary radiation in the visible or outside the visible light spectrum.

Incandescent and Gas-Filled Incandescent Lamps

General illumination prior to the discovery of electrical stimulus required gas or other means of generating aflame. In the year 1810 Sir Humphrey Davy, in the Royal Institution in London, using batteries and pieces of willow charcoal formed an electric bow or "arc": this experiment laid the foundation for all subsequent "arc" lighting systems. It is generally agreed by those examining the history of technologies impacting general illumination that Davy was also the founder of incandescent electric lighting, as he at this early period made both platinum and carbon incandescent filaments and observed light when powered by means of his proprietary battery. After describing his experiments with the arc light, Sir Davy has been reported to additionally remark: "And a platinum wire 1/30 of an inch in thickness and 18 inches long, placed in circuit between the bars of copper, instantly became red hot, then white hot, and the brilliancy of the light was insupportable to the eye." (W. J. Hammer in "The William J. Hammer Historical Collection of Incandescent Electric Lamps." Reprinted from The Transactions of the New York Electrical Society, New Series, No. 4, 1913; hereinafter Hammer (1913).)

Relying on the discourse of Hammer (1913) and his insight into the individual importance of innovations and inventions to improve incandescent lamps, it has been noted that the first English patent on the incandescent electric lamp was that of De Moleyns in 1841. He proposed to sprinkle finely divided carbon or graphite over the surface of an incandescent platinum wire. In 1858 Gardner and Blossom applied for a very early if not first American patent in this field; it—the claims of the patent—being for a platinum lamp to be used for a railway signal lamp. Hammer additionally acknowledges the contributions of many individuals—Konn (carbon rod, in Russia), Bouliguine (graphite rod, in Russia), Lodyguine (carbon block bulb under nitrogen, in Russia; also plated platinum wire with tungsten in 1893), Staite (iridium filament-1848), Fontaine (France), Draper (platinum wire lamp), Sawyer (arched paper filament lamp), Maxim (patented a platinum lamp in 1879), and others—even if these earlier contributions did not lead to the "establishment of the commercial incandescent electric lamp."

The English inventor Sir Joseph Wilson Swan has been generally credited from many different resources used as references available to the general public with creating the first electric light in 1860. The inventor's lighting device could not really be used yet because the filament burned up too quickly. Swan periodically improved his invention and gave the world's first lighting demonstration in 1878. Unfortunately, the device was still not entirely practical, at the time of the announcement, because of the short life of the filament. Nevertheless Swan remained a tour-de-force in the continuing evolution of practical and practicable technologies for general illumination.

We highlight the absence of commercial practicality in the context of device durability or operational longevity for a heated filament as the subsequent and early inventive improvements and commercial implications focused initially on perfection to the incandescence of the filament itself. Since a filament is a material through which an electrical current flows, the early research focused on changing the material, the process to make materials, and the process to make filaments from said materials. Subsequently, as detailed more completely hereinafter, the commercial practicality of incandescent lighting was found to be determined by many parameters of weightier significance than a sole focus on filament materials; it ultimately came to the realization of many that post-processing material effects, in the lamp itself, is of paramount importance. The current state of affairs related to the production of achromatic light from a single p-n junction as claimed by Baretz et. al. [2003] similarly acknowledges that improvements to the performance of the achromatic solid-state light can be accomplished by improvements to the production of photons from the hole-electron recombination. Heretofore, the focus on the commercial practicality of solid-state lighting has been on changing the semiconductor material, the process to make semiconductor materials, and more recently the process to make semiconductor devices from said semiconductor materials. As will become more apparent with complete specification of my invention contained herein, the methodology utilized to enhance the efficiency and magnitude of achromatic and chromatic light will be a function of improvements to many components that make up a solid-state lamp: for a semiconductor material itself, the present invention will also allow for improvement of hole-electron recombination in a lamp, for the very first time, by treatments within a lamp subsequent to the initial formation of the p-n junction.

Continuing with this discourse, notwithstanding the contributions of Swan, who remained an important contributor to advancing the art of incandescence, it is in the historical record that Henry Woodward of Toronto along with Matthew Evans patented an early light bulb in 1875. (H. Woodward and M. Evans, handwritten patent submitted in final form to the Patent Branch of the Canadian Department of Agriculture, No. 3738, Jul. 24, 1874) In perhaps one of the earliest examples of intellectual property licensing, Thomas Edison bought the rights to their patent. In 1879, it is generally understood, Thomas Edison finally completed the development of a practical incandescent light bulb after many hundreds of trials and errors. Interestingly from the perspective of innovations subsequently patented considerably later thereafter, Woodward and Evans teach "We claim—the placing of carbons in lamps or other suitable vessels filled with rarified gas, possessing the property of not chemically combining with the carbon when in a state of incandescence . . . " It is generally believed that nitrogen was the gas used by Woodward and Evans.

By the aforementioned references, it has been the general point of view that the greatest test that faced Edison was to find a substance for the filament that could remain heated for days before burning up. Despite all of the great inventions for general illumination that preceded Edison, the practicality of functional general illumination remained illusive; Edison believed early on that, regardless of which material worked best, the filament is obliged to be contained in a vacuum. (T. A. Edison, U.S. Pat. No. 227,229, issued May 4, 1880). Perhaps more elegantly than the environment, in which the incandescent filament was to find itself in the invention of Edison (1880), was the additional focus on the filament itself: a small amount of material that had a very high resistance to the current was his principal center of attention.

Although it is not generally appreciated, especially since the history of his subsequent commercial activities focused on non-metal filaments, Edison's first experimental lamp was a platinum lamp, but he alloyed iridium with the platinum, as had been done by Staite (who had patented in 1848, it has been reported, a horseshow shaped iridium filament for lighting) before him. A spiral coil filament was developed and this lamp was known as Edison's platinum-iridium thermostatic regulating lamp. (T. A. Edison, U.S. Pat. No. 214,636; issued: Apr. 22, 1879)

Notwithstanding this early focus on metal which, since it was platinum—a very expensive commodity—that also left the end user with less than optimal performance, non-metals became the more immediate focus: the goal was greater light output, greater durability and lower manufacturing cost. Edison tried hundreds of non-metal materials including bamboo and thread. It is well documented that Edison's success in October, 1879, with a carbonized cotton thread, when sealed in a glass bulb, lasted forty hours. (T. A. Edison, U.S. Pat. No. 223,898, issued Jan. 27, 1880). Subsequently, Edison found a better filament in carbonized strips of bamboo.

At the time of Edison's pioneering work, other innovators and inventors were seeking to improve the performance of certain components used in the incandescent lamp. Most of the effort focused—as did the effort of T. A. Edison—on the non-metal filament and it is known to be the case from references in the general literature that Lewis Howard Latimer then working with the United States Electric Lighting Company (Bridgeport Conn.) invented a method of making carbon filaments (L. H. Latimer, U.S. Pat. No. 252,386, issued Jan. 27, 1882) for the Maxim electric incandescent lamp. (J. V. Nichols, et. al., U.S. Pat. No. 247,097, issued Sep. 13, 1881) At the same time, it has been noted by many lighting historians that in Germany, Siemens & Haske perfected a light in 1878-1880 (differential arc lamp; also began to manufacture in Germany incandescent lamps of the design of Swan in 1882). In 1884, Latimer himself began to reportedly collaborate with Edison.

The widespread use of urban street lighting began with the differential arc lamp built in 1878 by Friedrich von Hefner-Alteneck, the chief designer at Siemens & Halske. In this lamp the burned-down carbon rods producing the light could be regulated automatically and several lamps could also run together off a single generator.

By 1890, eleven years after the successful completion of his first practical incandescent light, Edison had organized his various businesses into the Edison General Electric Company. It stands to reason that commercial efforts were in their full force to practice the inventions related to incandescent lamps as it had been over a decade in which the carbon filament as implemented by Edison (perhaps not uniquely but with sufficient skills and know-how so as to technically lead) had an opportunity to be further developed and improved.

At the same time of the commercialization efforts of the patents of Edison General Electric Company, the Thomson-Houston Company and the various companies that had merged to form it were also in an excellent position with patent rights necessary to commercialize and offer for the public good products in the electrical industry. In an 1890 catalogue [The Thomson-Houston Electric Company; Form B5-5700; Boston Dec. 1, 1890], the latter indicates that they make superior incandescent lamps as theirs "are manufactured under the well known Sawyer-Man patents". As with the efforts of Latimer and Edison himself, the Sawyer-Man patents related to carbon filaments. In an issued United States patent in the same period, Edison discusses the different capping used by Westinghouse and by Sawyer with the claims of the Edison capping—for universal screw-in receptacles revealing quite clearly the different functional forms of the same underlying technology. (T. A. Edison, U.S. Pat. No. 438,310 issued on October, 1890) In 1892, these two major companies—Edison General Electric Company and the Thomson-Houston Company—combined to form the General Electric Company. About the same time, the foundations for what was to become Koninklijke Philips Electronics N.V. were laid in Eindhoven, the Netherlands, in 1891, for the purpose of making carbon-filament lamps and by the turn of the century was one of the largest producers in Europe (in 1983 Philips acquired the lighting business of Westinghouse).

While carbon filaments where being invented for incandescence, A. von Welsbach produced the first successful metal filament by using osmium (platinum filaments not previously been successful). Von Welsbach, who purportedly discovered praseodymium and neodymium near this time, was investigating metals for gas mantles, gas mantles being an important element of gas lighting devices. Starting first with platinum, then osmium, von Welsbach found a means of producing a fine wire of osmium. (1. C. A. R. von Welsbach, Great Britain Patent GB189801535; issue date Jan. 19, 1899; 2. C. A. R. von Welsbach, Great Britain GB190007210, issued date Jan. 26, 1901. 3. Oesterreichische Gasgluchlicht and Electricitates-Gesellschaft of Austria, Great Britain Patent GB189910241, issued date May 12, 1900.) Von Welsbach used the osmium wire as a filament in the Auer-Oslight, which he introduced commercially in 1902, the metal filament light bulb was a huge improvement on the existing carbon filament designs, lasting much longer, using about ½ the electricity for the same amount of light, and being much more robust.

Osmium is an element however that was expensive alternatives to which were under study. Contemporaneous to the pioneering work on von Welsbach, the chemist Werner Bolton was engaged to research incandescence with Siemens & Halske in 1896. At the time of the introduction of the Auer-Oslight, Bolton made the discovery that tantalum was an ideal material for making metal filaments and incandescent lamps. The first tantalum metal-filament incandescent lamps were available on the market in 1905—about the time of innovations of a different nature from General Electric as we will reveal later—and by 1914 over 50 million had been produced worldwide using Bolton's method. (Siemens & Halske; Great Britain patent GB190523098; issued date: Dec. 21, 1905)

In addition, and approximately at the same time that the applicant "Siemens & Halske AG of 3 Askanischer Platz, Berlin, Electrical Engineers" claimed improved manufacture of glow lamps with incandescence bodies of tungsten molybdenum and similar metal (Siemens & Halske, 1905), another entity which it is claimed the first to introduce and trademark the name OSRAM—Gasgluehlicht AG Auergesellech of Berlin—claimed, as Manufacturers, in their 1905 patent "Filaments of refractory, non-precious metals, such as molybdenum, tungsten, vanadium, and tantalum, are freed from carbon, which remains from the organic binding-material, by treatment at a white heat with hydrogen containing a small proportion of water-vapor or other oxidizing-agent." (Gasgluehlicht AG Auergesellech; Great Britain patent GB190519379; issued date: Mar. 29, 1906)

Clearly the focus of the innovators, inventors and manufacturers—all seeking to improve the performance of carbon filament lamps—were now on metal filaments. The commercial availability of Auer-Oslight from von Welsbach, of lamps from Siemens & Halske using the method of Bolton, and the disclosures of the manufacturer Gasgluehlicht AG Auergesellech, indicate that filaments of osmium, tantalum, and "molybdenum, tungsten, vanadium and tantalum", respectively were the focal point. This parallel technology development (focus on metal filaments), as well as parallel marketing and other business strategies, first in competition and then in collaboration ultimately led to OSRAM being formed in 1919 by Siemens & Halske, Gasgluehlicht AG Auergesellech and AEG (Allgemeine Elektricitäts Gesellschaft; originally German Edison Company itself formed in 1883).

In 1904 the Siemens-Halske Co. tried to apply the drawing process they had developed for tantalum to the production of filaments of the more refractory metals, for example tungsten. The brittleness and lack of ductility of tungsten prevented their attaining success by this method, although later, in 1913-1914, it was demonstrated that fused tungsten could be rolled and drawn at very high temperatures, using very small reduction steps. Nevertheless, as the above discussion clearly shows, there were improvements in metal filaments with these European manufacturers so that tungsten filaments began as early as 1906 to commercially substitute tantalum as the metal filament for incandescent lamps. (Westinghouse Metallfaden Gluehlampenfabrik GmbH, Great Britain Patent GB191003610, Oct. 6, 1910)

Concurrently, metallized carbon filaments were developed by General Electric Company and Westinghouse; (A. Lederer and Westinghouse Metal Filament Lamp Company, Ltd.; Great Britain Patent number GB191005388, issue date Mar. 2, 1911) lamps containing these filaments were marketed as so-called GEM lamps. (W. R. Whitney of the Massachusetts Institute of Technology, Great Britain Patent number GB190424788, issue date of Nov. 9, 1905; also Great Britain Patent number GB190426917, issue date of Mar. 2, 1905) While metallized carbon was better than carbon, it was apparently the penultimate solution to an optimal metal filament. Westinghouse (the company) as did others worked on making tungsten filaments for incandescent lamps by refining the method of Auer von Welsbach originally applied when preparing osmium filaments. (Westinghouse Metal Filament Lamp Co., Ltd., Great Britain Patent number GB190814942; issue date May 6, 1909) In the method of Westinghouse (1909) tungsten trioxide is reduced by zinc (at 800° Centigrade) after which it is washed to remove the unused zinc and the resultant zinc oxide; the method was claimed by generous attribution apparently unusual among other patentees in that era to be a refinement of a method described by Delepine.

It was not, however, until 1909 that William Coolidge, in America at the General Electric Research Laboratories, was successful in making ductile tungsten from the metal powder by suitable heat treatment and mechanical working. Coolidge succeeded in preparing a ductile tungsten wire by doping tungsten oxide before reduction. The resulting metal powder was pressed, sintered and forged to thin rods. Very thin wire was then drawn from these rods. The very first Coolidge bulbs were marketed in the U.S. under the Osram trade name, a name already in use in Europe and a name that would resurface from time to time in the United States.

The General Electric chemist, Irving Langmuir, trained at Columbia University and who won the 1932 Nobel Prize in chemistry for his work on surface chemistry, is frequently credited with discovering the tungsten filament of choice in 1915 for incandescent lamps in general and as the inventor of the gas-filled (nitrogen or mercury vapor) tungsten lamp, more specifically. (I. Langmuir, Great Britain Patent GB191417326; issue date Apr. 1, 1915. I. Langmuir, U.S. Pat. No. 1,180,159, issued Apr. 18, 1916. I. Langmuir, U.S. Pat. No. 1,246,118, issue date Nov. 13, 1917. P. C. Hewitt, Great Britain Patent GB191208086, issued date Oct. 10, 1912. O. Krause, Great Britain Patent GB191011107, issue date Jan. 12, 1911.) Langmuir's description of the invention teaches that the nitrogen gas, if used as the atmosphere within the gas filled lamp, is to be scrupulously dried over, for example, phosphorous pentoxide and his lamp, he claimed, would burn for over 1,000 hours. The use of nitrogen atmosphere in a tungsten filament lamp was novel to Langmuir; the introduction of nitrogen in a carbon-filament lamp of earlier incandescent lighting generations was previously suggested and was a failure according to Langmuir since he claimed at the temperatures at which the carbon filament found itself—when providing illumination—were such that carbon and nitrogen could react to form cyanogens and paracyanogen. Note only does a brown powder of "paracyanogen" form on the surface of the bulb effectively reducing luminance emanating there from, but the reaction also weakens the carbon filament reducing the operational burn time of the incandescent lamp. Langmuir claims that nitrogen vapor does not react with heated tungsten filament, although it does react with vaporized tungsten (sublimed tungsten) to form tungsten nitride "which is less opaque" than tungsten itself. Langmuir teaches that other than nitrogen, the following gases may be used with a tungsten filament: argon, mercury vapor, or other gas having poor conductivity of heat and that pressure at least 1 atmosphere are preferred. (Langmuir, 1916). With regard to the role of mercury vapor in countering the deleterious effects of water vapor, Langmuir (or at least the agent on behalf of the inventor) states "I do not wish to advance or to be restricted to any particular theory." (Langmuir, 1917) Similar strategies were employed with a molybdenum filament. (British Thomson-Houston Company, Ltd., Great Britain Patent number GB191505741, issue date Apr. 6, 1916)

The convection loss from a filament was found to be dependent on what Langmuir termed the "shape factor" of the filament as well as the thermal conductivity of the fill gas. Very close to the filament in an ordinary household lamp the heat is conducted away from the filament; out away from the filament the heat is than convected away. The region about a filament through which conduction takes place is a few millimeters thick: this region is referred to as the Langmuir film or sheath. It should be mentioned, especially in the context of my present invention to be more fully described hereinafter, that this boundary layer, through which conduction takes place, is present about any body that is heated relative to the surrounding gas atmosphere.

Langmuir's study of conduction-convection losses from heated bodies led him to the conclusion: the long filament length had to be effectively shortened to reduce the losses. This was accomplished by coiling the tungsten wire. Successful lamps have been made by double coiling and triple coiling. The conduction-convection loss is relatively insensitive to the diameter of the resulting coil.

While coiling had the effect of reducing gas losses, another important effect occurred. Bulb blackening was reduced considerably because some of the diffusing tungsten atoms that evaporated during normal lamp usage would diffuse back to the filament and deposit themselves on the filament instead of the inside of the glass bulb. This is an extremely important observation as the so-called regenerative effect is a substantial reason why gas-filled lamps—as opposed to vacuum lamps—enjoyed support from manufacturers and end users (both gas-filled and vacuum incandescent lamps are routinely used today).

Another effect also occurred because of the gas filling, which initially was nitrogen but eventually was a nitrogen-argon mixture. Lamps were filled roughly at 80% of atmospheric pressure. During normal operation of household lamps the operating pressure then rose to about one atmosphere (750 Torr). After some of the evaporating filament atoms reached the outer boundary of the Langmuir layer the convection currents would carry most of them upwards to deposit on only a portion of the glass surface rather than the entire bulb, as in vacuum lamps. This reduced the overall light output loss.

A gas fill has advantages in permitting a higher filament temperature for a given life expectancy and the higher the filament temperature, the greater the light output—this is the essence of incandescence which generates illumination as a black body irradiator (Stefan-Boltzmann law states that the total energy j* radiated per unit surface area of a black body in unit time (black-body irradiance), is directly proportional to the fourth power of its thermodynamic temperature T [j*=σT4] and where the non-fundamental constant of proportionality a is called the Stefan-Boltzmann constant with a value of 5.670400×10-8 J s-1 m-2 K-4). But as noted the gas also conducts heat—this permits energy to exit the filament by means other than radiation so this is a non-radiative loss. If the heat conduction of the gas reduces efficiency more than the higher allowed filament temperature increases efficiency, then the light bulb design is better with a vacuum than with a gas (the reason that gases of low heat of conductivity were required). As it turns out, argon and the argon-nitrogen mixture are not the best. Krypton conducts heat less than argon does, and xenon conducts heat less than even krypton does. In cases where argon is only slightly worse than a vacuum, krypton and xenon are better than a vacuum. In addition, the larger atoms of krypton and xenon are better for "bouncing evaporated tungsten atoms" back onto the filament than the smaller atoms of argon and nitrogen are. Interestingly, the Stefan-Boltmann law, major contribution to the field of theoretical physics, was originally and experimentally discovered by Jožef Stefan in 1879, concurrent with the endeavors of Edison and others to develop a practical device for general illumination, (J. Stefan, "Über die Beziehung zwischen der Wärmestrahlung and der Temperatur" (On the relationship between thermal radiation and temperature), The Bulletins from the Sessions of the Vienna Academy of Sciences, Mar. 20, 1979) demonstrating once again the parallel activity between technology, fundamental science, and products for the public good.

The bendable tungsten wire invented by Coolidge gave an incandescent lamp of 10 lumens per watt output and (history has it) a strong portfolio of issued patents assigned to the benefit of General Electric Company. The Langmuir gas-filled lamp—with the tungsten filament of Coolidge and nitrogen gas, as an example—obtained at least 12 lumens per watt in performance. Both Langmuir's and Coolidge's tungsten filament lamps—using the tungsten filament methodology apparently unique to General Electric—appeared on the market in 1913 under the "Mazda" trade name.

It is inevitably the case that the technology that brought incandescent lamps to its ultimate commercial reality—principally driven by the practical and practicable inventions of Coolidge and Langmuir—has reached a point of sophistication—90 years hence—unimagined at the time of these practical commercial inventions. Today, one finds thoria doped tungsten wire or rhenium doped tungsten wire in vibration-resistant incandescent lighting. (W51 Tungsten Wire (0.7% Thorium) and H30 Tungsten Wire (3% Rhenium) from Toshiba Corporation; Sylvania Type 3RW (3% Rhenium tungsten wire) from Osram Sylvania Materials & Components Towanda Pa.) Co-dopants may include aluminum, silicon and potassium. These doped tungsten filaments are non-sagging wires and are produced after doping the tungsten powder—ingots are made from this doped tungsten powder by sintering using electric heating and finally wires are drawn. (W31 is a standard tungsten filament available from Toshiba Corporation; W91 is a non-sagging wire for halogen lamps where they are used at higher temperatures than usual lamps.)

The Mazda trade name first appeared in 1909 when the General Electric tantalum filament incandescent lamp replaced their 1904 improved new carbon-filament lamp—the GEM lamp—after only five years on the market. At that time, the European tantalum filament incandescent lamps were receiving considerable attention. General Electric created a trade-name, Mazda, taken from the Persian (Zoroastrian) god of light, Ahura Mazdah. The Mazda name first appeared in 1909 on tantalum-filament lamps, and then on first generation tungsten lamps made under license from Europe. General Electric also licensed the trade name to their subsidiary National Electric Lamp Companies, to Westinghouse and to British Thomson-Houston and many of the technological improvements were ultimately marketed under the Mazda trade name. We highlight this point to caution the reader that Mazda lamps are not always synonymous with the method of Coolidge and Langmuir (for that matter, the trademark Osram lamps at that time was not always synonymous with producers and technology of the aforementioned merged business entity-Osram; the trademark GEM lamps were not always synonymous with the invention of metallized carbon filaments). General Electric viewed their breakthrough lamps of Coolidge and Langmuir heritage as second-generation tungsten filament lamps: Mazda B lamps. The earlier, European lamps were informally considered "Mazda A" lamps. (GE continued using the Mazda name until 1949.)

As is frequently the case, the presence of gas in incandescent lamps had a long history prior to the invention and research of Langmuir, some of which we have already highlighted and presented as references for the prior art preceding the invention of Langmuir. It has been reported that gas-filled incandescent lighting was tried by others: 1840, W. R. Grove, platinum, air; 1845, J. W. Starr, platinum, air; 1856, C. de Changy, platinum, air; 1859, M. G. Farmer, platinum, air; 1872, A. M. Lodyguine, graphite, nitrogen; 1875, S. A. Kosloff, graphite, nitrogen; 1878, St. George Lane-Fox, platinum-iridium, air or nitrogen; 1879, Sawyer-Man, carbon, nitrogen; 1894, The Star Electric Lamp Co., carbon, heavy hydrocarbons in "New Sunbeam" lamp; 1894, Waring Electric Co., carbon, low pressure bromine in "Novak" lamp; 1901, A. E. G., carbon, low pressure carbon monoxide; and 1908, Hopfelt, carbon, mercury. (All of the above notations were obtained from the reference: Arthur A. Bright Jr., The Electric-Lamp Industry: Technological Change and Economic Development from 1800 to 1947.)

During the same period that tantalum filament incandescent lamps were realizing commercial success and the researchers at Siemens and General Electric and others were focusing on tungsten, we would be remiss not to note that the U.S. lighting company Sylvania (the North American operations of which are now owned by Osram) traces its origins to the Hygrade Incandescent Lamp Company which in 1909 began to manufacture and sell carbon-filament light bulbs and, by 1911, it is claimed in their historical presentations, tungsten filament light bulbs. Whether the tungsten lamps of Hygrade were more like those emanating from Europe or more like the refinements ultimately made by Langmuir are unclear.

Notwithstanding the invention of Langmuir (1916), a few years later, in an issued Great Britain patent, Osram-Robertson Lamp Works of Great Britain claimed coiled tungsten filaments within a lamp bulb and that the lamp envelope "may be filled with gas such as argon." (T. J. Sack, Great Britain Patent GB123249; issue date Feb. 20, 1919.) Robertson Lamp Works in Great Britain gained its origins when patents for the original carbon filament incandescent expired in 1893 and it gained know-how to produce carbon filaments and vacuum incandescent lights. The Osram incandescent lamp from Robertson Lamp Works used a tungsten-molybdenum doped filament and argon gas.

The manufacturing methodology for incandescent lamps was at a relatively advanced stage by the time tungsten filaments became entrenched. Whether the incandescent lamp is one under vacuum or, ultimately filled with nitrogen, argon, or mixtures thereof, the glass envelope is sealed with a burner which closes off the exhaust port (from which the vacuum is applied). The electrical leads that traverse through the glass envelope are made of metal. Some metal must be chosen which will expand when being heated, and contract when cooling, at exactly the same rate as glass, so that the two act as if they were one. This equal expansion and contraction must, moreover, be maintained all through the wide range of temperatures from that of molten glass to ordinary atmospheric temperatures. As noted previously, Sawyer and Edison used platinum wire. It is clear then to those of ordinary skill that the methodology of sealing a glass enclosure with electrical leads protruding through the sealed enclosure is a relatively routine manufacturing process and is used for incandescent lamps of general illumination size as well as miniature incandescent lamps approximating the size of solid-state lamps. It will become apparent that embodiments to my present invention as more fully described hereinafter utilize these manufacturing capabilities mentioned in this paragraph.

The tungsten-halogen incandescent light of more recent vintage is similar to conventional non-halogen incandescent light in that it employs a tungsten filament in a gas-filled, light-transmitting envelope and emits the same type of light. The major differences are that a trace of halogen vapor (e.g., iodine or bromine) is added to the inert fill gas, the gas pressure (7-8 atmospheres) and bulb temperature (250° C. to 600° C.) are much higher than in non-halogen lamps, and the bulb is made of fused quartz (silica, $SiO2$), high-silica glass or aluminosilicate "hard" glass to withstand the high operating pressures and temperatures. Lastly, there is a higher color temperature, 2800° K to 3400° K for standard halogen product. Due to all of this, both material and process, halogen products are more costly to manufacture. Tungsten-halogen lamps operate in a "halogen regenerative cycle" which permits the use of more compact bulbs than those of conventional tungsten-filament lamps of equal ratings, and also permits either increasing lamp life to approximately twice that of conventional tungsten filament lamps having comparable wattage and color temperature or increasing color temperatures and lumen outputs to values significantly above those of conventional tungsten filament lamps having comparable life and wattage.

As we noted before and comment further so as to highlight the benefit of halogen, in conventional gas-filled tungsten-filament lamps, tungsten molecules evaporate from the hot filament, are carried by convection currents of the inert fill gas to the relatively cool inner surface of the bulb, and are deposited to form a thin film which gradually increases in thickness during the life of the lamp. These phenomena cause depreciation of lumen output and efficacy in two ways. First, deposition of the evaporated tungsten on the bulb wall builds up a film of increasing opacity which absorbs increasing portions of the light produced by the filament and thus reduces the total light output. Second, evaporation of tungsten from the filament reduces the filament wire diameter, increasing the resistance and thus (at constant voltage) decreasing the amperes, wattage, lumens, lumens per watt, and color temperature.

In tungsten-halogen lamps, the effects described above are reduced or retarded by the regenerative action of the halogen cycle, which operates by virtue of the temperature gradient between the filament and the bulb. As a general concept:

(1) The filament, fill gas, and bulb are initially at some low temperature (e.g., ambient, for a cold start).

(2) When power is applied, the filament rapidly rises to its operating temperature (2800K to 3400K depending on application), heating the fill gas and the bulb. The bulb wall rises to an operating temperature of 400° C. to 1000° C., and the fill gas rises to temperatures ranging from that at the filament to that at the bulb wall. This temperature gradient causes convection currents in the fill gas.

(3) As the bulb wall rises above temperatures in the range 200° C. to 250° C. (depending on nature and amount of halogen vapor), the halogen cycle begins to operate. Tungsten molecules evaporated (more accurately sublimed) from the filament combine with the halogen vapor to form a tungsten halide (e.g., tungsten iodide or tungsten bromide). The halide does not condense on the hot wall of the bulb but is circulated by convection back to the region of the filament.

(4) At the filament where the temperature exceeds 2500° C., the tungsten halide dissociates, the tungsten is deposited on the filament. The free halogen vapor is recirculated to continue the regenerative cycle. This cycle thus keeps the bulb wall clean by preventing deposition of tungsten and results in much higher lumen maintenance over the life of the lamp than that obtained for conventional tungsten-filament lamps.

The utilization of gas to regenerate the filament is a defining reason gas enclosures are utilized in incandescent lighting although tangential benefits have been noted in our discussion herein.

To maintain the high temperatures and pressures required for operation of the halogen cycle, tungsten-halogen lamp bulbs are significantly smaller and have generally thicker walls than the bulbs of non-halogen incandescent lamps of comparable wattage.

Atmospheres of tungsten-halogen lamps comprise an inert gas with about 0.1% to 1.0% of a halogen vapor added. The inert gas may be xenon, krypton, argon, or nitrogen, or a mixture (e.g., krypton/argon or argon/nitrogen) having the highest atomic weight consistent with cost as well as arc-resistance suitable to the lamp design and the operating voltage. The halogen vapor may be pure iodine (I2) or a compound of iodine (e.g., CH3I) or of bromine (e.g., HBr, CH3Br, or CH2Br2). Iodine is still used in long-life lamps for general illumination but bromine is now used in most tungsten-halogen lamps, especially those for photographic and reprographic applications. The minimum bulb wall temperature for operation of the halogen-cycle is about 200° C. for bromine which is significantly lower than the 250° C. for iodine. Bromine is also colorless while iodine has a very slight absorption in the yellow-green.

Unlike conventional gas-filled tungsten-filament lamps which operate with an internal gas pressure of about one atmosphere, most tungsten-halogen lamps operate with an internal gas pressure of several atmospheres to further reduce the rate of tungsten evaporation. The combined effects of higher pressure and the halogen cycle give halogen lamps much longer life than that of comparable non-halogen incandescent lamps operating at the same filament temperatures. Conversely, when the two types are designed for equal life, halogen lamps will operate at higher filament temperatures with consequently greater luminance and efficacy.

One can see that in order to improve incandescent lamps to where we are today, first the underlying component that effects the light emission—the filament—needed to be optimized, second the enclosure that housed the filament needed to be designed for maximum light output, and finally the environment in which the active component, the filament, is housed needed to be perfected. At the same time incandescent lamps have been improved and optimized, for all of the five factors previously mentioned (brilliance, efficiency, cost, physiological appeal, and durability), other fundamental means of light emission were being discovered. Among the alternative techniques of generating light for general illumination are those based on luminescence.

Cold Light from Mercury Vapor Lamps

The term "luminescenz" was first used in 1888 by Eilhardt Wiedemann, German physicist, for "all those phenomena of light which are not solely conditioned by the rise in temperature." By the rise in temperature, Wiedemann referred to the fact that liquids and solids emit more and more radiation of shorter and shorter wavelengths as their temperature increases, finally becoming perceptible to the eye as the material becomes red hot and then white hot. This is incandescence or "hot light," in contrast to luminescence or "cold light."

The most notable cold light is commonly referred to as a fluorescent bulb or as a tube light. Fluorescent light bulbs are long, thin glass tubes that are coated on the inside with a white powder called "phosphor." In order to turn them on, you must connect them to a device called a ballast. Most ballast is hidden inside the lighting fixture, usually behind a piece of sheet metal. When you flip a switch to turn on the lights, what you are actually doing is turning on the ballast. The ballast "turns on" the fluorescent lamp by passing electricity through the tube. The electrical current causes the gas inside the lamp to give off ultraviolet energy. The ultraviolet energy hits the phosphor and gets converted to light. When all is said and done, it has been found that fluorescent lamps use less electricity than incandescent lamps and they are less expensive to operate.

In 1857, the French physicist Alexandre E. Becquerel who had investigated the phenomena of fluorescence and phosphorescence, theorized about the building of fluorescent tubes similar to those made today. Alexandre Becquerel experimented with coating electric discharge tubes with luminescent materials. The work of Becquerel occurred around the time of the first American patent on incandescence, said patent mentioned earlier.

The inventor Peter Cooper Hewitt, patented the first mercury vapor lamp in 1901. (P. C. Hewitt, U.S. Pat. No. 682,699; issue date Sep. 17, 1901). The low pressure mercury arc lamp of Peter Cooper Hewitt is the very first prototype of today's modern fluorescent lights. A fluorescent light is a type of electric lamp that excites mercury vapor to create luminescence. (P. C. Hewitt, Great Britain Patent number GB190609253; issued date Sep. 13, 1906. P. C. Hewitt, Great Britain Patent number GB190424470, issue date Feb. 2, 1905.) It is generally believed that the work of Peter Cooper Hewitt built on the mid-19th century work of German Julius Plucker and Heinrich Geissler. By passing an electric current through a glass tube containing tiny amounts of a gas, Plucker and Geissler found they could make light.

Peter Cooper Hewitt began developing mercury-filled tubes in the late 1890s, and found that they gave off an unappealing bluish-green light. The amount of light, however, was startling. While the utility of the Hewitt design was recognized not to be suitable for general illumination in the home, the benefit for the photographic studios and for industrial use were compelling. Hence, the commercialization of the invention of Hewitt (1901) rested with the Cooper Hewitt Electric Company, controlled by George Westinghouse, and, in 1902, the Cooper Hewitt Vapor Lamp Company and Westinghouse Cooper Hewitt Company, LTD.

To improve on the color of the Hewitt lamp, Charles Bastion, who also suggested if not reduced to practice a mercury vapor lamp in 1903, also subsequently claimed to use rhodamine as a modifier to emit red radiation in 1904. (C. Bastion, Great Britain Patent number GB190409718, issue date Mar. 30, 1905). Rhodamine is a fluorescent organic dye in common use even today in many implementations other than general illumination. Others invented similar technologies to provide a red component to the other bluish-green light, clearly an early effort to focus on the physiological aspects of lighting: to the customer, the question is whether artificial light is aesthetically appealing. This physiological aspect remains to this day and is characterized by terms such as color rendering index and color temperature.

The inventor James Robinson noted that neon or rhodamin fluorescent screens can be introduced to generate red fluorescence. (J. Robinson, Great Britain Patent number GB284746; issue date Jan. 30, 1928) The development of improved mercury vapor lamps that utilized rhodamin or like organic fluorescers (perylene, chrysene, fluorescein, rhodamine, ethylviolet and malchite green) would continue. (Johnson, P. D., U.S. Pat. No. 4,469,980, issue date Sep. 4, 1984)

Ultimately, Cooper Hewitt lamps proved cumbersome to use. The necessary ballast was heavy, and the lamps each contained as much as a pound of mercury. Development of tungsten filament incandescent lamps in the 1910s provided almost as much efficiency as the mercury tubes, but with a much better color. In due course, General Electric bought the Cooper Hewitt Company in 1919 and ultimately utilized the Cooper Hewitt operation to manufacture fluorescent lamps a legacy that more recently became apparent as the factory-turned condominium received recognition as a Superfund site. (1. R. Cahill, "HOBOKEN CLEANUP PLAN FOR GRAND ST SUPERFUND SITE: EPA PROPOSES CLEANUP PLAN FOR GRAND STREET MERCURY SUPERFUND SITE IN HOBOKEN AND PERMANENT RELOCATION OF RESIDENTS"; Press Release of U.S. Environmental Protection Agency, Records Center, 290 Broadway 18th floor New York, N.Y., Jul. 9, 1997 wherein it was noted: Both the General Electric Company (GE) and the Cooper-Hewitt Electric Company manufactured mercury vapor lamps in the building at 722 Grand Street from about 1910 to 1919 and again from 1948 to 1965. 2. Narendra P. Singh, MD, MS, CIH, "PUBLIC HEALTH ASSESSMENT: GRAND STREET MERCURY SITE HOBOKEN, HUDSON COUNTY, NEW JERSEY", Agency for Toxic Substances and Disease Registry, U.S. Department of Health and Human Services, CERCLIS NUMBER: NJ0001327733, Nov. 27, 1998) Clearly alternatives to heavy metals such a mercury is an absolute requirement for a technology to be practicable.

An alternative to the mercury vapor lamp of Hewitt (and the pound of mercury each lamp required) was the carbon dioxide and or nitrogen filled tubes of D. McFarlan Moore. These lamps had a practical disadvantage that the lamps were over 250 feet in length. As the effort of Moore and Hewitt coincided with the discovery of the optimal tungsten filament lamp of Coolidge and Langmuir, as previously referenced, the efficiency standard for general illumination was on the rise. As a result, the impractical Moore lamp soon disappeared from the market for general illumination. Nevertheless, building on Moore's work, Georges Claude of France developed neon tubes in 1910 and showed that a discharge lamp could give 15 lumens per watt—a not too shabby light output if one notes that Langmuir's tungsten filament lamp was then at 12 lumens per watt—but only if one wanted red light. In that red light is near the photopic minimum, a lumen output greater than that of white light which covers the photopic maximum is quite impressive. Additional European work resulted in a high-intensity mercury vapor lamp (from General Electric Company of England) in 1932. This lamp used a tiny fraction of the mercury needed for Cooper Hewitt lamps, had a screw base, and gave 40 lumens per watt, though its color was still poor.

A collaboration of GEC in England, Philips in The Netherlands, and Osram in Germany produced a low-pressure sodium lamp also in 1932. The key to this lamp lay in a special glass that could withstand the corrosive effects of sodium. The light was a stark yellow suitable only for use in applications like street lighting, but efficacy started out at 40 lumens per watt (and ultimately reached about 100 lumens per watt thirty years hence).

In the late 1920s and early 1930s, it became clear that neon tubes coated with phosphors have utility. A phosphor is a material which absorbs one type of light and radiates another. A German patent in 1927 contained most of the features of a fluorescent tube, but the lamp was not produced. It is reported that a green lamp giving 30 lumens per watt was demonstrated in 1934.

In 1936, tubes using low-pressure mercury vapor and a coating of phosphors were demonstrated to the Illuminating Engineering Society. In 1939, both General Electric Company and Westinghouse Electric introduced fluorescent lamps at both the New York World's Fair and the Golden Gate Exposition in San Francisco.

More specifically, the development of the "fluorescent lamp" which led to the commercial introductions mentioned in the immediately preceding paragraph was by general acclaim pioneered by three German scientists, Friederich Mayer, Edmund Germer and Hans Spanner. They introduced pre-heating and a fluorescent coating in 1926 which gave a higher light output and allowed the lights to operate on a lower, but still high, voltage. Together with Friedrich Meyer and Hans Spanner, Edmund Germer patented an experimental fluorescent lamp in 1927. (F. Meyer, et. al.; U.S. Pat. No. 2,182,732; issued date Dec. 5, 1939)

Concurrent with the invention of Germer, Meyer and Spanner, the inventor George Inman lead a group of General Electric scientists researching an improved and practical fluorescent lamp. The team designed a practical and viable fluorescent lamp that was awarded, after five years of prosecution, a United States patent. (G. E Inman; U.S. Pat. No. 2,259,040; issue date Oct. 14, 1941)

According to the discourse presented within The GE Fluorescent Lamp Pioneers and which we have relied on to accurately reflect the technology relationships, "On Oct. 14, 1941 U.S. Pat. No. 2,259,040 was issued to George E. Inman; the filing date was Apr. 22, 1936. It has generally been regarded as the foundation patent. However, some companies were working on the lamp at the same time as GE and some individuals had already filed for patents. GE strengthened its position when it purchased a German patent that preceded Inman's. GE paid $180,000 for U.S. Pat. No. 2,182,732 that had been issued to Friedrich Meyer, Hans J. Spanner and Edmund Germer. While one might argue the real inventor of the fluorescent lamp, it is clear that GE was the first to introduce it." In September 1935 the first tubular fluorescent lamp was introduced in Cincinnati USA by the General Electric Company.

A final form of a tube lighting (TL) fluorescent lamp was developed by André Claude, a cousin of George Claude (the inventor of the neon light as noted previously), in Paris who sold his 1932 patent rights to the General Electric Company. The public record indicates that the first major installation of florescent lamps by General Electric Company was at the US patent office in Washington USA in November 1936, and commercial sale to the general public began in 1938. Osram introduced their fluorescent lamp in 1936. Philips NV started to produce their fluorescent lamps in 1938. In 1942, A. H. McKeag of General Electric Company discovered the fluorescent properties of calcium and strontium which doubled the efficiency of the phosphors incorporated into fluorescent lamps. Peter Ranby of General Electric Company discovered fluorescent halophosphate in 1950 which when used in a fluorescent tube gives a pure white light. Philips introduced a lamp based on color television technology in 1973 that gave a 50% increase in efficiency and superb color rendering.

In disclosure more related to organic luminophors as opposed to ceramic phosphors, the applicant NV Philips claimed " . . . it is known to utilize high pressure mercury vapor discharge tubes in-conjunction with fluorescent materials which transform part of the rays emitted by the discharge tubes into rays having a longer wavelength Said fluorescent materials include in particular red fluorescent rhodamine coloring materials. In practice, however, the use of these rhodamine coloring materials has not found favor since it has been found in practical use that they lose their fluorescent properties within a short time." (N. V. Philips Gloeiampenfabrieken, Great Britain Patent number GB454348, issued date Sep. 29, 1936) This represents an early discussion of the degradation of down-conversion luminophors in non-solid-state lamp technology. According to the invention, "said drawback is reduced to a considerable extent by utilizing red-fluorescent rhodamine coloring materials in conjunction with a mercury vapor discharge tube in which the mercury vapor has during operation a pressure greater than 10 atmospheres. It has been found that in the spectrum of the light emitted at such high mercury-vapor pressures the line 2537 angstroms and the adjacent rays of greater wavelengths are suppressed to a comparatively high extent, the band of suppressed wavelengths being the wider the higher the pressure of the mercury vapor. With the device according to the invention suppression of these rays of short wavelengths is very advantageous because as a result thereof the rhodamine preparation is irradiated by said rays to a much smaller extent, which is of great importance with respect to the fastness to light of the red-fluorescent rhodamine coloring materials."

In addition to the efforts at N. V. Philips with rhodamin, and about at the same time, in a patent as communicated from Patent-Treuhand-Gesellschaft fur Elektrische Gluhlampen GmbH, General Electric Company reported the use of two luminescent materials: a primary luminescent material excited by the radiation (and more particularly ultra-violet radiation) from the discharge and a secondary luminescent material excited by the luminescent radiation from the primary luminescent material. (General Electric Company, Great Britain Patent number GB448887; issue date Jun. 17, 1936) Other patents from General Electric Company discuss alternative means of effecting down-conversion with organic fluorescent dyes: "The luminescence and light-fastness of a rhodamine dye dispersed in a resinous binder are improved by mixing the solid dye with a molten resin in the absence of any solvent adapted to dissolve both the dye and the resin. Resins of the glycerine-phthalic anhydride and formaldehyde-urea types may be used." (General Electric Company, Great Britain Patent number GB474297; issue date Oct. 28, 1937) Other disclosures—all issued Great Britain patent—relating to rhodamine and related organic luminescent dyes (eosin) as a down-conversion dye include:

(1) GB190308147; 1904-01-07; BURKE, JOHN BENJAMIN BUTLER (2) GB477192; 1937-12-23; BRITISH THOMSON HOUSTON CO LTD (3) GB456480; 1936-11-10; PHILIPS NV (4) GB483662; 1938-04-22; PHILIPS NV (5) GB503760; 1939-04-06; BRITISH THOMSON HOUSTON CO LTD (6) GB190308147; 1904-01-07

Despite the extensive innovations using rhodamine, an organic fluorescent dye, it is not utilized in present day lighting as it has not yet been found a means to stabilize the rhodamine under the conditions of high luminance in an operating lamp, regardless of whether the lamp is a mercury vapor lamp or any other lamp.

The phosphors of more modern usage are generally of two types: Calcium halo phosphates which are the main standard phosphors for fluorescent lamps (easy dispersible and require only simple suspension equipment) and triband phosphors (based upon inorganic material containing 'rare earth' elements where a combination of red, green and blue results in a 50% increase in efficacy with regard to standard phosphors and excellent color rendering properties).

Examples of commercial ceramic phosphors for fluorescent tube lighting are from Philips Lighting Components located in Deurne/Maarheeze (Netherlands):

(7) Red Tricolor: Yttrium Oxide:Eu ($Y_2O_3$:Eu); 254 nm excitation—quantum efficiency 84%; UV-absorption 84%; wavelength at peak 613 nm; bandwidth (50%) 3 nm; excitation peak 203 nm; C.I.E chromaticity coordinates: powder x=0.643 y=0.344; lamp TLD 36 W x=0.576 y=0.326.

(8) Blue-Green Tricolor: Barium Aluminate Europium Manganese ($BaMgAl_{10}O_{17}$:Eu,Mn); 254 nm excitation—quantum efficiency 92%; UV-absorption 86%; wavelength at peak 450 nm; bandwidth (50%) 51 nm; excitation peak 248 and 308 nm; C.I.E chromaticity coordinates: powder x=0.144 y=0.142; lamp TLD 36 W x=0.152 y=0.170.

(9) Blue Tricolor: Barium Magnesium Aluminate:Eu (BaMgAl10O17:Eu); 254 nm excitation; quantum efficiency 93%; UV-absorption 86%; wavelength at peak 453 nm; bandwidth (50%) 51 nm; excitation peak 313 nm; C.I.E chromaticity coordinates: powder x=0.149 y=0.069; lamp TLD 36 W x=0.154 y=0.068.

(10) Green Tricolor: Cerium Lanthanum Phosphate:Tb (LaPO4:Ce,Tb); 254 nm excitation quantum efficiency 95%; UV-absorption 98%; wavelength at peak 542 nm; bandwidth (50%); Line excitation peak 241 nm; C.I.E chromaticity coordinates: powder x=0.343 y=0.579; lamp TLD 36 W x=0.319 y=0.537.

(11) Philips U1213 Halophosphate: Color Temperature: 2900 K; "Warm White"; Ca10(PO4)6(F,Cl)2:Sb,Mn NOTE: Color Temperature changes as function of Sb and Mn doping: Philips U1228 3500 K "White"; Philips U1225 4100 K "Cool White"; Philips U1242 5000 K "Tropical Daylight"; U1239 6500 K "Daylight"; Philips U1254 6500 K Daylight

(12) Philips U1234 Blue Fine: Ca10(PO4)6F2:Sb T

The library of ceramic phosphors is vast and the elements within are used in a wide variety of applications. For example, available from Toshiba Corporation are the following list of phosphors (in a cathode ray tube (CRT) application, the phosphor is brought to its excited state by irradiation with an electron beam):

(1) CRT: Blue (P-22B): ZnS:Ag
(2) CRT: Blue (P-22B): ZnS:Ag+Pigment
(3) CRT: Green (P-22G): ZnS:Cu,Al
(4) CRT: Green (P-22G): ZnS:Cu,Au,Al
(5) CRT: Red (P-22R): Y2O2S:Eu
(6) CRT: Red (P-22R): Y2O2S:Eu+Pigment
(7) Blue: Three Band Lamp: 3(Ba,Mg)O,8Al2O3:Eu
(8) Blue: Three Band Lamp: (Sr,Ca,Ba)10(PO4)6,Cl2:Eu
(9) Blue-Green: Three Band Lamp: 3(Ba,Mg)O,8Al2O3:Eu,Mn
(10) Green: Three Band Lamp: (La,Ce)(P,Si)O4:Tb
(11) Red: Three Band Lamp: Y2O3:Eu
(12) Ultraviolet: Special Lighting: BaSi2O5:Pb
(13) Blue: Special Lighting: CaWO4
(14) Green: Special Lighting: Zn2SiO4:Mn
(15) Orange: Special Lighting: (Sr,Mg)3(PO4)2:Sn
(16) Deep Red: Special Lighting: 3.5MgO,0.5MgF2,GeO2:Mn
(17) Red: Special Lighting: (Y,Gd)BO3:Eu
(18) Blue-Green: Electroluminescent Panels: ZnS:Cu
(19) Green: Electroluminescent Panels: ZnS: Cu
(20) Orange: Electroluminescent Panels: ZnS: Cu,Mn
(21) x-Ray Intensifying Screen: Gd2O2S:Tb A similar listing of phosphors are available from Osram Sylvania Materials & Components Towanda Pa.:

1) Blue-Green Lamp Phosphor: BaMgAl10O17:Eu:Mn (peaks at 456, 514 nm with a 50 nm bandwidth)
2) Green Lamp Phosphor: (La,Ce,Tb)PO4:Ce:Tb (peak at 546 nm with a 6 nm bandwidth; a tricolor phosphor)
3) Green Lamp Phosphor: Zn2SiO4:Mn (Willemite, peak at 528 nm with a 40 nm bandwidth)
4) Green Lamp Phosphor: (Ce,Tb)MgAl11O19: Ce:Tb (peak at 546 nm with a 9 nm bandwidth; a tricolor phosphor)
5) Blue Lamp Phosphor: MgWO4 (peak at 473 nm, with a 118 nm bandwidth)
6) Red Lamp Phosphor: Y2O3:Eu
7) Red Lamp Phosphor: Mg4(F)GeO6:Mn
8) Red Lamp Phosphor: Mg4(F)(Ge,Sn)O6:Mn
9) Blue Lamp Phosphor: CaWO4:Pb (Scheelite)
10) Blue Lamp Phosphor: BaMgAl10O17:Eu
11) Blue Lamp Phosphor: Sr5Cl(PO4)3:Eu
12) Orange Lamp Phosphor: (Sr,Mg)3(PO4)2:Sn
13) White Lamp Phosphor: Ca5(F,Cl)(PO4)3: Sb:Mn Among the phosphors of importance to fluorescent tube lighting are those studied by H. W. Leverenz (Ph.D., Chemistry, Stanford; Franklin Institute Brown Medal in 1954 for his contributions to the development of the fluorescent lamp) and that which he invented, zinc beryllium silicate manganese, was a major contribution to the development of practical fluorescent lamps. (See for example General Electric Company, Ltd. communicating from Patent-Treuhand-Ges. fur Elektrische Gluhlampen; Great Britain Patent number GB532501, issue date Jan. 24, 1941 where the phosphor zinc beryllium silicate (orange emitter) with magnesium tungstate (blue green emitter) is described as a well-known composition for white light in mercury vapor lamps.) RCA, employer of Leverenz, by virtue of its formation from General Electric Company, was commercially prohibited by mutual agreement from marketing and selling lighting appliances and the technology was assigned to the latter.

It is essential to provide additional background on another form of cold light in order to truly appreciate the innovation that is my present invention. Another source of cold light is phosphorescence or phosphorescent phosphors.

Phosphorescent pigments are those in which excitation by a particular wavelength of visible or ultraviolet radiation results in the emission of light lasting beyond the excitation. After cessation of luminescence and renewed exposure to light, the material again absorbs light energy and exhibits the glow-in-the-dark property (an absorbing-accumulating-emitting cycle). These are called afterglow phosphors—the glow after the excitation source is removed.

Various phosphorescent substances are known, including sulfides, metal aluminate oxides, silicates and various rare earth compounds (particularly rare earth oxides). The most common type of phosphorescent pigment is zinc sulfide structure with substitution of the zinc and activation by various elemental activators. It is known that many luminescent materials may be prepared by incorporating metallic zinc sulfide (which emits green light). Moreover, with zinc sulfide a material or mixtures of materials variously termed activators, coactivators or compensators are usually employed. Known activators include such elements as copper (forming ZnS:Cu, probably the most common zinc sulfide phosphor). Other sulfide phosphors which emit various colors of light include ZnCdS:Cu and ZnCdS:Ag, CaS: Bi, and CaSrS:Bi.

The other important class of long-life phosphorescent pigments is the metal aluminates, particularly the alkaline earth aluminate oxides, of formula MAl2O4 where M is a metal or mixture of metals. Examples are strontium aluminum oxide (SrAl2O4), calcium aluminum oxide (CaAl2O4), barium aluminum oxide (BaAl2O4) and mixtures. These aluminate phosphors, with or without added magnesium, may be further activated with other metals and rare earths. Alkaline earth metal aluminate oxide phosphors and their preparation are discussed in pioneering research emanating from Nemoto & Co., Ltd. (Murayama, et. al.; U.S. Pat. No. 5,424,006; issue date Jun. 1, 1995; priority date Apr. 28, 1993). As noted earlier, the importance of strontium in ceramic phosphors was apparent as early as 1942 to A. H. McKeag of General Electric Company. Most phosphorescent pigments suffer from the problems of low luminescence and/or short afterglow.

Solid-state lighting is thought to be ultimately superior to incandescence, fluorescence, phosphorescence the lighting technologies illustrated above.

General Background on Light Emitting Diodes

Solid state light emitting devices, including solid state lamps including LEDs are extremely useful because they potentially offer lower fabrication costs, lower utilization costs with long term durability benefits over conventional incandescent and fluorescent lamps. Due to their long operation (burn) time and low power consumption, solid state light emitting devices frequently are thought to provide a functional cost benefit, even when their initial cost is greater than that of conventional lamps. It is well known that because large scale semiconductor manufacturing techniques can be used, many solid state lamps can be produced at extremely low cost. One such device is the solid state light emitting diode (LED) which has in general low fabrication costs, long operational lifetimes and low maintenance costs. For example, red light emitting diodes have been manufactured for over 30 years and their operational lifetime is over ten years of continuous burn. Further, due to the highly advanced state of semiconductor manufacturing for red LEDs, these chromatic solid state lights are extremely inexpensive to manufacture. This highly advanced state of red LED manufacture benefits primarily from the fact that they are the first chromatic LEDs to have been discovered and produced.

The traditional visible spectrum LED, it has been noted by many, results from the pioneering work of Nick Holonyak, Jr. who first began work on the visible-spectrum light-emitting diode in 1960 while working at General Electric. He was the first, reportedly in 1960, to grow GaAs1-xPx (an alloy) and to construct visible-spectrum lasers and light emitting diodes (seemingly in 1962). Holynak is the inventor of the first practical LED, the red GaAs1-xPx LED. Holynak had discovered that the wavelength of the GaAs diode (gallium arsenide) could be shifted from the infrared to the visible spectrum by merely changing the chemical composition of the crystal itself to GaAsP (gallium arsenide phosphide).

Ten years later, M. George Craford invented the first yellow LED and 10 times brighter red and red-orange LEDs, expanding the potential uses of chromatic LEDs dramatically. He subsequently led the R&D efforts at Hewlett-Packard.

In 1977, Russell Dupuis was the first to demonstrate that metal organic chemical vapor deposition (MOCVD) could be used to grow high-quality semiconductor thin films and devices, including LEDs. Today, the MOCVD materials technology is the most widely used method for the high-volume production of LEDs worldwide.

The scientific achievements of Holonyak, Craford and Dupuis are renowned and reflect how scientific originality, imagination, innovativeness, and reduction to practice lead to commercial advances unimagined prior to their creations. Light emitting diodes are now commercially available in a wide variety of designs and a plethora of manufacturing techniques have been developed. In addition to applications such as indicator lights on home and consumer appliances, audio visual equipment, telecommunication devices and automotive instrument markings, such LEDs have found considerable application in indoor and outdoor informational displays. But until the early 1990's, notwithstanding the outstanding and well recognized achievements of Holonyak, Craford and Dupuis, and the legions of researchers advancing the art in academics, government laboratories and commercial enterprises, commercial LEDs have produced light only in the red, green or amber ranges and have not been generally suitable for replacing, for example, incandescent bulbs, with normally a white luminescence, in a wide variety of display applications.

General Background on Blue Light Emitting Diodes

For the longest time, blue LEDs were absent from the list of visible light LEDs. Pioneering work in the area of SiC and GaN semiconductors, as well as other materials, initiated and reduced to practice in the late 1980's and early 1990's completed the visible light spectrum of chromatic solid-state lights. The very earliest focus on GaN semiconductors can be traced to gallium nitride "electroluminescent" diodes that were demonstrated at RCA Laboratories in the 1970s (J. I. Pankove, E. A. Miller, J. E. Berkeyheiser, RCA Rev. 32, 383 (1971)). At least three major problems had to be solved for GaNs to succeed: (i) the lack of suitable lattice-matched epitaxial substrates, (ii) thermal convection problems due to the very high growth temperatures (about 1000° C.), and (iii) the failure of p-type doping. Ultimately these problems were solved and today blue LEDs are sold in the billions of units per year and uv LEDs are also commercially available.

There are too many inventors and researchers of great importance and substantive contributions to reference herein, but considerable and substantive importance are the inventive work of Professor Isamu Akasaki of the School of Engineering, Nagoya University and Shuji Nakamura of Nichia Corporation. As it has been elsewhere reported (Faso, G. Science, Vol 272, Issue 5269, 1751-1752, 21 Jun. 1996), most work with GaN makes use of sapphire substrates, which have a lattice mismatch of about 15% with respect to GaN. Akasaki at Nagoya University and Nakamura at Nichia both developed very similar buffer-layer technologies to achieve GaN epitaxial growth with appropriate defect density. Both Akasaki and Nakamura use metal-organic chemical vapor deposition methods. The substrate temperature is more than 1000° C. during growth. This temperature is exceptionally high and causes convection problems, which were addressed by one of Nakamura's inventions. He developed a dual-flow reactor, where an auxiliary stream of gas blows perpendicularly to the substrate, pushing the primary stream of reactants toward the substrate and improving the growth.

A long-standing problem was the failure to achieve p-type doping in GaN materials. Akasaki showed that a solution existed: he discovered that low-level electron beam irradiation could yield p-type GaN (H. Amano et al., J. Lumin. 40-41, 121 (1988)). Nakamura found (S. Nakamura, N. Iwasa, M. Senoh, T. Mukai, Jpn. J. Appl. Phys. 31, 1258 (1992)) that many previous GaN researchers had annealed their samples in ammonia (NH3). Ammonia dissociates above −500° C., releasing atomic hydrogen, which passivates the acceptors. Therefore, Nakamura switched to annealing in a clean nitrogen (N2) atmosphere and thereby invented a reliable method to achieve high-quality p-type GaN materials. (1. See also Shuskus, A., U.S. Pat. No. 4,448,633, issued on May 15, 1984. 2. See also "Process for doping crystals of wide band gap semiconductors" U.S. Pat. No. 4,904,618 (and patents that reference same), inventor Gertrude Newmark which proposes nitrogen as a "less mobile dopant" in a wide band gap semiconductor.) These discoveries led Nakamura with colleagues at Nichia to the development of commercial blue GaN LEDs (S. Nakamura, T. Mukai, M. Senoh, Jpn. J. Appl. Phys. 30, L1998 (1991)).

Relying on self-acclamations from Toyoda Gosei and Nichia, concurrently with the pioneering work reported from Nichia and as early as 1986, Toyoda Gosei started developing GaN-based Blue LEDs under the guidance of Professor Isamu Akasaki and with the assistance of Toyota Central R&D Labs., Inc. In the following year, 1987, Japan Science and Technology Corporation supported the development of Blue LEDs to Toyoda Gosei, which Toyoda Gosei successfully achieved in 1991. In October 1995, Toyoda Gosei started commercial production of high-brightness Blue LEDs.

Shuji Nakamura and his efforts at Nichia are as legendary as the outstanding science performed by Holynak, Craford and Dupuis. What is clear is that inventing and implementing blue light emitting diodes was a breakthrough in materials science and electrical engineering.

Radiative recombination in GaN blue light-emitting diode die using time-resolved measurements show a bimolecular recombination characteristic and at 300 K, a lifetime of 130 picoseconds. (C.-K. Sun, S. Keller, G. Wang, M. S. Minsky, J. E. Bowers, and S. P. DenBaars, "Radiative recombination lifetime measurements of InGaN single quantum well", Applied Physics Letters—Sep. 23, 1996—Volume 69, Issue 13, pp. 1936-1938) These very short lifetimes are difficult to purposely quench although trap states have been suggested to lead to yellow not blue or uv luminescence otherwise observed in GaN devices. (F. A. Ponce, D. P. Bour, W. Gotz, and P. J. Wright, Appl. Phys. Lett. 68, 57~1996. S. Christiansen, M. Albrecht, W. Dorsch, H. P. Strunk, C. Zanotti-Fregonara, G. Salviati, A. Pelzmann, M. Mayer, M. Kamp, and K. J. Ebeling, MRS Internet J. Nitride Semicond. Res. 1, 19-1997. S. J. Rosner, E. C. Carr, M. J. Ludowise, G. Girolami, and H. I. Erikson, Appl. Phys. Lett. 70, 420~1997. T. Sugahara, H. Sato, M. Hao, Y. Naoi, S. Kurai, S. Tottori, K. Yamashita, K. Nishino, L. T. Romano, and S. Sakai, Jpn. J. Appl. Phys., Part 2 37, L398~1998.) Moreover, Fe ions are good quenchers. (M. Batentschuk, B. Schmitt, J. Schneider, A. Winnacker, "COLOR ENGINEERING OF GARNET BASED PHOSPHORS FOR LUMINESCENCE CONVERSION LIGHT EMITTING DIODES (LUCOLEDs)", Proceedings published as Volume 560 of the Materials Research Society Symposium Proceedings Series. Apr. 6, 1999) Rare earth ions doped in GaN have been shown to non-radiatively (and radiatively) transfer their energy to the GaN. Similarly, the GaN host was photo-excited by 300 nm, 200 femtosecond optical pulses, and the energy transfer from the host to the 5D0 state of the Eu3+ ions was deduced to proceed through free and bound exciton trapped states with a temperature independent decay constant. (Lee. et. al.; "Temperature dependence of energy transfer mechanisms in Eu-doped GaN", Journal of Applied Physics Vol. 95 No. 12, p 7717-7724, June 2004) It has been proposed that rare earth doped GaN can be used to make indoor white lights. (A. J. Steckl, R. Birkhahn and M. J. Garter, "Rare Earth Luminescence in GaN and Related Device Performance" Proceedings published as Volume 560 of the Materials Research Society Symposium Proceedings Series. Apr. 5, 1999.)

The Discovery of White Light Emitting Diodes

The introduction of blue and or ultraviolet LED, however, allows in theory for the introduction of white light LED systems and thus has the potential to open the display market to LEDs by providing a practical means to achieve vibrant color, pale color, and white light (achromatic light without hue) illumination.

Given the desirability of solid-state white lights for general illumination and for displays, considerable effort has been expended to produce white light LEDs. Although the recent availability of the blue LED makes a full color, and by extension a white light display realizable, conventionally it has been considered that such a display would require at least three LEDs, at least one each of blue, green and red light emitting diode die. The multiple LEDs would be then incorporated into complicated and expensive LED modules to obtain the required broadband illumination necessary to provide white light. Even if a discrete LED lamp were constructed that provides white illumination (as opposed to the utilization of a multitude of single die, single color discrete LED lamps in a module or sub-assembly), prior to the invention of Down-Conversion for white light generation, the state of the art required the utilization of multiple LED dies and typically at least four electrical leads to power these dies. An issued United States patent teaches a variable color light emitting diode having a unitary housing of clear molded solid epoxy supporting three LED dies characterized as producing color hues of red, green and blue, respectively. (Stinson, U.S. Pat. No. 4,992,704)

Attempts to make white light LED from a single die, which would provide considerable economic and performance advantage over Stinson became an early concern in the development and enhancement of GaN semiconductors. For example, it was claimed [Mananbe et. al., Japanese Patent JP4010665, publication date 1992 Jan. 14; claims priority date of 1990 Apr. 27] "a gallium nitride-based compound semiconductor light-emitting element is provided with the following: an n-layer composed of an n-type gallium nitride-based compound semiconductor (Alx1Ga1−xN; including X=0); and an i-layer composed of an i-type gallium nitride-based compound semiconductor (AlxGa1−xN; including X=0). At the light-emitting element, zinc(Zn) and silicon(Si) are used as elements to be doped for the i-layer. When the i-layer is doped with only zinc, the emitted light color of a light-emitting diode is a blue color. When the layer is doped with zinc and silicon and the doping amount of silicon is comparatively small at a ratio of 1/200 to 1/1000 to a zinc density, the emitted light color of the light-emitting diode is a red color. When the ratio is comparatively large at 1/100 to 1/200, the color is a white color." These single die GaN complex doped devices failed to perform favorably for the generation of white light illumination.

A rather interesting example similar in spirit to the technology referenced in the immediately preceding paragraph was the observation of Yoshinori Shimizu that if a blue LED is used as a backlight in a display, and the display had a layer containing an orange fluorescing element; the display appeared to be white. (Y. Shimizu, Japanese Patent number JP8007614, Jan. 12, 1996; Japanese Application number JP19940134763, Jun. 17, 1994) However, the luminescent element and the light-emitting diode lamp were not structurally related nor of the same structure.

Discovery of Down-Conversion

Baretz et. al. [2003] taught the art of white light generation using Down-Conversion. This is a fundamental process known also referred to as luminescence conversion and or phosphor LEDs and the art has been dramatically enhanced by the utility of this method of generating white light from a single light emitting diode die. Baretz et. al. [2003] in the now issued U.S. Pat. No. 6,600,175 filed on 26 Mar. 1996 and issued on 29 Jul. 2003 claimed the invention of white light using primary radiation of a relatively shorter wavelength radiation and a collection luminophoric medium arranged in receiving relationship to said primary radiation, and which in exposure to said primary radiation, is excited to responsively emit a secondary, relatively longer wavelength, polychromatic radiation, "with separate wavelengths of said polychromatic radiation mixing to produce a white light output." White light is known to be defined as achromatic light that is light with no hue. Many invoke the term pure white to refer to achromatic light. The term "white light" is not explicitly defined in Baretz et. al. [2003] although the specification states the purpose of the invention is to "provide while (sic) light solid state luminescent devices using a single die, which initially provide monochromatic radiation and wherein the monochromatic radiation is converted to polychromatic white light, thus providing a solid state illumination device with white illuminance." Hence, the specification teaches that white light is practiced as polychromatic and that which provides white illuminance. There is an important difference between luminance and illuminance even though that which is usually reported is the former: the latter indicates the light that falls on a surface. The point is that a light that has white luminance—appears white at the source of the light—may not be white light when falling upon a surface (such as a desk, a wall or a floor); further, light that has white illuminance need not be white at the source of the light. For example, three spatially separate colored LED lamps may appear white only on the surface of interest if just prior to falling on the surface of interest—the surface one is seeking to illuminate—the three discrete, distinct, and separate colors are mixed. Later on, the patent also specifies the opposite: "It will be apparent . . . to a luminophoric medium which down-converts the applied radiation to yield a white light emission from the luminophoric medium"; that is a white light emission from the surface of the device itself if the device itself comprises a luminophoric medium, which indeed it does. Hence the specification of Baretz et. al. [2003] teaches both white luminance and white illuminance.

Note that many have defined polychromatic light as: 1. [adj] (of light or other electromagnetic radiation) composed of more than one wavelength; "polychromatic light"; 2. [adj] having or exhibiting many colors. Light consisting of a single wavelength or a very narrow band of wavelengths is known as monochromatic light (this is a spectral definition); others have defined monochromatic light as all the hues and shades of a single color light (this is a colorimetric definition). Most light sources are not pure spectral sources; rather they are created from mixtures of various wavelengths and intensities of light. To the human eye, however, there is a wide class of mixed-spectrum light that is perceived the same as a pure spectral color. Orange light in spectral space is at a fixed wavelength of around 600 nm. However, orange can also be perceived if a device is emitting a mixture of about two parts red to one part green light. We cannot see the difference, and the reason has to do with the pigments that make up our color vision cells. A useful quantification of this property is the dominant wavelength, which matches a wavelength of spectral light to a non-spectral source that evokes the same color perception. Dominant wavelength is the formal background for the popular concept of hue. In addition to the many light sources that can appear to be pure spectral colors but are actually mixtures, there are many color perceptions that by definition cannot be pure spectral colors due to desaturation or because they are purples (which do not appear in the Newtonian pure spectrum). Some examples of necessarily non-spectral colors are the achromatic colors (black, gray and white) and other colors such as pink, tan and magenta. Hence, defining light in terms of colors is extremely problematic.

Prior to the invention of down-conversion in solid-state lighting, up-conversion in solid-state lighting had been known. (W. H. Grodkiewicz, et. al; U.S. Pat. No. 3,659,136, issue date Apr. 25, 1972) In contrast to up-conversion, which requires multi-photon absorption and hence is observed and useful to wavelength convert lasers, down-conversion is energetically downhill and hence a single photon can be down-converted, does not require multi-photon absorption and can occur in lighting sources with intensity considerably less than that observed with lasers. Down-conversion leads to a significant Stokes shift (bathochromic shift); the challenge in down-conversion in a solid-state p-n junction is not to demonstrate a Stokes shift but rather to generate white light. In assemblies of multiple luminophors, the challenge is to prevent all of the luminescent elements from acting as quenchers so that all of the light is not down-shifted to the lowest energy emitter (e.g.; a red emitter in a mixture of red, green and blue luminophors). Down-conversion and the subsequent filing of phosphor LEDs (WO9748138, EP0856202 (A3), U.S. Pat. No. 5,813,752, and related patent applications) and luminescence conversion (U.S. Pat. No. 6,576,930 and related patents and patent application) invoke radiative energy transfer as the means of transferring energy from the single light emitting diode die, capable of generating only monochromatic light, to a luminescent element that generate polychromatic light. Hence, heretofore, down-conversion, luminescence conversion and phosphor LEDs, have all invoked and been exclusively limited to radiative energy transfer. It has not been heretofore accepted that the radiative energy transfer may occur not only from primary emission emanating from the p-n junction of the light emitting diode die to a plethora of secondary luminophors, but also from a luminophor of higher energy to a luminophor of lower energy as known in other types of illumination technologies. (General Electric Company, Great Britain Patent number GB448887; issue date Jun. 17, 1936)

Radiative energy transfer is one of many different mechanisms for the transfer of energy from the excited state of a donor, thereby forming the ground state of the donor, to the ground state of the acceptor, in so doing forming the excited state of the acceptor. In the case of a p-n junction, the donor is the state (presumablye an excited state) of a hole:electron pair at the junction itself. Radiative energy transfer is also called trivial energy transfer and is formally defined as the transfer of excitation energy by radiative deactivation of a donor molecular entity and re-absorption of the emitted light by an acceptor molecular entity. The IUPAC Compendium of Chemical Terminology 2nd Edition (1997) defines the probability of radiative energy transfer, $P_{r,t}$, as:

where J is the spectral overlap integral, [A] is the concentration of the acceptor, and d□ is the specimen thickness. This type of energy transfer depends on the shape and size of the vessel utilized. Other means for energy transfer are Forster energy transfer and Dexter energy transfer which are typically referred to as non-radiative energy transfer. The spectral overlap term has led to the expansive research of new phosphors for solid-state lighting whereas the spectral overlap between Hg emission and existing fluorescent tube lighting phosphors is very high.

Forster energy transfer is a mechanism of excitation transfer that can occur between molecular entities separated by distances considerably exceeding the sum of their van der Waals radii. The rate of Forster energy transfer is directly proportional to the square of an orientation factor and the spectral overlap integral J, and inversely proportional to the refractive index of the medium to the fourth power, the radiative lifetime of the donor, and r the distance between donor (D) and acceptor (A) to the sixth power. The critical quenching radius, $r_0$, is that distance at which the rate of Forster energy transfer is equal to the inverse of the radiative lifetime. Forster energy transfer is described in terms of an interaction between the transition dipole moments (a dipolar mechanism) of the donor and acceptor molecules. (For an example of Forster Energy Transfer in organic light-emitting diodes, see O'Brien, et. al., Canadian Patent Application CA 2448514)

Dexter energy transfer is an energy transfer mechanism that occurs as a as a result of an electron exchange mechanism. It requires an overlap of the wave functions of the energy donor and the energy acceptor. It is the dominant mechanism in triplet-triplet energy transfer. As with radiative energy transfer and Forster energy transfer, the rate of Dexter energy transfer is proportional to J, the spectral overlap integral. It is also proportional to exp-2r, where r is the distance between the donor and acceptor. (Dexter, D. L., J. Chem. Phys. 21:836 (1953))

Energy transfer via forbidden transitions is allowed by exchange interactions while they are much less probable in the Forster mechanism. Energy will be transferred mainly by the Forster mechanism unless r is less than 10 angstroms. (D. R. Walt, U.S. Pat. No. 5,254,477; Oct. 19, 1993)

From the theoretical treatment there are two critical parameters that impinge upon the energy transfer efficiency-inter-molecular distance and spectral overlap. The fixed distance requirement constrains the "otherwise fluorescent" donor and the absorbing acceptor to be geometrically positioned within a defined range for energy transfer to occur. For Forster transfer, a distance between 10 and 100 Angstroms is essential. At greater distances, the energy transfer efficiency is essentially zero. Below 10 Angstroms, the Dexter transfer mechanism comes into play. The Dexter mechanism also enables efficient energy transfer to occur. When the distance is decreased to 5 Angstroms, the transfer efficiency approaches 100% and further decreases in distance are not observable as changes in fluorescence emission intensity.

Spectral overlap is essential to energy transfer. Without finite overlap, non-radiative energy transfer does not occur. The greater the overlap between the donor's emission and the acceptor's absorption spectrum, the greater the transfer efficiency. Accordingly, the spatial distance and spectral overlap requirements are related. As spectral overlap becomes greater, the distance requirement may be relaxed. Conversely, as the degree of spectral overlap decreases, it is important that the fixed spatial distance be small for efficient non-radiative energy transfer to occur. Thus, the donor acceptor conjugate must provide a spacial relationship between 5 and 100 Angstroms as well as a finite spectral overlap between the fluorophore and absorber species.

Another mechanism of quenching is through electron transfer. For example, the photoluminescence of CdSe quantum dots in aqueous media has been studied in the presence of gold nanoparticles with different shapes: the steady state photoluminescence intensity of CdSe quantum dots (1.5-2 nm in size) is quenched in the presence of gold nanoparticles and a decrease in the lifetime of the emitting states of CdSe quantum dots in the presence of quenchers. It was found that the quenching rate of surfactant-capped gold nanorods—as the nanoparticles—decreases as the length of the nanorods decreases, although the overlap between the CdSe emission and the nanorods absorption increases. This suggests that the quenching is a result of electron transfer rather than long-range (Forster-type) energy transfer processes. The quenching was attributed to the transfer of electron with energies below the Fermi level of gold to the trap holes of CdSe QD. (Nikoobakht B, Burda C, Braun M, Hun M, EI-Sayed M A, "The quenching of CdSe quantum dots photoluminescence by gold nanoparticles in solution.", Photochem Photobiol. 2002 June; 75(6):591-7; see also Diana Lynne Bull, A STUDY OF FLUORESCENT NANOPARTICLES: QUANTUM DOTS AND SILICA DOTS: A Thesis Presented to the Faculty of the Graduate School of Cornell University In Partial Fulfillment of the Requirements for the Degree of Master of Science, August 2004; see also for rare earths and exciton trap states (energy transfer in GaN films doped with rare earth ions), see A. J. Steckl et al. Compound Semiconductor 2000 6(1) 48)

One skilled in the art can see that there are a variety of means in down conversion systems by which the acceptor molecule that emits secondary radiation systems can be populated into their excited states, subsequent to which useful and desirable photons are generated that appears to the observer to be achromatic, white light or chromatic light. Non-radiative energy transfer can occur between emitters of secondary radiation (H. W. Leverenz, Canadian Patent Number CA 507420, issue date Nov. 16, 1954; H. W. Leverenz, Canadian Patent Number CA 470923, issue date Jan. 16, 1951) and between the excited states that defines the p-n junction with the emitter of secondary radiation. Praseodymium luminescent centers are populated into their excited states apparently by non-radiative energy transfer from the excited state that defines the GaN p-n junction: " . . . Pr in GaN can be effectively excited by forward bias p-n junction end utilized in LED . . . ". (H. J. Lozykowski, W. M. Jadwisienczak, and I. Brown "Photoluminescence and Cathodoluminescence of GaN doped with Pr" MRS Internet J. Nitride Semicond. Res. 5S1, W11.64 (2000).)

However, it is also desirable for the purposes of general illumination to have light of a pale color that is chromatic light with hue. This pale color light is frequently referred to by its color-rendering index and or color temperature. Since white light is achromatic, it has no color—that is no hue. This is an essential element of fact for white light—no color; hence, all chromatic light may approach white light, but is not, in fact white light. Where chromatic light ends and achromatic light begins can only be defined by a more complete set of specifications than is normally discussed; in many cases, the inventor reverts to specifications using the terms color temperature and color correlated index to more completely describe their invention.

It would be desirable therefore, to produce pale color light for general illumination also using down-conversion. This desirability of a solid-state light using one light emitting diode die to effect down-conversion and the generation of "color" light was also taught with the disclosure of Baretz et. al. [2003]. Pale color light, color light approaching white but light which is not achromatic, was taught by the disclosure of Baretz et. al. [2003]. Regardless of whether the light so produced is chromatic or achromatic, the mechanism taught by Baretz et. al. [2003] is the same. They also showed how organic and inorganic luminophors down-convert the primary radiation from the light emitting diode die or non-identical light emitting diode dies into secondary radiation of more useful content or specification.

In one embodiment, Baretz et. al. [2003] describe a down-converting material with three organic dyes: a blue fluorescer (Lumogen® F Violet 570—a substituted naphthalene-tetracarboxylic diimide), a green-yellow fluorescer (Lumogen® F Yellow 083—substituted perylenetetra-carboxylic diimide) and a red fluorescer (Lumogen® F Red 300—a substituted perylenetetracarboxylic diimide). Baretz et. al. [2003] claim in this embodiment a composition comprising such blue, green-yellow, and red fluorescent materials, all organic based, and incorporated in an insulating epoxy polymer. Based on the specification disclosed by Baretz et. al. [2003], the three aforementioned Lumogen® dyes are individual excited by primary radiation from the p-n junction of the light emitting diode die or if more than one light emitting diode die, the plurality of the light emitting die must have the same wavelength. Others have referred to the ability of organic luminophors to down-convert primary radiation from LEDs with a p-n junction to polychromatic radiation; an early patent discusses putting fluorescers in the epoxy envelope encapsulating a light emitting diode die but not to generate white light which is inherently more difficult to accomplish. (1. Nakamura et. al.; Japanese Patent Number JP5152609, issue date Jun. 18, 1993; 2. P. Schlotter, et. al.; Materials Science and Engineering B59 (1999) 390-394; 3. U. Kaufmann, et. al.; "Single Chip White LEDs", physica status solidi, Volume 192, Issue 2, Pages 246-253, Published Online: 12 Jul. 2002, Wiley-VCH Verlag Berlin GmbH, Fed. Rep. of Germany)

It is a well known principle of excited state quenching that multiple quenchers if simultaneously present will ultimately find the lowest energy emitter. Hence, in the presence of blue, green and red fluorescers which are populated by a variety of radiative and or non-radiative means, but each of which may act as quenchers may find themselves to exclusively populate—in a final state of equilibrium where no other quenching is to take place, only the excited state of the red fluorescer. Hence, the simultaneous presence of blue, green and red fluorescers—all of which have spectral overlap that may afford Forster energy transfer to take place, for example—may only lead to red light emission. In the case of Baretz et. al. [2003], however, it was recognized that certain factors may take place—including extremely short radiative lifetimes and the dispersion of luminophoric centers—that may avoid the well known quenching to the lowest energy emitter. Alternatively, as it has been demonstrated elsewhere, where only one luminophor is present in a white phosphor LED (such as one with a blue LED die and a yellow phosphor), quenching to the lowest energy emitter is not a problem nor contemplated since only one luminophoric dye is present in the system. Hence, the invention of Baretz et. al. [2003] teaches radiative down-conversion for single phosphor luminescence conversion, but also down-conversion in so called RGB phosphor LEDs (that is, lamps with red, green and blue phosphors).

One advantage of luminophors with short radiative lifetimes as discussed in the preceding paragraph are that the rate of luminescence, essentially the reciprocal of the lifetime, is extremely fast. It has been observed and commented on by others investigating the phenomenon known as down conversion and invented by Baretz et. al. [2003] that with high photon flux of the primary radiation, there is essentially a saturation effect so that no more secondary radiation is produced and more primary radiation is emitted. In the specific case of a blue LED die, the phenomenon that has been observed is that as the electrical load is increased—which requires robust p-n junctions—more blue light is emitted and proportionally less white light is emitted. The problem that has not been heretofore recognized is that with fast rates of luminescence from the excited states, these excited states can not absorb a secondary photon, assuming of course that the absorption spectrum of the first excited state of the down converting luminophor overlaps the spectral characteristics of the primary radiation. With lower rates of luminescence, multiple photon events are more likely to occur; however, with low rates of luminescence, mechanisms, such as excited state degradation, become competitive thereby effecting the instantaneous and long term performance of the underlying system. It would be desirable therefore for a device where low rates of luminescence are not problematic and where the device construction itself will mitigate and or eliminate these degradation mechanisms in the excited state (or in the ground state which may also occur, but generally with a lower rate).

The invention of Baretz et. al. [2003] is not limited to anyone particular semiconductor although the claims of the issued patent are limited to white light and at least one semiconductor die with the same primary radiative wavelengths; more recently down conversion is claimed in an organic light emitting diode, that is a solid-state light without a semiconductor p-n junction. (Duggal et. al., U.S. Pat. No. 6,700,322)

While Baretz, et. al. [2003] taught that both organic fluorescers and inorganic phosphors can be used for down-conversion to generate white light (as well as chromatic light), the teachings subsequent to the invention of Baretz et. al. [2003] and prior to this invention being claimed herein have focused on inorganic phosphors frequently referred to as ceramic phosphors. Ceramic phosphors utilized in solid-state lighting are not all that different from the phosphors previously discussed and used for fluorescent lighting and CRT emission. The major challenge for ceramic phosphors utilized in down conversion is that the light emission—the primary radiation—from the diode die are narrow, usually singular in range and of wavelengths of considerably lower energy than that absorbed by CRT and fluorescent lamp phosphors and that the narrow emission profile from the p-n junction has poor overlap with the excitation spectra of the ceramic phosphors required to effect down conversion.

For example, blue light emitting diode die typically emit—within a narrow 5 nm band pass—at 430 nm through 470 nm, depending on the material composition of the die active layer. The ceramic phosphor Ce doped yttrium aluminum garnet absorbs blue radiation reasonably well and emits in the yellow. Nevertheless, the primary radiation is partially emitted (incomplete absorption of the primary radiation) and hence the color rendering index is not optimal. On the other hand, uv LED die typically emit—within a narrow 5 nm band pass—at 340 nm through 390 nm, depending on the material composition of the die active layer with most nearer 380 and 390 nm. Unfortunately, most ceramic phosphors that are said to be excited by uv radiation do not absorb substantively between 340 nm through 390 nm although many are known that absorb uv light from a mercury vapor lamp. For example, whereas a typical mercury vapor lamp has multiple line emissions from the excited states of mercury, these multiple lines are of relatively high energy (254 nm, 313 nm, 365 nm). Most of the phosphors used in other applications do not absorb in the region presently required in solid-state lighting implementations with a semiconductor p-n junction although some have utility: as the blue component, $BaMgAl_{10}O_{17}:Eu^{2+}$ or $ZnS:Ag+$ are known as inorganic phosphors; $ZnS:Cu+$ or $(Zn, Cd)S:Cu+$, or $ZnS: (Al, Cu)+$ are known as blue-green component; $Y_2O_2S:Eu^{2+}$ is known as red component. (Jermann, et. al.; United States Patent Application US2004056256; publication date Mar. 25, 2004) Jermann et. al. describe a white light LED lamp using a blue phosphor $ZnS:Ag+$; using a green phosphor $ZnS:Cu+$, $Al+$ where Cu and Al are used together; and using a red phosphor $ZnS:Cu+$, $Mn+$, where Cu and Mn are used together. The green phosphor in the formulation of Jermann et. al. may alternatively be $SrAl_2O_4:Eu^{2+}$. See for example phosphors sold and marketed by Honeywell Specialty Chemicals Seelze GmbH which are generally excited by uv light in between 340 nm through 390 nm.

Fluroescent and Phosphorescent Down Conversion Materials Specific for LEDs

As noted earlier, the major challenge for ceramic phosphors utilized in LED down conversion is that the light emission—the primary radiation—from the diode die are narrow, usually singular in range and of wavelengths of considerably lower energy than that absorbed by CRT and fluorescent lamp phosphors and that the narrow emission profile from the p-n junction has poor overlap with the excitation spectra of the ceramic phosphors required to effect down conversion. Hence, materials different than that used in fluorescent tube lighting is required to perfect LED down-conversion.

Fluorescence and materials that fluoresce involves light emission without a change in spin multiplicity. Phosphorescence and materials that phosphoresce involves light emission with a change in multiplicity. Materials that fluoresce are called fluorescers or fluorophors; materials that phosphoresce are called phosphors or more specifically, if the term phosphor is unclear, phosphorescent phosphors. Because state to state transitions that require a change in spin multiplicity have a slower rate of transition, phosphors (e.g.; triplet states that phosphoresce) typically have long lifetimes. State to state transitions that do not require a change in spin multiplicity have a faster rate of transition; hence fluorophors typically have short excited state lifetimes. The longer the lifetime, the more probably an alternative event such as quenching may occur. Phosphorescence therefore is not expected to be a beneficial phenomenon in systems where quenchers, such as water and or oxygen may exist, unless there is a mechanism for speeding the rate of change in spin multiplicity. Spin-orbit coupling is such a mechanism and heavy elements, such as those elements found in ceramics, have spin-orbit coupling of sizeable magnitude. In these cases, ceramic phosphors may have a reasonably short excited state lifetime as the rate of the radiative transition is enhanced through spin-orbit coupling. As a result, phosphors may be as efficient as fluorophors in the yield of luminescence from their respective excited states. Nevertheless, it is desirable to have solid-state lighting devices where the performance of the down conversion system is not ruled by the lifetime of the selected luminophor for reasons already cited. Other than enhancing the rate of luminescence, the only other means of accomplishing the desirability mentioned in the preceding sentence is to make competing processes less likely, a formidable chore, nevertheless one that this present invention addresses.

It has been reported that a near-UV light-emitting diode could be used as a primary light source to irradiate films of red, green and blue powdered "fluors" dispersed on the surface of a glass slide. (Sato, et. al. Japanese Journal of Applied Physics, Vol. 35 (1996) L838-L839; received 27 Mar. 1996; accepted 16 May 1996; published 1 Jul. 1996. Title of reference: "Full-Color Fluorescent Display Devices Using a Near-UV Light-Emitting Diode."] With said configuration, the "fluors" so irradiated produce the primary colors of red, green or blue and "white color" is easily obtained. The fluors used by Sato, et. al., were inorganic materials ZnS:Ag (blue), ZnS:Cu,Al (green) and ZnCdS:Ag (red) and the fluors were dispersed in aqueous solutions of polyvinyl alcohol and spin-coated onto the glass slides. The glass slides were used to simulate a display and to prove that near-UV light-emitting diodes could be used to power said display through radiative energy transfer. The term fluor may have been used to mean a transparent or translucent mineral of different colors as opposed to addressing the multiplicity of the luminescent state. More recently, it has been taught that a stable white light LED "with InGaN-LED that generates a blue color of 410 nm-460 nm to excite the ZnSSe fluorescent screen by the blue so as to generate a yellow color, and then the blue and the yellow generated are synthesized into a white color." (Fujiwara, Japanese Patent Application JP2003347588; filed 2003 Dec. 5; claims priority date of 2002 May 28)

Exemplary devices have been developed for the purpose of enhancing down conversion: it has been disclosed of a light emitting device for use in lighting and/or display applications which includes a UV/blue LED located in a depression having reflecting sidewalls, a light transmitting material surrounding the LED and filling the depression, and a "phosphor" more specifically "particles of a visible light emitting phosphor surrounding the sides and top of the LED". (Vreins, et. al.; U.S. Pat. No. 5,813,753; issue date Sep. 29, 1998, filed on: May 27, 1997, claims priority date from U.S. patent application Ser. No. 08/661,520, filed Jun. 11, 1996; issued on Sep. 29, 1998) Vreins, et. al. (1998) do not define nor specify a phosphor but, by virtue of claims in a co-pending application the phosphor is "UV and blue excitable, visible light emitting." (Ronda, et. al., U.S. Pat. No. 5,813,752, issued Sep. 29, 1998). Vriens et. al. (1998) do not claim white light by virtue of down-conversion although their device is one that down-converts as the particles of phosphors are excited by uv and blue light and then emit visible light as a result. In the European patent emanating from the same disclosure white light is also not claimed nor, in either case, were the inventors able to demonstrate that white light is achievable with their system. (Stanton, et. al., European Patent EP0856202, issue date Aug. 5, 1998)

In an excellent series of work but nevertheless one filed after the invention of Baretz et. al. [2003], Reeh, et. al. disclosed a light-radiating semiconductor component which has a radiation-emitting semiconductor body and a luminescence conversion element. (Reeh, et. al.; U.S. Pat. No. 6,576,930 (assignee: Osram; filed on 7 Dec. 2000; claims priority date of Jun. 26, 1996[DE] 196 25 622 and Sep. 20, 1996[DE] 196 38 667; issued on 10 Jun. 2003) The invention of Reeh, et. al. appears to have been the work of researchers from Fraunhofer Institute for Applied Solid State Physics and which, by virtue of the patent filing, and evidenced in subsequent documentation filed with the United States International Trade Commission assigned to Osram Opto Semiconductors, a unit of Osram, itself a subsidiary of Siemens. The semiconductor body emits radiation in the ultraviolet, blue and/or green spectral region and the luminescence conversion element converts a portion of the radiation into radiation of a longer wavelength. This makes it possible to produce light-emitting diodes which radiate polychromatic light, which appears as white light, with only a single light-emitting semiconductor body. The difference between achromatic light and polychromatic light is not addressed in the specification of Reeh et. al.

A particularly preferred luminescence conversion dye is YAG:Ce, a cerium doped yttrium aluminum garnet. [A substitute ceramic phosphor that may be used—not discussed by Reeh et. al.—as an alternative is $Y_3(Al_{1-s}Ga_s)_5O_{12}:Ce:XBaAl_2O_4$ where s=0 and x=1.0 and where said phosphor may show considerable barium composition in the elemental spectral patterns.]

The invention of Reeh et. al. has the undesirable specification, claim and element that the white light so produced, achromatic light without a hue, contains a portion of the original radiation in the ultraviolet, if the original semiconductor body emits radiation in the ultraviolet. It is an undesirable element in that the ultraviolet light emanating from the semiconductor light may be a safety hazard to the observers of the white light. It would be desirable to not require the light so produced to contain a portion of the original radiation; my present invention has that desirable feature as will be more fully described herein. As evident within claim 4 of U.S. Pat. No. 6,576,930 by Reeh et. al, the invention is based on "a luminescence conversion element with at least one luminescent material, said luminescence conversion element being deposited on said semiconductor body, said luminescence conversion element converting a radiation originating in the first wavelength range into radiation of a second wavelength range different from the first wavelength range, such that the semiconductor component emits polychromatic visible light comprising radiation of the first wavelength range and radiation of the second wavelength range." For a white light powered by a blue light-emitting diode die, the invention requires "radiation of the first wavelength range" and "radiation of the second wavelength range" where the latter requires excitation into the excited state by radiative energy transfer from the former and where the luminescence conversion element is deposited on the semiconductor body. It is generally not appreciated and recognized by those with skills in the art that for achromatic light powered by a blue LED die as opposed to polychromatic light powered by the same blue LED die, the blue component needs to be changed so as to parallel the photopic response in the blue region as closely as possible; therefore, it is desirable that the radiation of the first wavelength range be altered such that the blue component be distorted not only by radiative energy transfer (which only alters the quantity of the radiation of the first wavelength range) but also by spectral filtration (such that the radiation of the first wavelength range is in fact not at all part of the product's emission profile).

My present invention also does not require the luminescence conversion element to be deposited on the semiconductor body and in fact it is preferred that the luminescence body is not deposited on the semiconductor body as will be claimed specifically. It is also the case that whereas the aforementioned claim of Reeh et. al. is contingent on "semiconductor component emits polychromatic radiation", an extremely unlikely event in that semiconductor components emit narrow band chromatic radiation all would agree, in the case of my invention the semiconductor body may emit monochromatic and or a mono-colored radiation although the device of my invention that includes a semiconductor component may emit chromatic or achromatic radiation subsequently thereto. In certain implementations, where the concentration of the luminescent element is high enough, the radiation of the first wavelength can not be delivered in an unaltered state as by the definition of radiative energy transfer, the photons of the first radiative range are absorbed by the luminescent element and not every wavelength is absorbed with equal extinction coefficient. Hence the specification of Reeh et. al. is difficult to practice since radiative energy transfer, by definition absorbs—does not transmit—photons of the primary radiation range thereby altering quantitatively and qualitatively the primary radiation range.

As noted before, the invention of Reeh et. al. claiming a priority date after the filing of Baretz et. al. [2003] uses the term luminescence conversion to refer to using phosphors to emit chromatic and achromatic light. Luminescence conversion is detailed in various reports emanating from the aforementioned Fraunhofer Institute. For example, one report in 1997 states "Single white LEDs were not feasible to date, as they emit monochromatic light only. The mixture of colors making up white light was only possible with a combination of three different diodes. Researchers at the Fraunhofer-Institute für Angewandte Festkörperphysik IAF (Fraunhofer Institute for Applied Solid State Physics) have achieved a breakthrough. The innovative idea was the generation of white light by luminescence conversion. Blue emitting diodes based on gallium nitride were combined with luminescent dyes giving bright light emission at changed wavelengths. The resulting mixture of colors is visible as white light. Furthermore, these LUCOLEDs—luminescence conversion LEDs—allow light emission in a wide color range, depending on the emission of the dyes used. In addition to white light, arbitrary color tones of the spectrum are possible, e.g. purple." [January 1997 "Research News" published by Fraunhofer-Gesellschaft.]

In a press release on Apr. 23, 1999, the same Fraunhofer-Gesellschaft reported "Although red, green and yellowish-green LEDs have been on the market for quite a long time, white light-emitting diodes could only be produced by combining different colored LEDs. But two years ago research scientists at the Fraunhofer Institute for Applied Solid State Physics (IAF) in Freiburg solved the problem—concurrently with Japanese scientists—by developing white light-emitting luminescence conversion LEDs. Pumped by a primary light source, luminescent materials like dyes or phosphors emit light at longer wavelengths by luminescence down-conversion. To develop white light-emitting diodes, the IAF team combined blue light-emitting LEDs based on gallium nitride with organic or inorganic luminescent materials emitting in the yellow spectral range. Mixing the blue radiation of the LED with the complementary yellow light of the luminescent material results in a white light-emitting LED. By varying the concentration of the dye, the hue can be changed easily. Thus small LEDs open up completely new opportunities in lighting design. The process for manufacturing white LEDs is simple: Yellow-emitting luminescent materials are mixed with epoxy resin and applied to the blue-emitting diode. Osram Optic Semiconductors, a subsidiary of Siemens, has been mass producing them since last year. White LEDs are already used as standard equipment in the Audi TT sports car. The innovative, simple, and inexpensive manufacture of the diodes is excellently suited for large volume production. Siemens will introduce the first white LUCOLEDs commercially next year." (1. See for example, later discussions in S. Müller, R. Quay, F. Sommer, F. Vollrath, R. Kiefer, K. Köhler, J. Wagner; Fraunhofer-Institut für Angewandte Festkörperphysik, Tullastrasse 72, 79108 Freiburg, Germany, "Epitaxial growth and device fabrication of GaN based electronic and optoelectronic Structures"; 10th European Workshop on MOVPE, Lecce (Italy) 8-11 Jun. 2003. 2. P Schlotter, R Schmitt, J Schneider "Luminescence conversion of blue light emitting diodes", Applied Physics A 64, 417 (1997).)

The Yellow-Emitting Ceramic Phosphor Ce-doped Yttrium Aluminum Garnet and The Formation of White Light from Blue and Complementary Yellow Down-Conversion.

Nichia Corporation, as noted earlier, through the efforts of Nakamura and his colleagues, self-claim that they started developing Blue LEDs in 1989, and built up the technology for industrialization of GaN-based Blue LEDs in 1991. The self-acclamation proffered by Nichia continues with the comments "Nichia Corporation succeeded in the commercial production of high-brightness Blue LEDs in November 1993. Further, by applying its expertise as a phosphor manufacturer, and by combining YAG (Yttrium Aluminum Garnet) phosphors, specifically $Y_3Al_5O_{12}:Ce^{3+}$ with Blue LEDs and, according to their own acclaim, Nichia Corporation started commercial production of White LEDs in 1996 for the first time in the world." ("A New Phosphor for Frying-Spot Cathode-Ray Tubes for Color Television: Yellow-Emitting Y3Al5O12:Ce3+", G. Glasse et al., Applied Physics Letters, vol. 11, No. 2, pp. 53-54 (1967)

Nichia's research and commercial efforts on white light LEDs are documented and detailed: the self-asserted operable United States patent is of inventor Yoshinori Shimizu. (Demand for Jury Trial: Nichia vs. Sharper Image; United States District Court Northern District of California Case Number: C04-1360. Also, "Report on the filing or determination of an action regarding a patent or trademark"; TO: Commissioner of Patents and Trademarks; Washington, D.C. 20231; In Compliance with 35 § 290 and/or 15 U.S.C. § 1116 you are hereby advised that a court action has been filed in the U.S. District Court Northern District of California; Y. Shimizu, U.S. Pat. No. 5,998,925, issue date Dec. 7, 1999) Additional relevant information on U.S. Pat. No. 5,998,925 to aid the review of the related prior art is: assignee: Nichia; filed on Jul. 29, 1997; claims priority date of Jul. 29, 1996[JP] 8-198585; Sep. 17, 1996[JP] 8-244339; Sep. 18, 1996[JP] 8-245381; Dec. 27, 1996[JP] 8-359004; Mar. 31, 1997[JP] 9-081010. Shimizu, et. al. (1999) claim a light emitting device, comprising a light emitting component and a phosphor capable of absorbing a part of light emitted by the light emitting component and emitting light of wavelength different from that of the absorbed light; wherein said light emitting component comprises a nitride compound semiconductor represented by the formula: InGaAlN and said phosphor contains a garnet fluorescent material comprising 1) at least one element selected from the group consisting of Y, Lu, Se, La, Gd and Sm, and 2) at least one element selected from the group consisting of Al, Ga and In, and being activated with cerium.

Shimizu argue that the primary purpose of their invention is to overcome either: for inorganic luminophors, degradation of the phosphor due to precipitation of the metal component or a change in properties of the metal component leads to discoloration; in the case of an organic luminophor, coloration occurs due to breakage of the double bond. It was supplementary advanced that degradation may occur from localized heating and or moisture. There has been a long unmet need to overcome these deficiencies for a wide class of luminophors. Further, in the case of an organic luminophor that is charged (ionic), the localized electric field may cause electrophoresis which may cause an undesired change in color tone. Simizu focused on selecting a very narrow class of luminophors that may overcome the aforementioned challenges and highlighted two: cerium doped yttrium aluminum garnet and cerium doped gadolinium indium garnet. Shimizu also argues that it is preferable for the LED to emit blue light, as opposed to uv light, since the latter will degrade the resin. (Shimizu, et. al.; 1999) However, in the absence of the degradation of the resin, one of ordinary skill in the art will recognize that it is preferable to have the LED emit uv light as opposed to blue light since more luminophors absorb light in the uv than they do in the blue. However, the most important reason not to prefer blue to uv light for the LED is that the blue light from the LED die will inevitably contribute substantively to the chromaticity of the intended achromatic light therefore making the light not achromatic. More importantly, even in the very unlikely and heretofore not realized event that if the light appears to be achromatic at zero time, it is inevitably the case, as the device ages that the blue component will become more substantial as it is the primary radiation in the device of Shimizu. As noted earlier, high photon fluxes of blue light will inevitably increase blue component to the polychromatic irradiation due to saturation of the down-conversion process. Therefore it is preferred, if achromatic light is to be generated, at zero time and throughout the useful light of the device, that a non-visible component be at the very least an element of the primary radiation.

This invention of Shimizu as issued in the patent is in some degree restricted to GaN semiconductors and claims garnet fluorescent materials. [See for example, Schlotter, P. et al., "Luminescence conversion of blue light emitting diodes", Applied Physics A, Springer Verlag (publ.), April 1997, vol. 4, pp. 417-418.]

A later issued invention of similar heritage discloses a light emitting device comprising a component capable of emitting blue light, and an opal coating member covering said light emitting component and containing a yellow phosphor capable of absorbing a part of blue light emitted by said light emitting component and emitting light of wavelength different from that of the absorbed light. (Shimizu, et. al., U.S. Pat. No. 6,069,440 (filed on Apr. 28, 1999; claims priority date of Jul. 29, 1996[JP] 8-198585; Sep. 17, 1996 [JP] 8-244339; Sep. 18, 1996[JP] 8-245381; Dec. 27, 1996 [JP] 8-359004; Mar. 31, 1997[JP] 9-081010) issued on 30 Mar. 2000) The opal coating bears no protecting and enhancing function.

Notwithstanding the above, the same claims using a fluorescent material with two blue light emitting diode (that is, two diode of the same wavelength) where the fluorescent material primarily acts as a scattering layer so as to obscure two point sources. (Shimizu et. al., issued Japanese Patent JP10097200 with a publication date of 1998 Apr. 14, application number: JP19970147337 filed on 20 May 1997)

Finally, as discussed in chapter 10.4 of "The Blue Laser Diode" by S. Nakamura et al., pages 216-221 (Springer 1997), incorporated herein by reference, white light LEDs can be fabricated by forming a ceramic phosphor layer on the output surface of a blue emitting semiconductor LED. The blue LED is an InGaN single quantum well LED, and the phosphor is a cerium doped yttrium aluminum garnet Y3Al5O12:Ce3+("YAG:Ce"). The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light. This invention is based on the fact that yellow light is a secondary color, a combination of red and green light and when red and green and blue are combined, as taught by Baretz et. al. [2003] white light is obtained. [Interestingly, if a yellow complementary color mixed with blue can provide a white light, one would argue that a blue-green (also called cyan) complementary color mixed with red can provide a white light. See Mueller-Mach et. al. in JP2002016295, EP1150361, U.S. Pat. No. 6,603, 258]

Osram's research and commercial efforts on white light LEDs are documented and detailed: the self-asserted operable United States patents which have advanced the art for solid-state white light include U.S. Pat. No. 6,613,247 "Wavelength-converting casting composition and white light-emitting semiconductor component", U.S. Pat. No. 6,592,780 "Wavelength-converting casting composition and white light-emitting semiconductor component", U.S. Pat. No. 6,576,930 "Light-radiating semiconductor component with a luminescence conversion element", U.S. Pat. No. 6,066,861 "Wavelength-converting casting composition and its use", U.S. Pat. No. 6,245,259 child to U.S. Pat. Nos.

6,066,861, 6,277,301, a continuation of U.S. Pat. Nos. 6,066,861, 6,592,780 a continuation of U.S. Pat. Nos. 6,245,259, and 6,613,247 "Wavelength-Converting Casting Composition and White Light-Emitting Semiconductor Component". (Documents associated with Complaint of Osram GmbH and Osram Opto Semiconductors GmbH under Section 337 of the Tariff Act of 1930, as Amended; In the Matter of Certain Light-Emitting Diodes and Products Containing the Same; United States International Trade Commission; Investigation Number 337-TA-512, Washington, D.C. 20436) The U.S. Pat. No. 6,576,930 does not define the term "white light" but does specify "The hue (color locus in the CIE chromaticity diagram) of the white light . . . " Since achromatic light has no hue, the patent does not teach to achromatic light. The same patent at times refers to white light as polychromatic light and as white light of mixed color.

U.S. Pat. No. 6,066,861 speaks to a composition containing pigments that convert light of one wavelength (e.g., blue, green, or ultraviolet light) to light of another wavelength (e.g., yellow light). They also relates to light-emitting semiconductor components containing this composition. The principal application—the conversion of blue light to yellow light in white LEDs—is not claimed. The invention is specific to an "epoxy casting resin", the term "casting" is not defined. The child refers to phosphors containing cerium ion. The continuation refers to a composition that contains epoxy casting resin and pigments having phosphors selected from the group consisting of Ce-doped phosphors; garnets doped with rare earths; thiogallates doped with rare earths; aluminates doped with rare earths; and orthosilicates doped with rare earths. It is generally understood, in the context of luminophors, that pigments are inorganic luminescent materials that have color prior to photo-activation and that dyes are organic luminescent materials that have color prior to photo-activation. When using epoxy casting resin, many approaches have been used to deposit phosphor onto the LED, such as, for example, a time-pressure technique and a roller coating technique. Each of these approaches and many others are designed to fill up a reflector cup of the LED with phosphor. However, the volumetric accuracy is typically unsatisfactory due in part to the settling of the phosphor within the solution. Another disadvantage is a result of the process of mixing phosphor compounds with an optically-clear substance, such as, for example a clear epoxy resin. It is difficult to achieve and duplicate a uniform mixture of the phosphor compound particles in the optically-clear substance. This difficulty results in a less than desirable uniformity of the light emission from the lighting device.

The blue LED-YAG:Ce phosphor white light illumination system suffers from the following additional disadvantages. The blue LED-YAG:Ce phosphor system produces white light with a high color temperature ranging from 6000 K to 8000 K, which is comparable to sunlight, and a typical color rendering index (CRI) of about 70 to 75. While the blue LED-YAG:Ce phosphor illumination system with a relatively high color temperature and a relatively low CRI is acceptable to customers in the far east lighting markets, the customers in the North American markets generally prefer an illumination system with a lower color temperature, while the customers European markets generally prefer an illumination system with a high CRI. For example, North American customers generally prefer systems with color temperatures between 3000 K and 4100 K, while European customers generally prefer systems with a CRI above 90. That is to say, it is desirable from the perspective of general illumination for solid-state lights to have chromatic light with a hue; likewise, for many other applications—for example as a light source for scanning or as a backlight for displays—it is desirable to produce white light—that is achromatic light without a hue.

Regardless of the adjustment of additional phosphors including red emission phosphors to adjust the color temperature of blue light emitting diodes with yellow phosphor, this system has one fundamental and significant problem: the number of blue photons emanating there from is far greater than the relative number of blue photons in the photopic curve. In other words, the photons being generated are not useful in terms of luminous intensity; this means that the light is not productive for general illumination. The luminous intensity could increase dramatically if the blue photons were substantively adjusted to green photons (near the photopic maximum); heretofore, it has not been successful to dramatically reduce the blue component and to generate a spectral light mimicking the photopic curve using a blue LED die and a complementary yellow phosphor. This is a fundamental problem that will always impact the magnitude of brilliance of white LEDs based on blue die and yellow complementary phosphors. Solid-state lighting based on combinations of red, green and blue phosphors do not, in theory, have this fundamental challenge, presuming of course that non-radiative energy transfer between the phosphors does not force the spectral emission bathochromic to the photopic curve. Interest in creating an achromatic light using a UV-emitting LED to pump a trio of RGB-emitting of phosphors, UV light is adsorbed by the phosphors, and the mixed RGB output appears achromatic much the same as a mixed LED array of red, green and blue LED-dice. In contrast let us note, "The quantum deficit between the UV pump and the phosphors, especially the low-energy red phosphor, dissipates significant energy and makes this approach inherently less efficient than either the red, green and blue LED-dice or the phosphor conversion using a blue LED and yellow phosphor emitter schemes for generating white light." (D. A. Stiegerwald, et. al., "Illumination With Solid State Lighting Technology", IEEE JOURNAL ON SELECTED TOPICS IN QUANTUM ELECTRONICS, VOL. 8, NO. 2, Marck/April 2002) Notwithstanding this observation which relates to conversion of electrical energy to photonic energy, we add that the conservation of energy does not preclude one quantum of primary radiation to generate only one quantum of secondary radiation.

Other difficulties attesting to the general undesirability of using blue LED-YAG:Ce phosphor illumination—in the conventional construction at least—is articulated by Doxsee, Daniel Darcy; et al. within United States Patent Application 20040135154 (Jul. 15, 2004). Therein they state "In addition to this somewhat limited emission intensity, the color output of such an LED-phosphor system varies greatly due to frequent, unavoidable routine deviations from desired parameters (i.e. manufacturing systemic errors) during the production of the light. For example, the color output of the finished device is very sensitive to the thickness of the phosphor layer covering the LED. If the phosphor is too thin, then more than a desired amount of the blue light emitted by the LED will penetrate through the phosphor and the combined phosphor-LED output will appear bluish. In contrast, if the phosphor layer is too thick, then less than a desired amount of the blue LED light will penetrate through the phosphor layer. In this case, the combined phosphor-LED output will appear yellowish. Therefore, the thickness of the phosphor layer is an important variable affecting the color output of a blue LED based system. Unfortunately, the thickness of the phosphor layer is difficult to control during large scale production of LED-phosphor lamp systems, and the variations in phosphor thickness often result in relatively poor lamp to lamp color control. In addition, lamp to lamp variations occur due to the varying of the optical power from chip to chip." The solution proposed by Doxsee et. al. (2004) is replacement of blue LED die with uv LED die ("emitting in the 380-420" nm range according to the definition of Doxsee et. al. of a uv emitting diode die) and the utilization of uv excited phosphor blends to generate white light: $BaMg_2Al_{16}O_{27}:Eu^{2+}$ with a second phosphor where the second phosphor is a terbium aluminum garnet. Note that the first phosphor uses europium instead of the cerium in YAG:Ce and that the yttrium aluminum garnet—an yttrium aluminum oxide in a garnet crystal structure—is replaced with a barium magnesium aluminum oxide. The second phosphor claimed by Doxsee et. al. (2004) is $Tb_3Al_{4.9}O_{12}$:Ce where the cerium complexes not with YAG (an yttrium aluminum oxide in a garnet crystal structure) but with terbium aluminum oxide in a garnet structure. Doxsee et. al. sequester the phosphors claimed either as a layer on the LED die itself [The phosphor, radiationally coupled to the LED chip, is deposited on the LED by any appropriate method . . . (for example, a water based suspension of the phosphor(s) can be formed, and applied as a phosphor layer to the LED surface by coating and drying the phosphor suspension over the LED chip)] or where the phosphor powder may be interspersed within a single region of the encapsulant material or, more preferably, throughout the entire volume of the encapsulant material.

Doxsee et. al. teach the preparation of terbium aluminum garnet complexed with cerium, for example, with the following specifications: The TAG phosphor for use in the phosphor blend of the present invention may be produced by a method comprising the steps of: (1) providing stoichiometric amounts of oxygen-containing compounds of terbium; oxygen-containing compounds of at least one rare-earth metal for example Ce; and oxygen-containing compounds of at least one member selected from the group consisting of for example Al; (2) mixing together the oxygen-containing compounds to form a mixture; and (3) firing the mixture in a reducing atmosphere at a temperature and for a time sufficient to convert the mixture to a rare earth-activated terbium-containing garnet phosphor. Doxsee et. al. teach that the reducing atmosphere may optionally be diluted with an inert gas, such as nitrogen, helium, neon, argon, krypton, xenon; subsequent to the preparation of the TAG phosphor, these inert gases are not utilized by Doxsee et. al.

The challenge in utilizing ceramic phosphors for the generation of achromatic white light (light without hue) is formidable at best and most difficult and expensive at worst and has led to extremely complicated mixtures of ceramic phosphors to effect achromatic white light. For example, in U.S. Pat. No. 6,084,250, Justel, et. al. claim a white light emitting diode comprising a UV-diode with a primary emission of 300 nm through 370 nm and a phosphor layer including a combination of a blue-emitting phosphor having an emission band, with 430 nm through 490 nm, a green-emitting phosphor having an emission band, with 520 nm through 570 nm and a red-emitting phosphor having an emission band, with 590 nm through 630 nm, emits high-quality white light. The color-rendering index CRI is approximately 90 at a color temperature of 4000 K. The color rendition depends only on the composition of the three phosphors, not on the relation between converted and non-converted light, and hence can be readily controlled and regulated.

Even when a broadly used single ceramic phosphor is available, ultimate performance is compromised. Shimizu et al. describes various phosphor LEDs that generate white output light having a color temperature somewhere between 5,000 to 6,000 degrees Kelvin. (Shimizu, et. al.; PCT Application number WO1997JP02610 Jul. 29, 1997, published as WO 98/05078: "Light Emitting Device and Display Device") In one embodiment, the LED of Shimizu et al. utilizes a yttrium aluminum garnet (YAG) phosphor to convert some of the primary light into secondary light having a peak wavelength of about 580 nm. The spectral distribution in this embodiment has two emissions peaks; one peak is predominately caused by the primary light emitted from the GaN die of the Shimizu et al. and the other peak is predominately caused by the secondary light emitted from a yttrium aluminum garnet phosphor.

A concern with the Shimizu et al. LED is that the "white" output light has an undesirable color balance for a true color rendition. The output light of the Shimizu et al. LED is adequate for applications in which simple illumination is required. However, for applications in which a high color rendition is desired, the output light is deficient in the red region of the visible light spectrum (647-700 nm range).

As an example of another disclosure where an improved phosphor is claimed, see for example, in the issued U.S. Pat. No. 6,680,569, where Mueller-Mach, et al. discloses a light emitting device which includes a light source that emits first light in response to an electrical signal, and a fluorescent layer positioned over the light source. The fluorescent layer includes a first fluorescent material which radiates second light and a second fluorescent material—which must "comprise" a nitrido-silicate—which radiates third light. The invention of Mueller-Mach, et. al. discloses the use of a yttrium aluminum garnet (YAG) phosphor in general or a cerium-activated yttrium aluminum garnet, more specifically, as the first fluorescent material and comprises a nitride-silicate which radiates red light. Hence, whereas the disclosure of Shimizu et. al. uses a single phosphor to emit polychromatic light and the primary radiation of the semiconductor light emitting diode die, the disclosure of Mueller-Mach, et. al. uses two fluorescent materials to emit polychromatic light with a greater red contribution than that otherwise available from a yttrium aluminum garnet phosphor as a single phosphor, by itself. The mechanism by which the nitride-silicate which radiates red light is brought to its excited state is not articulated. Further, there is a requirement that the primary radiation "emits first light" and that this occurs as a response to an electrical signal. This wording would seem to preclude non-radiative energy transfer between the p-n junction and the first fluorescent material.

Other ceramic phosphors are continuously being discovered and their benefits taught. (Y. Tian et. al.; United States Patent Application 20040173807; publication date Sep. 9, 2004; hereinafter Tian et. al. [2004]) For example, recently RCA Lab's spin-off Sarnoff Laboratories—home of initial work on GaN semiconductors with their treasure trove of phosphors initially developed for color television—claim the garnet phosphor having the following composition: $Y_3(Al_{1-s}Ga_s)_5O_{12}:Ce:XBaAl_2O_4$ wherein s is equal to or greater than 0 and less than or equal to 1; x is from 0.01 to 0.3. The phosphor pioneer Yocum and colleagues at Sarnoff found that by substituting barium fluoride, or other alkali metal or alkaline earth metal halide, as a flux during manufacture of a trivalent cerium activated, yellow emitting yttrium aluminum garnet phosphor and heating the mixture at from 1400-1500.degree. C., enhanced fluorescence emission is obtained, while maintaining the wavelength emission properties. The resultant phosphor has a small alkali metal or alkaline earth metal alumina halide crystalline second phase in the phosphor, generally about 1% which enhances its emission intensity in the yellow range: called a "two-phase phosphor". Notwithstanding this important and impressive accomplishment, small increases in the quantum yield of yttrium aluminum garnet phosphors while important and beneficial in commercial implementations are not thought to be critical parameters in the long term goal of replacing incandescent lighting with solid-state lighting.

Nevertheless, at least a systematic approach towards designs of new ceramic phosphors is emerging. (Tian et. al. [2004]) As described, the yellow-emitting cerium doped yttrium aluminum garnet (YAG) phosphors have been known for some time. It is also known that the emission wavelength of these phosphors can be shifted to longer wavelengths when gadolinium is partially substituted for yttrium. Along with the realization that larger ions partially substituted for aluminum shifted the emission wavelength to shorter wavelengths for these phosphors, an approach towards garnet phosphor design is apparent. Cerium-doped yttrium aluminum garnet phosphors generally emit in the 500-750 nm range, with a peak at 550 nm. The exact peak obtained depends on the concentration of Cerium. (Tian et. al. [2004])

Other ceramic phosphors reported (Yocom, Perry Niel; et al.; United States Patent Application 20030222268, Dec. 4, 2003) to have utility include:

1. phosphors that emit in the range of from about 550 to about 750 nm include calcium magnesium silicate activated with europium and/or manganese ($CaMgSi_2O_6:Eu^{+2}$, $Mn^{+2}$) and strontium lithium silicate activated with tin and/or manganese ($Sr_2Li_2Si_2O_7:Sn^{+2}$, $Mn^{+2}$);

2. a phosphor that emits in the range of about 650 to about 750 nm is aluminum oxide (alumina) activated with titanium ($Al_2O_3:Ti^{+3}$);

3. a phosphor that emits in the range of about 750 to about 1100 nm is cadmium sulfide activated with copper and/or chlorine ($CdS:Cu^{+2},Cl$);

4. a phosphor that emits in the range from about 1100 to about 1300 nm is magnesium silicate activated with chromium ($Mg_2SiO_4:Cr^{+4}$);

5. a phosphor that emits in the range from about 1200 to about 1400 nm is yttrium silicate activated with chromium ($Y_2SiO_5:Cr^{+4}$)

In addition, red-emitting strontium-calcium sulfide phosphor doped with europium and a halide has been reported. (Tian, Yongchi; et al., United States Patent Application 20030132422; publication date Jul. 17, 2003) A two phosphor component white light (based on two complementary colors) containing is reported: the first phosphor is an orange emitting $Eu^{2+}$, $Mn^{2+}$ doped strontium pyrophosphate, $(Sr_{0.8}Eu_{0.1}Mn_{0.1})_2P_2O_7$; the second phosphor is a blue-green emitting $Eu^{2+}$ doped SAE, $(Sr_{0.90-0.99} Eu_{0.01-0.1})$ $4Al_{14}O_{25}$. (Srivastava, et. al.; Canadian Patent Application CA 2375069)

As one skilled in the art would appreciate, the discovery of new inorganic materials for specific luminescent applications—especially those amenable to their use in the manufacture of consistent and high quality light emitting diode lamps—is a challenge. The preparation and discovery of new solid state inorganic compounds is limited by the lack of a general framework that provides broad based predictive synthetic strategies and theories. Due to the lack of predictive tools available to the solid state inorganic chemist, the preparation of new phosphors has generally been restricted to serial synthesis and analysis techniques. As such, serial synthesis and testing of powder phosphors has been the discovery and development paradigm for the last one hundred and fifty years. "Such techniques have resulted in the discovery of less than one hundred phosphors suitable for commercial use" (see, Vecht, SID Seminar Lecture Notes, 2, F-2/3 (1996); Ropp, The Chemistry of Artificial Lighting Devices, Elsevier, Amsterdam, pp. 414-656 (1993)). At the same time, efforts to predict basic solid state properties from theory, including intrinsic or extrinsic luminescent efficiency, have been unsuccessful (see, DiSalvo, Science, 247:649 (1990)). Using traditional methods, fewer than 1% of all possible ternary compounds and less than 0.01% of all possible quaternary compounds have been synthesized heretofore (see, Rodgers, et al., Mat. Res. Bull., 18:27 (1993)). Combinatorial techniques have been helpful (see U.S. Pat. No. 6,315,923 "Storage phosphors"; U.S. Pat. No. 6,203,726 "Phosphor Materials" and U.S. Pat. No. 6,013,199 "Phosphor materials") but the challenge and cost associated with complex combinatorial ceramics is formidable.

In contrast, organic compositions of matter are readily produced and conceived and the art of conjugation in molecular design is appreciated and easily practiced. Organic luminophors in general and organic fluorescent and organic phosphorescent materials have extremely broad emission profiles, are relatively inexpensive to manufacture and a well accepted paradigm exists for the organic chemist skilled in the art to molecularly design emission profiles of useful characteristics. They also have high quantum yields of luminescence: the quantum efficiency of the organic Lumogen dyes in solution is >0.98 and no loss in efficiency was observed with a polymethylmetacrylate (PMMA) host whereas the quantum yield of the ceramic phosphor Y(Gd) AG:Ce doped was measured relative to a known standard and found to be 0.86. (A. R. Duggal, J. J. Shiang, C. M. Heller, and D. F. Foust, "Illumination Quality OLEDs for Lighting" Technical Information Series GE Global Research Technical Report 2002GRC189, August 2002) Notwithstanding the appeal of organic luminophors, there have been only a few examples, other than that taught by Baretz et. al. [2003] of organic fluorescers being used in Down-Conversion in solid-state lighting with a p-n junction.

In a series of experiments imitating down-conversion, it has been reported that thin films of dilute organic dyes in amorphous inorganic matrix materials may be promising materials for optoelectronic devices based on luminescence conversion, because the separation and immobilization of the dye molecules by the matrix reduces non-radiative relaxation processes of excited molecules in bulk dyes. High quantum efficiencies were demonstrated in such diluted systems realized by sol-gel technique or by incorporation in organic matrices. However, the room temperature photostability in these systems is not suitable for many applications based on the luminescence. As an improvement, it was subsequently found that an organic-inorganic system prepared by co-evaporation of the components in high vacuum which allows (i) to use very stable dye molecules independent of their solubility in the matrix, (ii) to use different substrates and (iii) which results in homogeneous dye molecule distribution. In dependence on dye concentration, absorption and luminescence spectra change dramatically due to the changes in intermolecular distance and surrounding. For the lower concentrations, both absorption and luminescence spectra can be described as monomer transitions with vibrational progression and broadened peak widths. In the system perylene-3, 4, 9, 10-tetracarboxylic-dianhydride in silicon dioxide (silica) the maximum photoluminescence quantum efficiency is obtained at a concentration of about 0.1 volume % as expected from energy transfer processes between the molecules, which were analyzed by luminescence anisotropy measurements. (H. Froeb, M. Kurpiers, K. Leo "Highly Efficient and Photostable Organic Dyes in Inorganic Matrices: A Novel Path to Luminescence Conversion Devices.", Institut fur Angewandte Photophysik, Technische Universitaet Dresden, Dresden, GERMANY. Proceedings published as Volume 560 of the Materials Research Society Symposium Proceedings Series, Apr. 7, 1999.) The important observation is that even when the organic luminophor has extremely high quantum yields of luminescence (e.g.; 98% for Lumogen organic luminophors, nearly quantitative for the bis(phenylethynyl)anthracenes), under high photon flux alternative mechanisms of deactivation ultimately lead to a measurable altering of the initial structures. In many cases, the "leakage" results from bimolecular events—aggregation; excimer formation is energetically favorable but leads to alternative reactions, non-radiative decay and generally lower yields of radiative decay (luminescence). Agglomeration also occurs in ceramic phosphors and is also thought to be a reason for long term luminophor instability; that ceramic particles are not soluble in epoxy matrices enhances agglomeration. In any case, sequestering an organic luminophor in a silica matrix is similar to sequestering the luminescent Ce ion within a garnet structure. Note that the vacuum was used to disperse the dyes and that once dispersed the vacuum was released, all prior to radiation.

Hide, et. al. reported a hybrid Light-Emitting Diode for white lighting and for full-color applications [Hide, F.; DenBaars, S. P.; and Heeger, A. J.; U.S. Pat. No. 5,966,393, filed on 4 Feb. 1997, priority date of 13 Dec. 1996 from provisional application No. 60/032,849; issued 12 Oct. 1999]. Hide, et. al., claim a photoluminescent polymer—a photoluminescent conjugated semiconducting polymer—which down-converts light from a solid-state inorganic light-emitter.

A similar disclosure was reported by Zhang, C.; et. al. entitled "Gallium nitride/conjugated polymer hybrid light emitting diodes: Performance and lifetime." [Chi Zhang and Alan J. Heeger, Journal of Applied Physics—Aug. 1, 1998; Volume 84, Issue 3, pp. 1579-1582; Received 12 Jan. 1998; accepted 28 Apr. 1998] In this disclosure a "pure white" light emission from GaN/conjugated polymer hybrid light emitting diodes (LEDs) using a single layer of conjugated polymer was reported. When the conjugated polymer is properly encapsulated, the report states that the hybrid LEDs can operate at least 5000 h, with decay in output luminosity comparable to that of commercial blue GaN lamps. By using different conjugated polymers, emission with a full range of colors is demonstrated with the hybrid LED. [Also "White light from InGaN/conjugated polymer hybrid light-emitting diodes", F Hide, P Kozodoy, SP Denbaars, A J Heeger; Applied Physics Letters 70(20), 2664 (1997)]

Bojarczuk et. al., disclosed a hybrid organic-inorganic semiconductor-based light-emitting diode [Bojarczuk, Jr.; Nestor A.; Guha; Supratik; Haight; Richard Alan; filed Mar. 5, 1997; issued Apr. 20, 1999, U.S. Pat. No. 5,895,932; priority date of Jan. 24, 1997 from Ser. No. 08/788,509]. This invention provides a novel hybrid organic-inorganic semiconductor light emitting diode. The device consists of an electroluminescent layer and a photoluminescent layer. The electroluminescent layer is an inorganic GaN light emitting diode structure that is electroluminescent in the blue or ultraviolet (uv) region of the electromagnetic spectrum when the device is operated. The photoluminescent layer is a photoluminescent organic thin film such as tris-(8-hydroxyquinoline) Al, Alq3, deposited onto the GaN LED and which has high photoluminescence efficiency. The uv emission from the electroluminescent region excites the Alq3 which yields luminance in the green. Such a photoconversion results in a light emitting diode that operates in the green (in the visible range). Other colors such as blue or red may be obtained by appropriately doping the Alq3. Furthermore, other luminescent organics in addition to Alq3 may be used to directly convert the uv or blue to other wavelengths of interest. The invention provides the benefits of simplicity and ease of fabrication, since a complete redesign of the structure is not necessary to change emission wavelength, and the possibility for making displays by spatially varying the deposition of the emissive layer. This invention claims a hybrid organic-inorganic semiconductor light emitting diode comprising, in sequence, a substrate, a n-doped semiconductor layer, a light emission region where electrons and holes recombine to produce light, a p-doped semiconductor layer, and a layer of an organic photoluminescent material which comprises a fluorescent compound or combination of compounds which absorb light at the wavelength emitted by said light emission region and re-emit light at a different wavelength. This invention is limited to "a layer of an organic photoluminescent material."

In U.S. Pat. No. 5,898,185, Bojarczuk, Jr., et al. (1999a) claim a hybrid organic-inorganic semiconductor light emitting diode consisting of a layer of a light emitting, inorganic electroluminescent material and an overlying layer of an organic photoluminescent material or a hybrid organic-inorganic semiconductor light emitting diode consisting of, in sequence, a substrate, an n-doped semiconductor layer, a light emission region where electrons and holes recombine to produce light, and a p-doped semiconductor layer and further including a layer of an organic photoluminescent material. [Bojarczuk, Jr.; Nestor A.; Guha; Supratik; Haight; Richard Alan; issued Apr. 27, 1999; filed 5 Mar. 1997; a continuation-in-part of application Ser. No. 08/788,509, filed Jan. 24, 1997.] This invention is limited to a "layer of an organic photoluminescent material."

Guha et. al. disclosed a hybrid organic-inorganic semiconductor-based light-emitting diode [received 7 Mar. 1997, accepted 11 Jul. 1997, published 15 Oct. 1997; Journal of Applied Physics, Volume 82, Issue 8, pp 4126-4128] whereby a GaN-based light emitting diode emits shorter wavelength light and an organic thin-film part that absorbs the electro-luminescence (the primary radiation) and fluoresces at a longer wavelength resulting in color conversion. (See also "Efficient white and red light emission from GaN/tris-(8-hydroxyquinolato) aluminum/platinum(II) meso-tetrakis(pentafluorophenyl) porphyrin hybrid light-emitting diodes", Hai-Feng Xiang, Sze-Chit Yu, Chi-Ming Che, and P. T. Lai, Applied Physics Letters Vol 83(8) pp. 1518-1520. Aug. 25, 2003.)

Not withstanding the progress made in using organic fluorescers or ceramic phosphors as down-conversion luminescent elements, the current state of the art finds it difficult to generate achromatic light or chromatic light using down-conversion with reasonable operational lifetimes.

Though organic fluorescers with extremely high quantum yields of fluorescence, which by definition necessitate short excited state lifetimes and are unlikely to be quenched or degraded by oxygen or other reactants, nevertheless degrade over an extended period of operation which solid-state LEDs find themselves. Hence, ceramic phosphor materials have been the luminescent element of choice from the perspective of operational durability.

What ceramic phosphors gain—in theory—from the perspective of stability, they lose from the standpoint of performance. Ceramic phosphors in general have two major limitations: they are not soluble in the matrix that envelopes the light emitting diode die and the ability of ceramic phosphors to mimic the photopic light curve has been fraught with challenges. In the case of the former, an extensive non-intuitive discussion is stated within United States Patent Application 20030227249 (Mueller, Gerd O.; et al., publication date Dec. 11, 2003). Organic fluorescers generally do not have these difficulties in solubility nor in finding a broad set of luminophors, either fluorescent and or phosphorescent, to match the spectral distribution of the photopic light curve.

It has been demonstrated by Butterworth, et. al. (WO9902026 in a patent application with the title Fluorescent Dye Added to Epoxy of Light Emitting Diode Lens) that a standard blue GaN light emitting diode with blue light emission at 470 nm efficiently radiatively transfers its energy to Coumarin 6 (for green emission), Fluorol 7 (for yellow green emission) and to Rhodamine 110 (for yellow emission). In contrast, Butterwoth notes that ceramic phosphors are not soluble in the epoxy lens used to focus light emitting diode die and substantial scattering occurs. (See also Doxsee et. al., U.S. Pat. No. 6,791,259, issue date Sep. 14, 2004 where organic luminescent dyes are utilized and titanium dioxide is used as a scattering agent to form a Lambertian surface, even though titanium dioxide is, itself, photo-active and often leads to molecular degradation through electron transfer reactions.)

Scattering by phosphor particles of primary emission from a semiconductor device and of secondary emission from the phosphor particles themselves may be reduced by reducing the size of the phosphor particles to substantially below wavelengths (e.g., peak wavelengths) of the primary and secondary emission. For example, semiconductor nano-crystals or semiconductor quantum dots, which typically have a diameter less than about 10 nm and hence scatter little of the primary and secondary light, may be used as substantially non-scattering phosphors. The use of semiconductor nano-crystals and quantum dots to phosphor convert the output of a light-emitting semiconductor device is disclosed in U.S. patent application Ser. No. 09/167,795 and in U.S. patent application Ser. No. 09/350,956, both of which are incorporated herein by reference in their entirety. These references do not recognize, however, the significant losses due to scattering by large phosphor particles in conventional phosphor converted light-emitting devices and the consequent advantages to be realized by using non-scattering phosphor particles instead. Further, quantum dots are constructed from elements that may be viewed as the solid-state toxicological equivalent of Hg in fluorescent lamps.

Environmental Effects for Instantaneous and Long Term Performance

Prior to this invention, the advantages of effecting solid-state lighting from light emitting diodes in a vacuum was not appreciated and in fact, the art taught away from vacuum LEDs. (1. Stanton, et. al. [1997] in WO9748138; 2. Moyer, et al., U.S. Pat. No. 5,334,855; issued Aug. 2, 1994.). Further, the advantages of placing the luminescent element in a media other than the epoxy polymer or a similar silicon polymer enveloping a light emitting diode has generally not been appreciated. (1. Yosaki, Japanese Patent number: JP5152609; Publication date: 1993 Jun. 18; Application number: JP19910336011 19911125. 2. Butterworth, et al., Issued U.S. Pat. No. 5,847,507, 1998. 3. W. Rossner; United States Patent Application 2003025449, publication date Feb. 6, 2003.) It is also the case that while prior art points to external placement of a luminescent element in a separate isolating container as described by Rossner and by Ibbettson and Tarsa (Ibbetson, et. al., Patent Application WO2004077580; publication date Sep. 10, 2004) the internal placement of a luminescent element in an isolating chamber, separated from the encapsulating matrix and allowing for the creation of a controllable environment therein has not been, prior to this invention, been recognized. (I. Umio, Japanese Patent number: JP62189770; Publication date: Aug. 19, 1987) When the light emitting diode die and its active layer are similarly placed in a controllable environment, such as is only heretofore practicable by this invention, the performance of the underlying semiconductor is also enhanced. [As reported at http://www.chem.wisc.edu/~ellis/Research/res1.html—I. Chemical Sensors Based on Semiconductor Luminescence {Supported by NSF Grants BES-9980758 and CTS-9810176} " . . . band edge photoluminescence (PL) of II-VI semiconductors like CdSe can be modulated by adsorption of molecules from gas and liquid phases. Typically, Lewis bases enhance photoluminescent intensity and Lewis acids quench it . . . "}. Last visited on 9 May 2004.] Ammonia gas is a Lewis base. Lewis bases are electron donors. The interaction of a Lewis with an operating p-n junction is not clear.

Prior to this invention the ability to limit uv radiation in down conversion and where said uv radiation degrades epoxy resin used to pot light emitting diode die has had limited utility. (1. Reeh, et. al.; U.S. Pat. No. 6,576,930; issued on 10 Jun. 2003. 2. W. Rossner; United States Patent Application 2003025449, publication date Feb. 6, 2003.) By using a chamber that is opaque to uv radiation, only secondary radiation leaves the chamber. Glass that does not transmit uv radiation are well known in as photographic UV-1 filters as well as Schott 8688 (tungsten-based) and 8271 (kovar) filters.

Despite the robust characteristics of inorganic materials versus their organic counterparts, even ceramic phosphors are known to degrade due to moisture and other factors due to environmental exposure, although these problems are more likely recognized by applications of ceramic phosphors exposed to the environment. Examples are phosphorescent phosphors, sulfide phosphorescent phosphors, which are very well known and since they have extremely long radiative lifetimes, are prone to quenching. When the quencher photo-reacts, degradation takes place. Examples of sulfide phosphorescent phosphors include CaS:Bi (which emits light of violet blue), CaStS:Bi (which emits light of blue), ZnS:Cu (which emits light of green) and ZnCdS:Cu (which emits light of yellow or orange). However, any of these sulfide phosphorescent phosphors are chemically unstable and shows degraded light resistance, i.e., it suffers from problems that must be solved for practical use.

The most extensively used phosphorescent phosphor among such sulfide phosphorescent phosphors is zinc sulfide phosphorescent phosphor (ZnS:Cu). However, zinc sulfide phosphorescent phosphor is decomposed as the result of irradiation by ultraviolet radiation in the presence of moisture and thus blackens or reduces the luminance thereof. Therefore, it is difficult to use this phosphorescent phosphor in fields where it is placed outdoors and exposed to a direct sunlight, that is, application thereof is limited to luminous clocks/watches or clocks/watches and instrument dials, evacuation guiding signs or indoor night-time display. [Murayama, et al., U.S. Pat. No. 5,424,006, issue date Jun. 13, 1995] Hermetic sealing of these phosphorescent phosphors—prevention of exposure to moisture—is one means of improving long term operational stability.

Alternatively, new compositions have been developed as replacements for these traditional phosphorescent phosphors. For example, SrAl2O4:Eu, a strontium aluminate doped with the rare earth europium, and an aluminum oxide in the spinel structure, has excellent stability against moisture, in comparison with afterglow phosphorescence phosphors of the ZnS class. The general formula of the Spinel Group is AB2O4. The A represents a divalent metal ion such as Magnesium, Iron, Nickel, Manganese and/or Zinc. The B represents trivalent metal ions such as Aluminum, Iron, Chromium and/or Manganese. The gemstone spinel also has the spinel structure and is similar in elemental composition to ruby. Spinel and ruby are chemically similar. Spinel is magnesium aluminum oxide (that is to say, magnesium aluminate) and ruby is aluminum oxide. The red coloring agent in both spinel and ruby is the same element, sometimes referred to as a dopant, chromium.

However, these new spinel phosphors are prepared with expensive ingredients [for example, one adds europium oxide to strontium carbonate and alumina and boric acid is added as flux thereto] and expensive processing conditions [after the resultant mixture was sufficiently mixed using a ball mill, the sample was fired for 1 hour at 1300° C. in a stream of nitrogen-hydrogen mixture gas (97:3) (flow rate: 0.1 liter/min) using an electric furnace.]

Phosphorescent phosphors of a general type may be used in an illumination device utilizing a pulse modulation technique to provide increased light output for a given heat load. For example, the issued patent notes that when power is supplied in pulses to periodically activate a short wavelength (i.e., blue) emitting LED, which in turn stimulates a phosphor-based color conversion system to produce sustained white light. In response to a pulse of power, the LED emits an intense burst of short wavelength light. The burst of light from the LED briefly excites the phosphor system, producing a bright illumination. During the interval while power is dissipated in the LED, the LED warms. After the pulse ends and before the next pulse begins, the LED cools because no more power is dissipated in the LED. However, the phosphorescent behavior of the phosphor system causes it to continue to glow for a period of time after being excited. The intensity of the illumination produced by the phosphor gradually decays during this period. The average illumination produced by the preferred embodiment over the entire period from the beginning of one pulse to the beginning of the next is higher than a conventional LED illumination device using constant power dissipation for a given heat load. (Schmidt; Gregory W.; U.S. Pat. No. 6,028,694; issue date Feb. 22, 2000) This method is proposed as a means of managing the heat load of a solid-state lighting device. While ingenuous in conception, the method may not be practicable in implementation as described to generate a level emission of light.

Whereas the europium doped strontium aluminate is used as a phosphorescent phosphor, a europium doped strontium silicate for white light LED down-conversion has been recently described. (Joung Kyu Park, Kyoung Jae Choi, Chang Hae Kim, Hee Dong Park, and Se Young Choi, "Optical Properties of Eu2+-Activated Sr2SiO4 Phosphor for Light-Emitting Diodes", Electrochemical and Solid-State Letters—2004—Volume 7, Issue 5, pp. H15-H17)

Vacuum Lighting Products

Recently, there are wide-spread developments of vacuum ultraviolet ray-excited, light-emitting diodes having a mechanism in which a fluorescent substance is excited by vacuum ultraviolet ray radiated by rare or Noble gas discharge to emit light, and development of plasma display panels (PDPs) is a typical example thereof. This discharge is effected by electrodes. A PDP enables increase in size of an image plane which is difficult to achieve in cathode-ray tubes (CRT) and color liquid crystal displays, and are expected to be used for flat panel displays in public spaces or as a large screen television. A PDP is a display device obtained by placing a large number of fine discharging spaces (hereinafter, sometimes abbreviated as display cell) into a matrix arrangement. A discharge electrode is provided in each display cell and a fluorescent substance is applied on the inner wall of each display cell. Each display cell is filled with a rare or Noble gas such as He—Xe, Ne—Xe, Ar and the like, and by applying voltage on a discharge electrode, discharge occurs in the rare or Noble gas and vacuum ultraviolet ray are radiated. The fluorescent substance is excited by the vacuum ultraviolet ray and emits visible ray. The term vacuum ultraviolet ray is known to mean a photon in the vacuum uv which is known to represent the wavelengths of 100 nm to 200 nm, whereas UVA is known to represent 315 nm to 400 nm, UVB is known to represent 280 nm to 315 nm, UVC is known to represent 200 to 280 nm. By use of fluorescent substances emitting three primary colors, blue, green and red, full color display can be achieved.

A vacuum ultraviolet ray-excited light-emitting device other than a PDP is a rare gas lamp. A rare gas lamp emits light by a mechanism in which vacuum ultraviolet ray are generated by discharge in a rare gas, and the vacuum ultraviolet ray is converted to visible light. These lamps have electrodes. The luminescent component of a rare gas lamp may be an aluminate phosphor, luminophor and or fluorophor. When the aluminate is a luminous material which has, independent of its incorporation into the rare earth gas lamp, high afterglow brilliance then the rare earth gas lamp has high afterglow. Rare gas lamps are expensive; they operate extremely high ultraviolet energy. A rare gas lamp or a PDP has a cell which is filled with a rare gas such as He—Xe, Ne—Xe, Ar and the like, and by applying voltage on a discharge electrode, discharge occurs in the rare gas and vacuum ultraviolet ray are radiated. The fluorescent substance is excited by the vacuum ultraviolet ray and emits visible ray. It is clear to one of ordinary skill that a key element of these rare gas lamps are that they operate in the vacuum uv, that they have a discharge element and that the discharge element operates in the vacuum uv. It is also possible for a vacuum uv lamp—that is one that generates vacuum uv rays as its primary radiation—to generate a secondary photon in the vacuum uv with the use of vacuum uv phosphors, analogous to a rare-gas lamp. (Keiji, et. al., Japanese Patent Number JP2004115659; issue date Apr. 15, 2004)

As noted above, phosphors may be used in rare gas lamps. Whereas most of the light emission in a mercury vapor lamp is at 254 nm, in contrast, most of the ultraviolet light emitted by xenon occurs at a wavelength of 172 nm (the vacuum uv), corresponding to a higher energy than that associated with mercury. As a result, new phosphors are needed that can efficiently absorb 172 nm ultraviolet light and convert it to red, green and blue wavelengths. It is relatively simple to find materials—based on the lanthanide elements, for example—that efficiently absorb the ultraviolet output of xenon. But the true challenge in working with xenon as a discharge medium is finding phosphors that efficiently convert the ultraviolet output of xenon into visible light. Two general considerations govern phosphor conversion efficiency: quantum efficiency and energy mismatch. Quantum efficiency measures the number of visible photons produced by the phosphor for every ultraviolet photon absorbed. High quantum efficiency means that once a phosphor is excited to its emitting state, it returns to its ground state primarily by emitting light. The efficiency is reduced if, instead, the excited state decays non-radiatively by dissipating heat via phonon emission. Highly efficient phosphors can be designed by varying the luminescent element or ion and the chemical composition of the host lattice. Energy mismatch refers to the difference in energy between the photons that are absorbed and emitted by the phosphors. Since red, green and blue photons are much less energetic than ultraviolet photons, a considerable mismatch of energy is associated with most phosphors. In all phosphor materials known until now, this energy mismatch has led to non-radiative decays of the luminescent element or ion (once the energy had been transferred radiatively from the primary radiation to the luminescent elements). Energy mismatch has therefore been an unavoidable, inefficient use of the electrical excitation energy in fluorescent lighting. The inefficiency due to energy mismatch is much more severe for xenon than mercury because of the much higher ultraviolet output energy of xenon (7.2 eV compared with 4.9 eV).

However a new phosphor for xenon rare-gas lamps has been discovered: the discovery of the phosphor material europium-doped lithium gadolinium fluoride, LiGdF4:Eu3+. This phosphor is capable of producing red light efficiently when excited with vacuum ultraviolet light output from the xenon. Since the energy of 172 nm xenon photons is more than double the energy of red, green or blue photons, it should be possible to obtain two visible photons for every ultraviolet photon absorbed by the phosphor. In other words, it should be possible to recover an extra visible photon from the energy mismatch instead of losing it non-radiatively as had always been observed previously. But the emission of two visible photons by sequential emission from a single luminescent element or ion had never been observed in phosphors of the type used in lighting. The researchers designed a phosphor in which a luminescent element of europium ions interacted with the lithium gadolinium fluoride host lattice. The gadolinium ions in the host lattice apparently absorbs the energy from the high energy ultraviolet light and then transfer it to europium ions to obtain visible light. If the transfer of energy occurred simply between one gadolinium ion and one europium ion, (non-radiative energy transfer) the phosphor would suffer from a significant energy-mismatch problem and would have low efficiency. However, the strategy used in the design of the LiGdF4:Eu3+ phosphor avoids this problem because two different mechanisms for transferring energy from the gadolinium ions to the europium ions are present. The first stage involves the gadolinium ions absorbing the ultraviolet light, resulting in a highly excited state (step 1). The excited gadolinium ion next transfers energy to a europium ion (step 2). This excites the europium ion to a higher state, which subsequently emits a visible photon. During the energy transfer, the gadolinium ion decays from its original excited state to a lower-energy excited state. This excited state is still higher in energy than red, green or blue photons and the gadolinium ion continues to decay through a second energy-transfer process (step 3). This energy-transfer process returns the gadolinium ion to its ground state and excites a second europium ion to a high-energy state that decays non-radiatively to a lower-energy state, which then emits a second visible photon. Quantitative analysis of the results indicated that LiGdF4:Eu3+ has a quantum efficiency of 190%. (R. Wegh et al. 1999 Science 283 663) However, the new phosphor emits primarily red light and equally efficient green and blue phosphors are still needed to make xenon-based fluorescent lighting a reality.

It is then clear to one of ordinary skill that a rare earth lamp or any analogue is not a solid-state lamp and does not enjoy the many benefits of solid-state lamps. A solid-state lamp in general and a semiconductor solid-state lamp more particularly do not have a discharge electrode. Further, a rare gas lamp requires vacuum uv to be generated by the discharge electrode whereas solid-state lighting can operate in the visible and in the ultraviolet including ultraviolet of lower energy (and higher wavelength) than vacuum ultraviolet. The primary emission generated by the rare gas is from the rare gas itself which is initially brought to its excited state, subsequent to which it depopulates the excited states with emission of light in the vacuum uv, by the transfer of the electrical energy generated at the discharge element. (See for example 1. E. Weintraub; Great Britain Patent GB190324502; 2. Atsushi et. al; Japanese Patent number JP2004091538; issue date Mar. 25, 2004; 3. Schoenbach et. al.; Issued United States Patent (US), Publication U.S. Pat. No. 6,703,771; issue date Mar. 9, 2004; 3. A. Kraus; Publication Number WO03075313, Publication date: Sep. 12, 2003; and 4. Arai, et. al.; Japanese Publication JP2002080843; Publication Date Mar. 22, 2002.)

For many years, lighting manufacturers have tried to eliminate electrodes in fluorescent lamp operation because the emission coating on the electrodes at each end of a linear lamp deplete over time, which is a major cause of lamp failure and a barrier to longer lamp life. This has led to an induction lamp design: Inductively coupled electrodeless fluorescent lamps that last as many as 100,000 hour. These new lamp types use high-frequency energy to activate the mercury plasma gas and thus the phosphor coating on the lamp's interior surface. This allows the electrodeless lamp to restart immediately after a momentary loss of power. These lamps maintain operating stability in very cold temperatures, provide constant light output regardless of supply voltage fluctuations, and offer no shift in color over life. Another type of induction lamp currently available for purchase is known as a re-entrant cavity induction lamp, which is available in 55 W, 85 W, and 165 W models that provide 3,500 lumens, 6,000 lumens, and 12,000 lumens, respectively. All models are shaped like an oversized standard incandescent "A" lamp. This lighting system has three separate components: the high-frequency current generator that operates at 2.65 MHz, the power coupler that consists of an induction coil wound on a ferrite core, and the lamp compartment, which consists of the glass bulb equipped with an internal phosphor coating and a base. A short coaxial cable delivers power from the radio frequency generator to the base of the lamp. However, an induction lamp is not a solid-state lamp as any one can plainly see and all of the benefits of a solid-state lamp are not available in an induction lamp.

Prior to this present invention, the structure of solid-state lighting with a p-n junction has had a very limited diversity of functional forms. (Barnett et. al.; Canadian Patent Application CA 2438889 and related U.S. Patent Application 60/270,572, International Publication Number WO2002/069409) The plethora of functional forms with lighting of incandescent and mercury vapor lamps has solved many of the underlying deficiencies associated with the light generation from heating filaments and arc lighting.

What is needed is a semiconductor light-emitting device having improved light extraction, improved phosphor conversion, or both and in a manner that allows for the use of luminophors in general and organic fluorescers more specifically that may otherwise not degrade instantly or over a long period of time under constant excitation in a solid-state light. Prior to the invention presented herein, the structure of solid-state lighting with a p-n junction has had very limited diversity of functional form.

SUMMARY OF THE INVENTION

Figure 1:
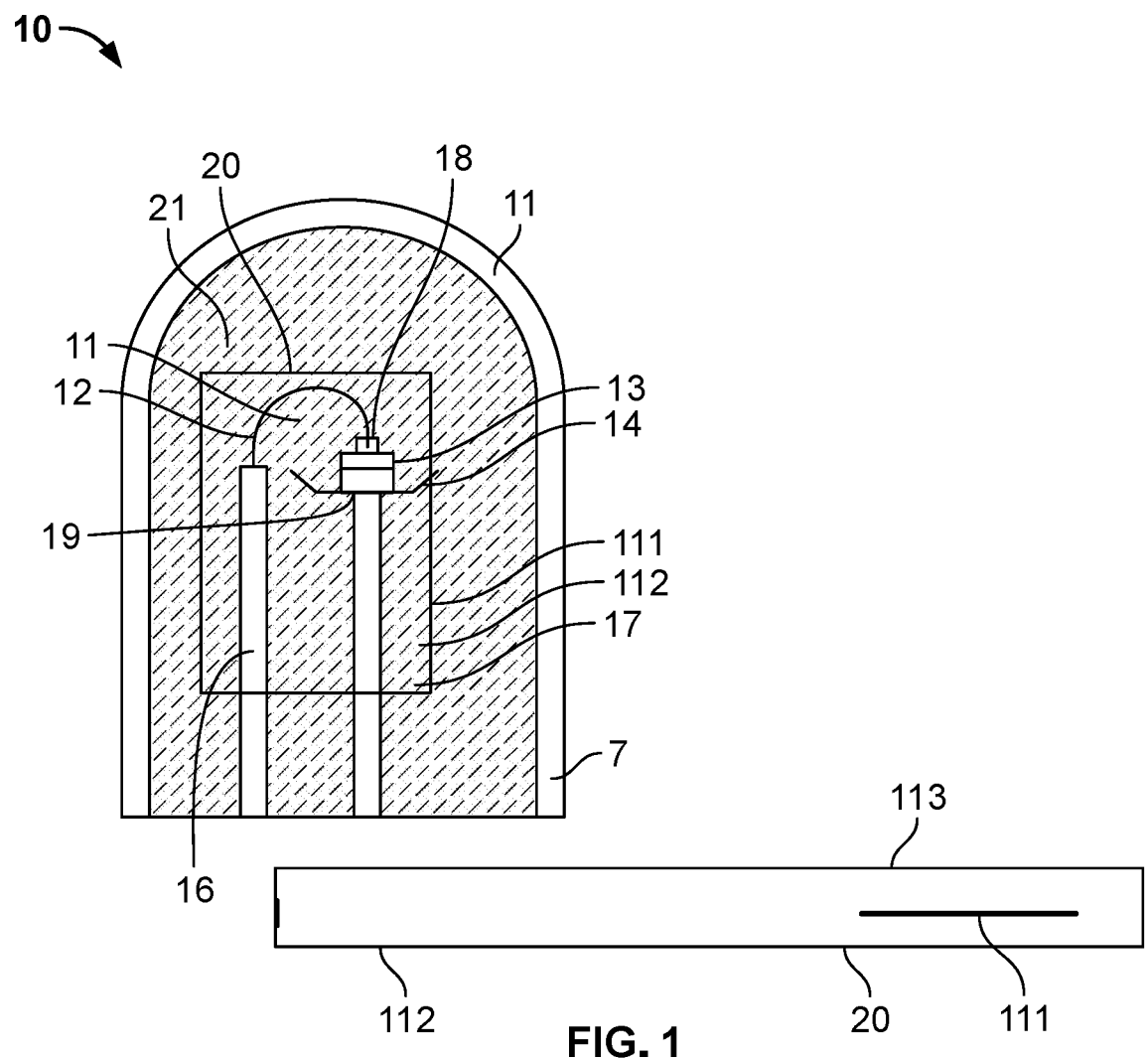
FIG. 1 shows an embodiment of a light emitting diode assembly constructed in accordance with the present disclosure.

The present invention is based on the discovery that a highly efficient achromatic, chromatic and non-visible light emitting device may be simply and economically fabricated utilizing solid state light emitting diode dies that in the absence of certain elements of the following generates primary radiation which transfers its energy, radiatively, to secondary luminescent elements where the diode die and or the secondary luminescent elements are in an enhancing and or protecting enclosure.

The present invention relates broadly to a semiconductor light emitting assembly comprising a solid state device with at least one p-n junction which induces the emission from the solid state device of a first wavelength radiation to chromatic radiation (radiation, light, luminance or illuminance with hue), or achromatic radiation (radiation, light, luminance or illuminance) without hue. The solid state device is structurally associated with a recipient down-converting luminophoric medium, as hereinafter defined, which when either radiatively or otherwise impinged by the first relatively shorter wavelength radiation, or is otherwise non-radiatively excited, through Forster or Dexter energy transfer from the excited states that absent the energy transfer would radiatively emit a first relatively shorter wavelength radiation, or the secondary luminescent elements as hereinafter defined within the luminophoric medium are otherwise non-radiatively excited, through Forster or Dexter energy transfer from the excited states that absent the energy transfer would radiatively emit a relatively shorter wavelength radiation, to responsively emit a secondary radiation, chromatic and achromatic, polarized or unpolarized, in the visible and non-visible light spectrum. The recipient down-converting luminophoric medium is protected by virtue of a segregating envelope from elements that instantaneously decrease performance or over long term reduce effectiveness of the down-converting medium. When the segregating envelope is constructed to also include the active layer of the solid state device, the same envelope introduces and maintains a favorable environment to maintain, sustain, protect or increase performance of the underlying semiconductor with a p-n junction where said performance is the ability to generate light and or to transfer its energy non-radiatively.

In accordance with a specific embodiment of the present invention, an LED operative to emit, for example, monochromatic blue or ultraviolet (UV) radiation is packaged along with fluorescent organic and/or inorganic fluorescers and phosphors—the secondary luminescent elements in the luminophoric medium—in an insulating or isolating chamber (an assembly), such as a sealed glass ampoule, said package molded within and suspended within a matrix otherwise protecting the aforementioned assembly. In the case of radiative energy transfer, the monochromatic blue or UV radiation output of the LED is absorbed and then down converted by the fluorophor or phosphor—the secondary luminescent elements in the luminophoric medium—to yield longer wavelengths to include a broad spectrum of frequencies which appear to an observer as white light. The atmosphere or in the case of a vacuum, the absence of atmosphere, within the insulating or isolating chamber is selected so as to increase the probability that the luminophors (the secondary luminescent elements in the luminophoric medium) required to effect down conversion of light from an LED responsively emit light of secondary radiation.

This use of an insulating or isolating chamber to enhance the secondary radiative probability of the fluorescers and/or phosphors to effect down conversion of light from an LED in a solid state light emitting device using a dye or pigment material (a luminophor that fluoresces or phosphoresces; the secondary luminescent elements in the luminophoric medium) is a significant departure from prior art teaching. In addition to allowing for the generation of achromatic (white) light from a blue or ultraviolet emitting LED die with a typical p-n junction construction without destruction of the luminophors so selected, devices in accordance with the invention can be variously constructed to provide an essentially infinite series of colored (visible) light emissions, of either narrow or broad spectral distribution, from one single p-n junction construction.

As used herein, the term "solid state device," used in reference to the device for generating the primary radiation which subsequently is down-converted to a longer wavelength radiation in such visible achromatic (white) or chromatic (color) light spectrum, means a device which is selected from the group consisting of semiconductor light emitting diodes, semiconductor lasers, thin film electroluminescent cells, electroluminescent display panels, and internal junction organic electroluminescent devices.

As used herein, the term "primary radiation" means the initial photons directly produced by hole-electron recombination at a p-n junction.

The term "secondary radiation" means the photons subsequently generated by virtue of transfer of the energy of the excited state that defines the p-n junction to form some other excited state and the radiation that is released by virtue of relaxation of this other excited state.

As used herein, the term "luminophoric medium" refers to a material which in response to radiation emitted by the solid state device or is otherwise non-radiatively excited, emits light—achromatic light or color light in the visible light spectrum—by fluorescence and/or phosphorescence or emits infra-red light in the non-visible light spectrum. The term "down-converting medium" is synonymous in our usage with "luminophoric medium" as the luminophors of interest and discussion herein are those that have a Stokes shift.

As used herein, the term "secondary luminescent elements" refers to the specific materials that together—whether intimately mixed or not, whether spatially separated or not—comprise the luminophoric medium.

As used herein, the term "chamber" refers to a natural or artificial enclosed space or cavity whose atmosphere can be controlled during assembly or during use. The term "envelope" is used interchangeably with the term "chamber." In certain discussions, the term "secondary enclosure" is used and is by virtue of my assertion tantamount with how the term "chamber" and "envelope" is utilized.

As used herein, the term "atmosphere" refers to a surrounding influence or environment.

As used herein, the term "white light" and "achromatic light" refers to visible radiation possessing no hue. Achromatic light is free of color; achromatic pigment or dye is a color perceived to have no hue, such as neutral grays. White light is light perceived as achromatic, that is, without hue.

As used herein, the term "colored light" and "chromatic light" refers to visible light having hue.

As used herein, the term "hue" refers to visible light with the attribute of colors that permits them to be classed as red, yellow, green, blue, or an intermediate between any contiguous pair of these colors.

As used herein, the term "tint" refers to a variation of a color produced by adding white to it and characterized by a low saturation with relatively high lightness.

As used herein, the term "shade" refers to the degree to which a color is decreasingly illuminated; that is, a gradation of darkness for color light.

Other aspects, features and embodiments of the invention will be more fully apparent from the ensuing description and claims. This application claims priority from Provisional Application Ser. No. 60/569,007 filed 7 May 2004.

DETAILED DESCRIPTION OF THE INVENTION AND PREFERRED EMBODIMENTS THEREOF

The present invention is based on the discovery that a highly efficient light emitting device may be simply and economically fabricated utilizing a solid state light emitting diode die that either generates primary radiation (acting as a radiative donor) or non-radiatively transfers energy (acting as a non-radiative donor) from the excited state—which defines the p-n junction under an applied voltage—and where the diode die (the donor) and or the acceptor of primary radiation and or non-radiative energy transfer is in an enhancing and or protecting enclosure.

Less broadly, the present invention is based on the discovery that a highly efficient achromatic, chromatic and non-visible light emitting device may be simply and economically fabricated utilizing a solid state light emitting diode die (a donor) approximate to a luminophoric medium (an acceptor) that in the absence of certain elements of the following generates primary radiation and where the excited state—which defines the p-n junction under an applied voltage—transfers its energy, radiatively or non-radiatively, to secondary luminescent elements in the luminophoric medium and where the diode die and or the luminophoric medium are in an enhancing and or protecting enclosure.

Less broadly, the present invention is based on the discovery that a highly efficient achromatic, chromatic and non-visible light emitting device may be simply and economically fabricated utilizing a solid state light emitting diode die proximate to a luminophoric medium that in the absence of certain elements of the following generates primary radiation and where the excited state—which defines the p-n junction under an applied voltage—transfers its energy, radiatively or non-radiatively, to secondary luminescent elements in the luminophoric medium and where the diode die and the luminophoric medium are both in the same enhancing and or protecting enclosure.

When the diode die is placed with a protecting and enhancing chamber or envelope, the diode die is separated from the resin that absent this invention completely covers the diode die; further in this embodiment, the protecting and enhancing envelope contains within its internal boundaries material of a gaseous, liquid or solid phase that protects and enhances the generation of primary light or non-radiative energy transfer from the light emitting diode die. When the luminophoric medium is placed with a protecting and enhancing chamber or envelope, the luminophoric medium is separated from the resin that absent this invention completely covers the diode die; further in this embodiment, the protecting and enhancing envelope contains within its internal boundaries material of a gaseous, liquid or solid phase that protects and enhances the generation of secondary radiation from the luminophoric medium itself.

Achromatic light LED solid state devices may be made by the method of the present invention. It is preferred that achromatic light if made is effected is through down-conversion, although there is no requirement that the invention be limited to generating achromatic light nor is the invention limited to achromatic light through down-conversion. If achromatic light is generated utilizing a down conversion process whereby an excited state that either generates a primary photon—or otherwise is capable of generating a primary photon absent energy transfer—generated in the active region of the diode, then said primary radiation is down converted with primary blue emission and/or secondary blue fluorescent or phosphorescent centers, as well as green and red fluorescent or phosphorescent centers where the fluorescent or phosphorescent centers are within a chamber and are protected by a vacuum or a beneficial atmosphere or by some other enhancing effect within or impacting the chamber. These fluorescent and or phosphorescent centers comprise the luminophoric medium. Such an LED device is able to down-convert the relatively monochromatic light, typical of all heretofore monochromatic LED dies and lamps, to a broader emission that appears as achromatic light from red, green, and blue emission centers. Such a device is also able to enhance the efficiency of generation of primary radiation in the absence of luminophors as the beneficial atmosphere augments the generation of primary light by virtue of access of the beneficial atmosphere to the active layer the defines the semiconductor p-n junction. As one skilled in the art will immediately observe, the primary photon generated in the active region of the diode may be a blue photon or an ultraviolet photon, if only one diode die is utilized. There is no requirement that only one diode die be utilized.

Under certain circumstances, it may be desirable for both the light emitting diode die and the luminophoric medium to be enclosed in the same chamber, in separate chambers, or only one of the two in a chamber.

When the luminophoric medium contains luminescent elements that emit red, green and blue light, in the case of a uv LED die, or 1) red, green and blue light; 2) yellow; 3) red, green and yellow, or other suitable combination of primary and complementary colors in the case of a blue LED die, achromatic light is generated.

When two LED die of different wavelengths are used, for example and uv and a blue LED die, then the luminophoric medium can be optimized to generate achromatic light by adjusting in concentration or in space the secondary luminescent elements. It is preferred that the two LED die be of different wavelengths with as large a gap between their respective emission wavelength maximum as possible. When a blue LED die and a cyan LED die are used, then the luminophoric medium will contain secondary luminescent elements that emit in the yellow and in the red. When a uv and green LED die is utilized, then the secondary luminescent elements will be blue and red; when a blue and red LED die are utilized, then the secondary luminescent elements will be green. When a blue LED die and a yellow or amber LED die are utilized, then the secondary luminescent elements need only be adjusted to optimize the color temperature of the achromatic light. The invention is not limited to secondary luminescent elements of multiple molecular compositions (for example, a red emitter, a green emitter and a blue emitter) as single component emitters are known that generate achromatic light when suitably activated. A preferred white-emitting phosphor comprises zinc sulfide activated with copper, manganese, chlorine, and, optionally, one or more metals selected from gold and antimony. A specially preferred phosphor is Mn-doped ZnS nano clusters with no less than 5% and no more than 9% Mn, prepared from a colloidal route and where ultraviolet-visible absorption curves show that on changing the concentration of Mn2+ ions, there is a maximum in the band gap for an optimum doping (5.5% of Mn), and where the fluorescence spectra of the doped clusters consist of two distinct emissions: orange and blue.

It is immediately apparent to a skilled practitioner of the teachings presented herein that achromatic light may be formed by methods other than down-conversion and this invention is not limited to the implementation of down-conversion for the generation of achromatic light.

When two light emitting diode dies are utilized at least one must be internal to the chamber and where the secondary luminescent elements are, if utilized, internal of external to the chamber, are dependent of optimization of the output and durability of the lamp so constructed. When at least one chamber contains only luminescent elements and not a semiconductor die, that chamber just described is replaceable and interchangeable at will.

When both the diode die and dice are in a chamber and the secondary luminescent elements are in a chamber, they need not be in the same chamber for radiative energy transfer to take place; they only need to be in a geometric relationship such that the latter receives the primary radiation emanating from the diode die or dies.

A significant advantage of organic luminescent materials is their relatively broad emission bandwidth that offers the maximal overlap of photon wavelengths to most readily generate an achromatic illumination. Prior to this invention, when multiple luminophors were in use (red, green and blue luminophors) it had been most desirable to utilize fluorescent materials with extremely short radiative lifetimes, less than 50 nanoseconds, to preclude non-radiative energy transfer (to the lowest energy emitter). However, solid-state lighting requiring an after-glow, illumination provided after the power supply is shut off, is not otherwise available since after-glow devices require luminophors with a lifetime greater than 50 nanoseconds, in fact millisecond lifetimes are more specifically preferred. It is for the most part desirable that fluorescent materials or phosphorescent materials with a radiative lifetime greater than 50 nanoseconds be spatially separated within a chamber and by virtue thereof, these down-conversion luminophors can continue to provide achromatic or chromatic illumination after the power supply is shut off.

It is for the most part desirable that organic fluorescent materials and organic phosphorescent materials are incorporated within a chamber under vacuum or noble gas or other inert media so as to avoid the opportunity for oxidation of the luminophoric medium instantaneous to their excitation or otherwise degrade the luminophoric medium over an extended period of time. It is also desirable for inorganic or ceramic luminophors to be incorporated within a chamber under vacuum or noble gas or other inert gas or inert liquid or inert solid so as to avoid the opportunity for quenching with any quencher—a gas, liquid or solid not inert. It is recognized by one skilled in the art that the mechanism by which gases such as nitrogen, argon, krypton and xenon are utilized in incandescent lamps is different than the mechanism in which it is utilized in this invention and that it has not heretofore been recognized, prior to this invention, that gases have a beneficial effect in the long-term totality of lighting from p-n junctions or in solid-state lighting devices. The primary utility of gas in incandescent lighting is related to regeneration of the filament first; the utility of the gas also relates to convection and conduction of heat and to prevent the vaporization of the underlying filament element and the inert gas preferably contains a regenerative gas which returns material evaporated from the filament back to the filament. The primary utility of gas in the invention being claimed herein is the protection of the secondary luminescent elements within the luminophoric medium from the deleterious effects of oxygen and other quenchers. The utility of this invention is apparent when it is recognized that when gas is utilized in mercury vapor lamps, as opposed to incandescent lamps and or solid-state lamps with a p-n junction, the primary purpose for doing so is for conductive and or convective heat flow to activate the phosphors which perform better at a higher temperature: Johnson (1984) claims embodiments in which the phosphor employed exhibits a higher efficiency at elevated temperatures and the chamber space preferably includes inert gas such as nitrogen or argon so that some convective and/or conductive heat flow may be provided to the phosphor to permit arc tube to provide the desired operating temperature for the phosphor.

Notwithstanding the primary benefit of the invention being claimed herein, it has heretofore not been recognized that the p-n junction—in a LED lamp—itself will benefit from operating in an environment such as claimed herein. The prior art shows no examples of LED die lamps, or solid-state lamps with a p-n junction, whereby the p-n junction used for general illumination lighting is purposely sequestered within a chamber and that the chamber contains gas to enhance the performance of primary radiation from the p-n junction itself. It is also desirable for the diode die to be incorporated within a chamber or otherwise exposed to a noble or inert gas (or inert liquid or inert solid) whereby the index of refraction of the inert media are more closely aligned with the index of refraction of the light emitting diode die. A skilled practitioner of the art of enhancing light emission in incandescence will note that the benefit of filament exposure to gas has not been correlated with the index of refraction of the gas itself although, in incandescent lamps, the index of refraction of solids and the beneficial design thereof, has been noted. (Warren, et. al., 1976, Westinghouse Electric Company; Tschetter et. al., 1985, General Electric Company)

Notwithstanding the invention itself, others have noted that the operational performance of LED diode die may benefit from dissipation of charge or dissipation of heat and the mechanism by which this has been achieved is through the use of a ceramic heat sink. (Lamina on Metal Ceramic Solutions, "Thermal performance is the key to achieving high luminous densities, high reliability and long life. Lamina's LTCC-M (low temperature co-fired ceramic) packaging allows LED devices (die) to be mounted directly to an engineered metal core without submounts. This creates the optimum thermal path to conduct heat away from the LED device. The result is that multiple devices can be located in close proximity while maintaining target LED junction temperatures.", White LED Light Engine Product Specification Sheet, Lamina Ceramics, Inc., 120 Hancock Lane, Westampton, N.J. 08060.) However, the use of a gas to optimally manage heat, even if said role for the gas is a secondary benefit, in a solid-state lamp with a p-n junction has not heretofore been taught. Further, in the specific case where the ceramic submount of Lamina are preferred, the method of this invention allows for said submounts to be sequestered within the protecting and enhancing chamber.

In the special case where both the diode die and the secondary luminescent element are sequestered within the same chamber, it is for the most part desirable that the chamber that sequesters within it the p-n junction also contain an inert gas or inert liquid or inert solid with excellent heat conduction if the p-n junction is more sensitive to heat than the luminophors so as to remove heat from the p-n junction itself. It is preferential that nitrogen or argon be used as krypton conducts heat less than argon does, and xenon conducts heat less than even krypton does. Note that this preferred embodiment is the opposite of that which is required with incandescence of tungsten filament in a sealed light bulb. It is generally the case that when inorganic luminophors are utilized, the heat insensitivity of these inorganic luminophors are such that it is preferred to dissipate the heat away from the p-n junction. In the special case where the light output of the inorganic luminophor requires a high temperature, then it is specially preferred to use nitrogen or argon or other gas with excellent heat conductivity.

It is for the most part desirable that the chamber that sequesters within it the p-n junction also contain an inert gas or inert liquid or inert solid with poor heat conduction if the p-n junction is less sensitive to heat than the luminophors so as to preclude heating the luminophors themselves. It is preferential that xenon be used as krypton conducts heat less than argon does, and xenon conducts heat less than even krypton does. It is generally the case that when organic luminophors are utilized, the high heat sensitivity of these organic luminophors is such that it is preferred to not dissipate the heat away from the p-n junction.

Environmental effects, such as available with this invention, on luminescence efficiency—even when quenching or its absence is not a factor—is well known. Effects such as spin-orbit coupling—which enhance moving between states of different multiplicities and therefore enhance the efficiency of luminescence when multiplicity changes (i.e.; phosphorescence)—can be effected by the environment that the excited state species finds itself in. Sequestering the luminophoric medium that contains a phosphorescent luminescent element within a chamber as described herein allows for enhancement of the underlying luminescence efficiency by introducing a molecule within the chamber that interacts with the luminophors therein and which the molecule has a heavy atom effect. The heavy atom effect is well known and is the enhancement of the rate of a spin-forbidden process by the presence of an atom (for example bromine) of high atomic number, which is either part of, or external to, the excited molecular entity. Mechanistically, it responds to a spin-orbit coupling enhancement produced by a heavy atom. (IUPAC Compendium of Chemical Terminology 2nd Edition (1997), 1996, 68, 2245)

Chromatic light LED solid state devices may be made by the method of the present invention. While not necessary to produce chromatic light, it is apparent that the devices of this invention may produce chromatic light, utilizing a down conversion process whereby an excited state that either generates a primary photon or otherwise is capable of generating a primary photon absent non-radiative energy transfer generated in the active region of the diode is down converted with primary blue or primary uv or primary blue and uv emission and/or secondary blue fluorescent or phosphorescent centers, as well as green or red fluorescent or phosphorescent centers where the fluorescent or phosphorescent centers are within a chamber and are protected by a vacuum or a beneficial atmosphere or by some other enhancing effect within or impacting the chamber. Such an LED device is able to down-convert the relatively monochromatic light; typical of all heretofore colored LED dies and lamps, to a broader emission that provides chromatic light from red, green, and blue emission centers. The secondary luminescent elements may be selected and varied as desired, with control of concentrations and spatial arrangements of each selected secondary luminescent element such that the light generated by the luminophoric medium provides color of any hue and apparent tint. Chromatic light with a strong tint is in fact pale color light, preferred for general illumination. Chromatic light with a strong shade is not useful for general illumination but is beneficial for clandestine applications of lighting and signaling. Such a device for chromatic light emission, based on down-conversion, requires a LED solid state device to generate primary light that is either blue or ultraviolet in emission, or is capable of generating primary light that is either blue or ultraviolet in emission absent non-radiative energy transfer, such as is available using blue or ultraviolet LED dies and lamps. It is an important element of this consideration that either inorganic or organic fluorescent or phosphorescent materials can be utilized to down-convert the primary ultraviolet or blue light emission to a mixture of blue, green and red luminescent emissions. A significant advantage of organic luminescent materials is their relatively broad emission bandwidth which offers the maximal overlap of photon wavelengths to most readily generate a chromatic illumination. Further, it is most desirable to utilize organic fluorescent material with extremely short radiative lifetimes, less than 50 nanoseconds, to preclude non-radiative energy transfer (to the lowest energy emitter) since an after-glow is not desired in this particular embodiment. It is for the most part desirable that organic fluorescent materials and organic phosphorescent materials are incorporated within a chamber under vacuum or noble gas or other inert media so as to avoid the opportunity for oxidation of the luminophoric medium instantaneous to their excitation or over an extended period of time.

A significant part of certain inorganic phosphors is that they can absorb more than one photon prior to radiatively relax to their ground state. This is preferred in the case of solid-state lighting of the design described herein for this invention and where it is observed a saturation of the primary photon absorption. In this particular case, it is preferred to maximally down-convert the primary photons, even thought the observed saturation occurs with most ceramic phosphors utilized heretofore. It is especially preferred then to use a ceramic phosphor that can absorb more than one photon and it is especially preferred that this occur with luminophors of extremely long lifetime. An excellent ceramic phosphor with extremely long lifetime is $SrAl_2O_4$ phosphors doped with Eu and Dy. In a preferred embodiment, the phosphor so identified in the immediately preceding sentence is coated on the interior walls of the chamber, using dispersion in a binder, and after the film is dried, the layer of selected phosphor is capable of absorbing multiple photons while immobilized within the desired chamber. The phosphors may also be coated on the sapphire substrate in which a GaN on sapphire LED is constructed. The phosphors may also be added to a previously evacuated chamber within in which a LED die has already been assembled and where dispersion of the material is enhanced by the vacuum itself.

As discussed above, there have been disclosures regarding the generation of white light in solid state semiconductor devices with p-n junctions using radiative energy transfer and these examples use primarily inorganic dopants near the active layers of the p-n junctions or organic fluorescers within the epoxy matrix encapsulating the semiconductor, but none are known that apply the principles of the present invention to semiconductor based p-n junction LED lamps. It has not been heretofore recognized than organic luminophors can acts as dopants and non-radiative energy transfer will populate the excited states of these luminophors when so arranged to generate secondary radiation. Absent the invention described herein, the utilization of an isolating and protecting chamber, said non-radiative energy transfer is not effective. As an example, benzophenone is frequently used as a triplet sensitizer using the mechanism of Dexter energy transfer previously described. Benzophenone when excited enters a singlet excited state and then rather rapidly crosses over into its triplet excited state through a process known to those skilled in the art as intersystem crossing. Once benzophenone triplet is formed—an excited state species that is easily quenched by the ground state of oxygen, itself a triplet, rendering the process sough after basically useless— it can transfer its energy non-radiatively to the ground state (typically a singlet) of a luminophor such as bis(phenylethynyl)anthracene to form the excited triplet state of bis(phenylethynyl)anthracene which is then able to phosphoresce. There is no other means of practically garnering the excited triplet state of bis(phenylethynyl)anthracene other than through non-radiative energy transfer since radiative energy transfer only populates the singlet excited state and the efficiency of intersystem crossing from the singlet excited state to the triplet excited state in bis(phenylethynyl)anthracene is essentially zero. However, as mentioned, triplet benzophenone is easily quenched by oxygen and triplet benzophenone is excellent at destroying through hydrogen abstraction the epoxy resin used normally in potting a LED lamp. Therefore, the invention herein described which includes among its elements a protecting and enhancing chamber, allows for immobilization of benzophenone within the isolating and protecting chamber, isolation and protection of benzophenone triplets so formed from quenching by either oxygen or hydrocarbons such as epoxy resin, and non-radiative energy transfer from the protected benzophenone triplet to a luminophor with the emission requirements required to form chromatic, achromatic or non-visible light emission.

Referring now to the drawings, FIG. 1 shows an achromatic or chromatic or infra-red light emitting diode assembly 10 constructed in accordance with the invention. This assembly comprises an enclosing wall 7 defining a light-transmissive enclosure 11 having an interior volume there within. The enclosure 11 may be formed of any suitable material having a light-transmissive character, such as a clear or translucent polymer, or a glass material. A second light-transmissive enclosure 111—which is the chamber or envelope of this invention—houses in its interior volume a light emitting diode (LED) die 13 positioned on support 14. First and second electrical conductors 16 and 17 are connected to the emitting and the rear faces 18 and 19 of LED die 13, respectively, and with the emitting face 18 of the LED die coupled to the first electrical conductor 16 by lead 12. The second enclosure 111 contains at least one light emitting diode die and reflective supports and is filled with a suitable down-converting material 20, e.g., a down-converting medium or luminophoric medium comprising fluorescent and or phosphorescent elements (component(s), or mixtures thereof)—for example a luminophoric medium coated on the interior wall 112 of the secondary enclosure 111, which functions to down convert the light output from face 18 of LED 13 or reflecting off of surface 12 on which LED 13 rests to achromatic or chromatic or infra-red light. The down-converting medium need not be coated on the interior wall 112 of the secondary enclosure 111 but need only be within the outer wall of the secondary enclosure 111. The down-converting medium may be dispersed inside the second enclosure and not be attached, physically nor chemically to the interior wall. The second light-transmissive enclosure 111 is under vacuum or is filled with a medium that enhances, instantaneously or over the long term, primary radiation generated by the light emitting diode (LED) die 13 and or enhances, instantaneously or over the long term, the quantity and quality of secondary radiation generated by the luminophoric medium, and or enhances, instantaneously or over the long term the radiative or non-radiative energy transfer from the excited state in the active layer of the LED die 13 to the luminophoric medium. The active layer of the light emitting diode die is permanently within the space formed by the secondary enclosure and the reflecting posts onto which the light emitting diode die rests is also contained in the interior volume of the secondary enclosure. Note that luminophor may be coated on the external wall 113 of the secondary enclosure 111; in that case, however, the luminophor does not enjoy any additional benefit from the protecting and enhancing material enclosed within the secondary enclosure and is, in fact, in intimate contact with resin media 21. The material sequestered within the second enclosure 111 protects and enhances the emission of primary light as well as secondary light in contrast to gas sequestered within incandescent lamps which primarily regenerate the incandescent filament.

In one embodiment, the second enclosure 111 is filled with a gaseous medium that is inert such as argon gas and otherwise limits the oxidation or other means of bimolecular and unimolecular degradation of the luminophoric medium which contains fluorescent centers. Solely for the purpose of manufacturing, a dense inert gas such as argon is preferred so that when sealing the second enclosure, air is preferentially kept out of the enclosure and argon is preferably kept inside of the enclosure. However, techniques for sealing chambers of the type presented herein, with inert gases and electrical leads permeating through an enclosure, such as a glass enclosure is well known and practiced.

In one embodiment, the second enclosure 111 is filled with a gaseous medium that is inert such as argon gas and otherwise prevents the quenching of the excited state of a phosphorescent component of the luminescent medium that provides secondary radiation after excitation by either primary radiation or non-radiative energy transfer.

In another embodiment, the second enclosure 111 is filled with a gaseous, liquid or solid medium and whereby the medium, whether completely inert or not, is selected solely for the basis of its index of refraction so that the selected medium has an index of refraction that maximizes the projection of primary radiation and or secondary radiation. Without any intention of limited the full range of materials that can be utilized to practice my invention, we claim the use of the following environment as operable environments when consideration of index of refraction is the most important consideration: in the series of vacuum, helium, argon, krypton, xenon, benzene, epoxy, carbon disulfide, sapphire, flint glass with 81% lead, cubic zirconia, GaN, and crystal iodine the index of refraction changes from 1.00, 1.00, 1.00, 1.29 (liquid), 1.38 (liquid), 1.501, 1.545, 1.63, 1.76, 1.805, 2.173, 2.45, and 3.340. The index of refraction roughly correlates with the density of the material; for organic molecules, the greater the high halogen content, the greater the density and the greater the index of refraction. Hence, methylene iodide has roughly the same index of refraction as sapphire (1.74 for the former vs. 1.77 for the latter), whereas iodobenzene and iodonapthalene have refractive indices of 1.62 and 1.704, respectively. Solid medium of utility are zinc oxide (index of refraction of 2.02) antimony oxide (index of refraction of 2.09 to 2.29) zinc sulfide (index of refraction of 2.37), zirconium oxide (index of refraction of 2.40), rutile titanium oxide (index of refraction of 2.70). Many materials that are capable of having high index of refraction have heavy atoms that also enhance spin-orbit coupling. Many organic polymers that are opaque to x-rays and do not degrade as a result of x-ray irradiation have heavy elements and as a result are inert solids in the context of this invention; moreover these inert solids with heavy elements have a high index of refraction.

In another embodiment, the second enclosure 111 is filled with a gaseous, liquid or solid medium and whereby the medium, whether completely inert or not, is selected solely for the basis of its dispersion so that the selected medium has a low degree of dispersion of blue, green and red photons so that the achromatic light so formed does not appear to be subsequently dispersed back into their relative components.

In one embodiment, the secondary enclosure is filled with a liquid solvent that solubilizes the down-converting medium. In another embodiment, the secondary enclosure is filled with a polymeric resin other than an epoxy resin that normally pots a light emitting diode die and within which the down-converting medium is dispersed, solubilized or otherwise suspended.

In one embodiment, the second enclosure is filled with a solid inactive matrix, such as a zeolite or a cyclodextrin that sequesters individual molecules of fluorescent components and otherwise limits bimolecular degradation of the fluorescent components. The secondary luminescent element is physically or chemically adsorbed to the zeolite cavity or is otherwise sequestered with a cyclodextrin cavity adopting the methodology of sequestering organic dyes in nanoporous zeolite crystals. (Irene L. Li, Z. K. Tang, X. D. Xiao, C. L. Yang, and W. K. Ge, Applied Physics Letters Vol 83(12) pp. 2438-2440. Sep. 22, 2003) Organic:ceramic hybrids may be used within the enclosure. In one embodiment, the organic luminophor such as a Lumogen derived diimide organic fluorescer is physically immobilized or covalently attached to a otherwise non-luminescent garnet aluminate structure such as an undoped yttrium aluminum garnet or to a doped yttrium aluminum garnet. In another embodiment, the organic fluorescer is immobilized within a xerogel with pores of less than 100 Angstroms. (Design of hybrid organic-inorganic materials synthesized via sol-gel chemistry by C. Sanchez and F. Ribot, New J. Chem., 18, 1007-1047 (1994); Hybrid organic-inorganic materials: The sol-gel approach by J. D. Mackenzie, in Hybrid Organic-Inorganic Composites, pp. 226-236 (1995)) In another embodiment, the dye Rhodamine is immobilized within a silica-zirconia material. In another embodiment, the selected organic luminescent dyes—Crystal Violet (CV) and Malachite Green (MG)—are incorporated and immobilized into a polyphosphate gel. (1. DEL NERO, Jordan, GALEMBECK, André, SILVA, Sidicleia Bezerra Costa et al. Dye incorporation in polyphosphate gels: synthesis and theoretical calculations. Mat. Res., April/June 2003, vol. 6, no. 3, p. 335-340. ISSN 1516-1439. 2. Electronic Document Format (ISO). DEL NERO, Jordan, GALEMBECK, André, SILVA, Sidicleia Bezerra Costa et al. Dye incorporation in polyphosphate gels: synthesis and theoretical calculations. Mat. Res. [online]. April/June 2003, vol. 6, no. 3 [cited 16 Oct. 2004], p. 335-340. Available from World Wide Web: <http://www.scielo.br/scielo.php?script=sci_arttext&pid=S1516-14392003000300006&lng=en&nrm=iso>. ISSN 1516-1439.) In another embodiment, organic fluorescent dye in the higher index of refraction material zirconia may be used. (E. Giorgetti, G. Margheri, S. Sottini, M. Casalboni, R. Senesi, M. Scarselli and R. Pizzoferrato, "Dye-doped Zirconia-based Ormosil planar waveguides: optical properties and surface morphology", J. Non-Cryst. Solids, 255, 193 (1999). See also D. B. Mitzi, K. Chondroudis, and C. R. Kagan, "Organic-inorganic electronics", IBM Journal of Research and Development, Volume 45, Number 1, 2001.)

In one embodiment, the secondary enclosure is glass ampoule produced on a standard ampoule filling and sealing machine.

In one embodiment, LED 13 comprises a leaded, gallium nitride based LED which exhibits blue light emission with an emission maximum at approximately 450 nm with a FWHM of approximately 65 nm. Such a device is available commercially from Toyoda Gosei Co. Ltd. (Nishikasugai, Japan; see U.S. Pat. No. 5,369,289) or as Nichia Product No. NLPB520, NLPB300, etc. from Nichia Chemical Industries, Ltd. (Shin-Nihonkaikan Bldg. Mar. 7, 2018, Tokyo, 0108 Japan; see Japanese Patent Application 4-321,280).

In one embodiment, the down-converting material on the interior of the second enclosure 111 comprises three luminophors, mixed together to form a uniform mixture: a blue fluorescer (Lumogen® F Violet 570-substituted napthalenetetracarboxylic diimide), a green-yellow fluorescer (Lumogen® F Yellow 083-substituted perylenetetracarboxylic diimide) and a red fluorescer (Lumogen® F Red 300-substituted perylenetetracarboxylic diimide). A composition comprising such blue, green-yellow, and red fluorescent materials, all organic based, as incorporated in chamber 111, is available commercially from BASF Pigment Division.

In one embodiment, the down-converting material is spatially separated on the interior of the second enclosure 111 and the separate three luminophors are: a blue fluorescer (Lumogen® F Violet 570-substituted napthalenetetracarboxylic diimide), a green-yellow fluorescer (Lumogen® F Yellow 083-substituted perylenetetracarboxylic diimide) and a red fluorescer (Lumogen® F Red 300-substituted perylenetetracarboxylic diimide). A composition comprising such blue, green-yellow, and red fluorescent materials, all organic based, as incorporated in chamber 111, is available commercially from BASF Pigment Division.

In one embodiment, the spatially separated materials are printed onto the interior wall using an ink-jet printer; the three luminophors are: a blue fluorescer (Lumogen® F Violet 570-substituted napthalenetetracarboxylic diimide), a green-yellow fluorescer (Lumogen® F Yellow 083-substituted perylenetetracarboxylic diimide) and a red fluorescer (Lumogen® F Red 300-substituted perylenetetracarboxylic diimide). A composition comprising such blue, green-yellow, and red fluorescent materials, all organic based, as incorporated in chamber 111, is available commercially from BASF Pigment Division.

One or ordinary skill will immediately acknowledge from the teachings presented herein that co-mingling multiple luminophors or physically separating them, preferable by ink-jet printing of solutions of the luminophors and curing thereafter, is not limited to the Lumogen fluorescers presented herein in the preceding paragraphs but can be effected with organic luminophors and inorganic luminophors.

In one embodiment, the down-converting material on the interior of the second enclosure 111 comprises a blue fluorescer (Lumogen® F Violet 570-substituted napthalenetetracarboxylic diimide), a green-yellow fluorescer (Lumogen® F Yellow 083-substituted perylenetetracarboxylic diimide) and a red fluorescer (Lumogen® F Red 300-substituted perylenetetracarboxylic diimide). At the same time, on the exterior wall 113, of the second enclosure 111 is coated an inorganic phosphor such as $Ce^{3+}$ doped yttrium aluminum garnet. A composition comprising such blue, green-yellow, and red fluorescent materials, all organic based, incorporated within chamber 111, is adjusted by virtue of adjusting the concentration of materials, to match the CIE coordinates of the inorganic $Ce^{3+}$ doped yttrium aluminum garnet film on the outer wall of the second enclosure 111. In this manner, the operational performance of the solid-state device is prolonged by virtue of two identical luminescent elements of differing operations but identical photopic response.

In one embodiment, the ceramic phosphor written as $Re_3(Al_{1-s}Ga_s)_5O_{12}:Ce:xMAl_2O_4$ wherein Re is a rare earth selected from the group consisting of yttrium, gadolinium, and ytterbium; s is equal to or greater than 0 and less than or equal to 1; x is 0.01 to about 1.0%; and M is an alkali or alkaline earth metal is suspended as an emulsion with a polymerizable binder such as polyvinyl alcohol or more preferred polyvinylpyrrolidone-polyvinyl alcohol. A fixed amount of the phosphor-binder material is applied to the inner wall of the chamber and the binder is then polymerized to form a robust phosphor thin film directly on the inner wall. Polymerization can be carried out using photo-initiation or thermally induced polymerization subsequent to which the chamber is used to assemble the LED lamp. Thus the present invention includes using two-phase phosphors; a method of applying these two-phase phosphors to the chamber that coats the inner surface of the chamber and which said chamber is ultimately containing a vacuum or a gas selected from ammonia or other Lewis base, nitrogen, argon, xenon, and or krypton to make a LED lamp to produce achromatic light.

In one embodiment, the ceramic phosphor written as $Re_3(Al_{1-s}Ga_s)_5O_{12}:Ce:xMAl_2O_4$ wherein Re is a rare earth selected from the group consisting of yttrium, gadolinium, and ytterbium and where the composition and structure of the ceramic phosphor is determined by magic angle spinning NMR as opposed to electron dispersive X-Ray (EDX) analysis which, when carried out, yields at best an elemental composition but not the actual chemical structure of the luminescent materials; s is equal to or greater than 0 and less than or equal to 1; x is 0.01 to about 1.0%; and M is an alkali or alkaline earth metal is suspended as an emulsion with a polymer binder such as polyvinyl alcohol or more preferred polyvinylpyrrolidone-polyvinyl acetate and applied to the inner wall of the chamber as already described. A suspension of titanium dioxide is applied to the outer wall of the chamber and similarly polymerized to form a robust scattering layer; subsequent to which the chamber is used to assemble the LED lamp. Thus the present invention includes using two-phase phosphors; a method of applying these two-phase phosphors to the chamber that coats the inner surface of the chamber and which said chamber is ultimately containing a vacuum or a gas selected from ammonia or other Lewis base, nitrogen, argon, xenon, and or krypton to make a LED lamp, with scattering particles therein to produce achromatic light emanating from a Lambertian surface.

In one embodiment, a protective layer comprising $Al_2O_3$, $Y_2O_3$ or a rare-earth oxide should be applied between the inner side of the chamber and the phosphor layer.

In one embodiment, the down-converting material on the interior of the second enclosure 111 comprises a blue fluorescer (Lumogen® F Violet 570-substituted napthalenetetracarboxylic diimide), a green-yellow fluorescer (Lumogen® F Yellow 083-substituted perylenetetracarboxylic diimide) and a red fluorescer (Lumogen® F Red 300-substituted perylenetetracarboxylic diimide). At the same time, on the exterior wall 113, of the second enclosure 111 is coated an inorganic phosphorescent phosphor such as the spinel europium doped strontium aluminate $SrAl_2O_4:Eu$. A composition comprising such blue, green-yellow, and red fluorescent materials, all organic based, incorporated within chamber 111, is adjusted by virtue of adjusting the concentration of materials, to match the CIE coordinates of the inorganic europium doped strontium aluminate film on the outer wall of the second enclosure 111. In this manner, the operational performance of the solid-state device is prolonged by virtue of two identical luminescent elements of differing operations but identical photopic response. Further, with removal of electrical current the excited states of spinel europium doped strontium aluminate $SrAl_2O_4:Eu$ continues to provide chromatic illumination.

In one embodiment, the down-converting material on the interior of the second enclosure 111 comprises a ceramic phosphor such as $Ce^{3+}$ doped yttrium aluminum garnet film on the inner wall of the second enclosure 111. At the same time, on the exterior wall 113, of the second enclosure 111 is coated an inorganic phosphorescent phosphor such as the spinel europium doped strontium aluminate $SrAl_2O_4:Eu$. In this manner, the operational performance of the solid-state device is prolonged by virtue of two identical luminescent elements of differing operations. Further, with removal of electrical current the excited states of spinel europium doped strontium aluminate $SrAl_2O_4:Eu$ continues to provide green or yellow-green chromatic illumination.

In one embodiment, the down-converting material on the interior of the second enclosure 111 comprises a ceramic phosphor such as $Ce^{3+}$ doped yttrium aluminum garnet film on the inner wall of the second enclosure 111. At the same time, on the exterior wall 113, of the second enclosure 111 is coated an inorganic phosphorescent phosphor such as the strontium sulfide (SrS) activated with divalent europium or SrS:Eu doped with any trivalent rare earth ions, such as holmium (Ho), erbium (Er), neodymium (Nd) and the like. In this manner, the operational performance of the solid-state device is prolonged by virtue of two identical luminescent elements of differing operations. Further, with removal of electrical current the excited states of strontium sulfide continues to provide red chromatic illumination.

Both gallium nitride and silicon carbide LEDs are suitable for generating light at appropriate wavelengths and of sufficiently high energy and spectral overlap with absorption curves of the down-converting medium. In the case where radiative energy transfer is implemented, the LED preferably is selected to emit most efficiently in regions where luminescent dyes may be usefully employed to absorb wavelengths compatible with readily commercially available fluorescers and/or phosphors for down conversion to achromatic or chromatic light. In the case where non-radiative energy transfer between the excited state of the hole-electron recombination and the ground state of the luminophors in the luminophoric medium is implemented, the LED preferably is selected to allow the wavefunctions that define the excited states formed by hole-electron recombination to integrally overlap with the wavefunctions that define the excited states of the fluorescers and or phosphors used in the luminophoric medium. In the case where non-radiative energy transfer between the excited state of at least one luminophor in the luminophoric medium, a luminophor of the first kind, and the ground state of at least one other luminophor in the luminophoric medium, a luminophor of the second kind, is implemented, the luminophor of the first kind preferably is selected to allow the wavefunctions that define the excited state of the luminophor of the first kind to integrally overlap with the wavefunction that defines the excited state of the fluorescers and or phosphors used as the luminophor of the second kind.

The luminophoric medium utilized in the light emitting assembly of the present invention thus comprises a down-converting material which may include suitable luminescent dyes which absorb the radiation emitted by the LED or other solid state device generating the primary radiation, to thereby transfer the radiation energy to the fluorescer(s) and/or phosphor(s) for emission of white light. Alternatively, the luminophoric medium may comprise simply the fluorescer(s) and/or phosphor(s), without any associated mediating material such as intermediate luminescent dyes, if the fluorescer(s) and/or phosphor(s) are directly excitable to emit the desired white light. It is preferential that at least portions of the luminophoric medium be enclosed with second enclosure 111 although certain elements of the luminophoric medium may be external to the second enclosure as long as some of the luminophoric medium is internal to the second enclosure.

Figure 2:
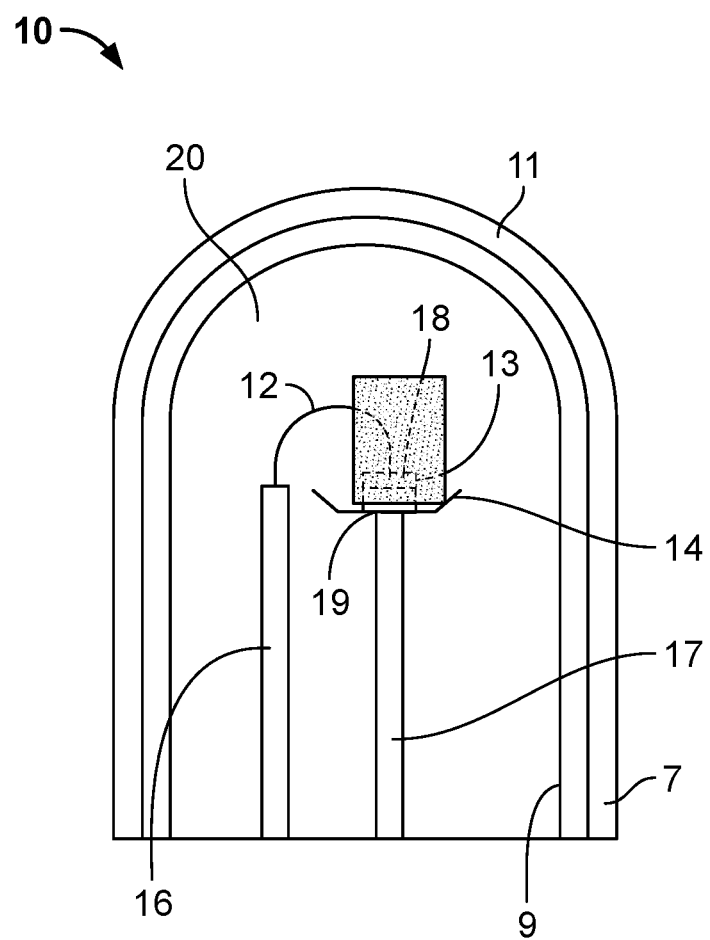
FIG. 2 shows an embodiment of a light emitting diode assembly constructed in accordance with the present disclosure.

The light emitting assembly shown in FIG. 2, has the same general structure as is shown in FIG. 1 (with the same reference numerals of corresponding parts for ease of reference), but in place of the semiconductor support being placed within the second enclosure 111, the semiconductor support—but not the semiconductor itself—is external to the second enclosure 111 and therefore also supports the placement of the secondary enclosure. In this embodiment, illustrated in FIG. 2, the light emitting assembly utilizes a fluorescer within the second enclosure 111 that is responsively and radiatively excited by the primary photons from the semiconductor p-n junction. The fluorescer in such embodiment may be either covalently or non-covalently attached to the inner wall 112 of the second enclosure, or sequestered within the structural form itself that defines the wall of the second enclosure 1111, and/or coated as an interior film of the fluorescer on the interior wall surface of the housing wall 112. Alternatively, the fluorescer may be in solution and sequestered within the sealed inner chamber of the second enclosure 111 or dispersed in a glass or polymeric matrix sealed sequestered within the sealed inner chamber of the second enclosure, and/or in the vapor state and sequestered within the sealed inner chamber of the second enclosure 111. The material sequestered within the second enclosure 111 protects and enhances the emission of primary light as well as secondary light in contrast to gas sequestered within incandescent lamps which primarily regenerate the incandescent filament. The luminophoric medium may also be physically or chemically attached to the substrate of the diode die or to exposed active layer regions of the die itself.

Comparing the structures of the FIGS. 1 and 2 assemblies, it is seen that the semiconductor support in the FIG. 1 embodiment is contiguously arranged about the LED die structure in the interior volume of the housing, while the semiconductor support in the FIG. 2 embodiment is disposed in spaced relationship to the LED die structure. It will be apparent that the specific arrangement of the solid state device such as LED 13, relative to the down-converting medium of the assembly and supports, may be widely varied in the broad practice of the invention, it being necessary only that the solid state device functioning as the source of the primary shorter wavelength radiation be in transmitting relationship to the recipient luminophoric medium, so that the latter functions in use to down-convert the transmitted radiation from the solid state device and responsively thereto emit achromatic light or chromatic light or infra-red light. When the luminophoric medium is distant from the active layer of the p-n junction by more than 50 Angstroms, then only radiative energy transfer is operable and non-radiative energy transfer is not possible. In that the invention described in FIG. 2 is not all that different than the implementation described in FIG. 1, it is clear from the previous teachings that many different luminophors and secondary luminescent elements may be used and that two diode die may be used as well as one. Therefore, for the sake of simplification but not to otherwise limit the scope of this invention, we will limit our discussion of all the embodiments available when FIG. 2 represents the implementation of this invention better than FIG. 1 and refer those of ordinary skill to the teachings already utilized to describe embodiments of this invention represented by FIG. 1.

Figure 3:
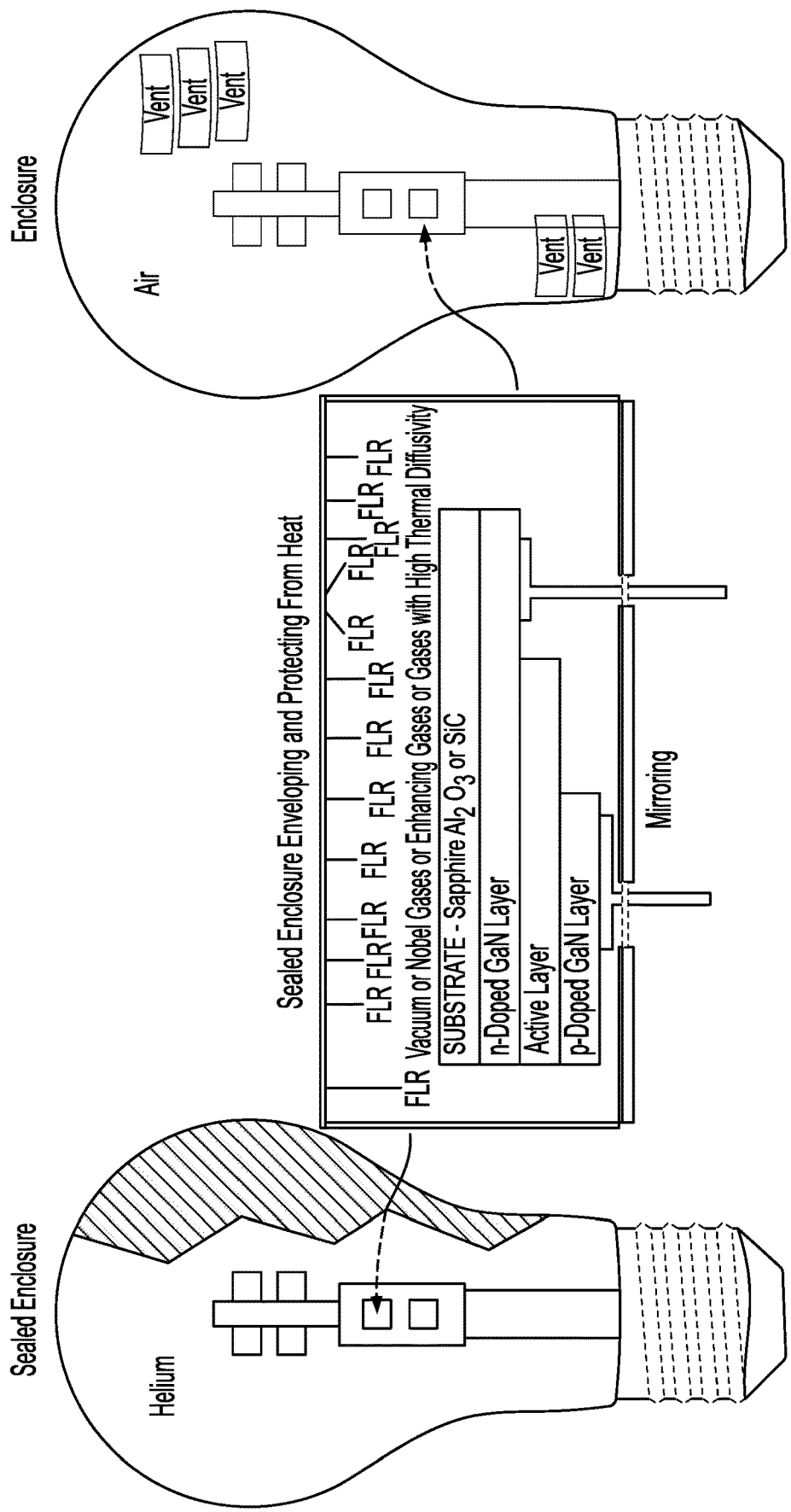
FIG. 3 shows an embodiment of a light emitting diode die within an enclosure and a plurality of embodiments of a lighting element comprising a light emitting diode.

In FIG. 3, the placement of the light emitting diode die within the secondary enclosure 111 is more noticeably described. In this preferred embodiment, the luminescent medium is attached to the inner wall of the secondary enclosure 111 and or to the alumina (sapphire) substrate that defines the diode die. The physical location of dyes or fluorescers specifically formulated into the luminophoric medium internal to the chamber or cavity, which may for example include a ceramic non-luminescent dispersant in which the organic dyes and/or fluorescers are adsorbed and or otherwise dispersible, is not specifically limited, and fitting amount(s) of suitable material(s) for such purpose can be readily determined without undue experimentation, to provide good achromatic, or chromatic light emission (of virtually any tint or hue), as well as a virtually infinite series of chromaticity for all visible hues. In FIG. 3 and in a preferred embodiment, without limiting the scope of this invention, the down-converting medium is covalently attached to the inner wall of the secondary enclosure 111. In the embodiment where the luminophoric medium is covalently attached to the light emitting diode die as opposed to the inner wall of the secondary enclosure and is immobilized as such to be within 50 Angstroms of the active region of said diode die, then non-radiative energy transfer is affected and down-conversion occurs without the requirement of radiative energy transfer. The preferred embodiment of the implementation of this invention as described by FIG. 3 is for a gas to be sequestered within the enclosure and for the gas to protect and enhance the primary radiation emanating from the p-n junction and or the secondary luminescent elements. When achromatic light is the desired output of the device described by FIG. 3, down-conversion is the preferred implementation method for generation of achromatic light with down-conversion described completely in this invention and in others. However, the full scope of this invention is not contingent on down-conversion being the sole method of implementation for achromatic light and the invention is still operable regardless of whether the secondary luminescent elements are present in FIG. 3 and regardless of whether achromatic light is the result there from. It is clear that the device is operable absent the secondary luminescent element and that the device is operable when chromatic light is the desired and resultant output. However, one of ordinary skill will note, from the complete teachings of this invention presented herein that the device described in FIG. 3 may contain two diode die and that the secondary luminescent elements may be activated not by down-conversion but by other processes—thermo-luminescence and electro-luminescence being two particular implementations. When the immobilized and covalently attached secondary luminescent elements are activated by an applied electric field, contacts need to be provided to the secondary luminescent elements although said contacts are not shown in the FIG. 3 for sake of simplicity. Regardless of the mechanism by which a secondary luminescent element is activated, the medium inside the enclosure that provides a protecting and enhancing effect is preferred to be a gas, but need not be matter solely of the gaseous state. If a gas, then it is preferred that the gas protect and enhance by exclusion and reduction of oxidative steps which would otherwise degrade and or quench the secondary light emission? For reasons previously taught, it is preferred that the gas be nitrogen, argon, krypton and or xenon and or mixtures thereof. The protecting and enhancing gas may include other gaseous elements that protect and enhance not only the secondary luminescent elements but the p-n junction and the mechanism by which primary light is generated.

An ultraviolet LED light source suitable for use in the structure of FIG. 1 or FIG. 2 or FIG. 3 may comprise: aluminum gallium indium nitride; aluminum gallium nitride; indium gallium nitride; gallium nitride or any other ultraviolet emitting diode. A blue LED light source may be based on: indium gallium nitride; silicon carbide; zinc selenide; or any other blue light emitting diode source.

TBP, Coumarin-6 and DCM-1, as described by Kido et al. in European Patent EP 647694, are suitable materials for down conversion of the output of gallium nitride or silicon carbide LEDs. Gallium nitride and its alloys can emit in the spectral range covering the blue and ultraviolet extending from wavelengths of 200 nanometers to approximately 650 nanometers. Silicon carbide LEDs emit most efficiently in the blue at wavelengths of around 470 nanometers.

If gallium nitride emitters are employed, preferred substrates for the emitters include silicon carbide, sapphire, gallium nitride and gallium aluminum indium nitride alloys, and gallium nitride-silicon carbide alloys, for achieving a proper lattice match. If gallium nitride emitters are employed, the fluorescent and phosphorescent centers may be covalently linked to the substrate surface. If sapphire is the substrate, non-covalent chemical and physical adsorption of the fluorescent and or phosphorescent centers to the sapphire substrate may be preferentially employed. If desired or if covalent linkage and or chemical and physical adsorption of the fluorescent and or phosphorescent centers to the substrate on which the gallium nitride device is constructed is disadvantageous, then another layer, such as a silicon dioxide layer may be applied to the substrate or to the gallium nitride so as to provide a platform for the covalent, chemical or physical adsorption of the fluorescent and or phosphorescent centers.

With ultraviolet or blue light LEDs, aromatic fluorescers may be employed as down-converting emitters. By way of example, suitable fluorescers could be selected from:

1) blue luminescent compositions—9,10-diphenylanthracene; 1-chloro-9,10-diphenylanthracene; 2-chloro-9,10-diphenylanthracene; 2-methoxy-9,10-diphenylanthracene; Lumogen® F Violet 570 (a substituted napthalenetetracarboxylic diimide); Alq2OPh (were Al is aluminum, q is 8-hydroxyquinolate, and Ph is phenyl);

2) green-yellow luminescent compositions—9,10-bis (phenylethynyl) anthracene; 2-chloro-9,10-bis(phenylethynyl)-anthracene; Coumarin-5 (7-diethylamino-3-(2'benzothiazoyl-)coumarin); Lumogen® Yellow 083 (a substituted perylenetetracarboxylic diimide); and Mq3 (where M is a Group III metal, such as Al, Ga or In, and q is 8-hydroxyquinolate); and 3) red-orange luminescent materials—DCM-1; Lumogen® F Red 300 (a substituted perylenetetracarboxylic diimide); Lumogen® F Orange 240 (a substituted perylenetetracarboxylic diimide); tetraphenylnapthacence; zinc phthalocyanine; [benzoythiazoylidene)methyl]squaraines; tris(bipyridine-ruthenium)2+; and [3]-catenand complexes with copper.

When luminescent dyes are required that emit towards the red and which are capable of being excited non-radiatively as described more fully elsewhere in my present invention, the dyes may include so-called CyDyes from GE Healthcare: (Fluorophore, Color of fluorescence, Absorption Maximum, Emission Maximum)—Cy3, Orange 550 nm, 570 nm; Cy3.5, Scarlet, 581 nm, 596 nm; Cy5, Far-red, 649 nm, 670 nm; and Cy5.5, Near IR, 675 nm, 694 nm. The Alexa Fluor series of dyes from Invitrogen nay also be used as many have absorption maxima near the maximum of primary radiation emanating from GaN semiconductors. More specifically the dye Alexa Fluor® 430 carboxylic acid, succinimidyl ester my be used to covalently attach to suitably prepared ceramic media and or glass wall enclosures (e.g.; amine derivatized) and where said dye absorbs blue light with one maximum at 450 nm. The dye may be used to form a derivatized yttrium aluminum garnet without undue experimentation such that the new composition of matter contains both an inorganic luminescent element, such as a cerium dopant, and an organic luminescent element.

The luminophoric medium may or may not exist external to the chamber at the same time the luminophoric medium is internal to the chamber. The medium in which the fluorescent and or phosphorescent centers that are external to the chamber may include a polymeric matrix or any other matrix and need not be identical to the medium of the luminophoric medium internal to the cavity or chamber. When the external luminophoric medium contains a ceramic phosphor, it is preferential that the ceramic phosphor be a yttrium aluminum garnet phosphor in general or a Ce3+ doped yttrium aluminum garnet more specifically and that the internal luminophoric center contain, at the same time, a green luminescent fluorescers such as 9,10-bis(phenylethynyl) anthracene. When it is desirable that Ce3+ doped yttrium aluminum garnet be used in intimate contact with 9,10-bis(phenylethynyl) anthracene, then both luminophors, or a new composition of matter that contains the covalent addition of the anthracene to the active oxygen of garnet or other ceramic phosphors, or related chemical and physical adsorption of the former to the latter, are preferentially sequestered within the sealed second enclosure 111.

Even more preferred is to covalently attach an organic fluorescer, such as pyrene, to an inert solid matrix that protects the organic fluorescer, such as a zeolite or if it is preferred that the solid matrix emits light, cerium doped yttrium aluminum garnet. Pyrene with a chemical linker arm such as hexamethylene bromide reacts with aluminum oxide based luminophors such as anhydrous cerium doped yttrium aluminum garnet or strontium aluminate to form a new composition of matter: pyrene-(CH2)6-YAG: Ce3+.

In one embodiment, cerium doped yttrium aluminum garnet prepared according to a well known method used by many practitioners (Wang et. al., U.S. Pat. No. 6,717,349) is suspended in organic solvent and a red-orange derivative of Lumogen® F Red 300—derivatized with a methyleneacyl-chloride or like linker arm—is suspended in the same solvent. After a suitable period of time to insure that all of the cerium doped yttrium aluminum garnet is covalently attached to the Lumogen® F Red 300 luminophor with a CH2-CO— linker arm molecularly inserted thereto, and where the linker arm is incorporated into the Lumogen® F Red 300 with out undue experimentation (See for example, linker arm procedures as in Reynolds, et. al.; Canadian Patent Application CA 2089087; also M. J. Heller, Canadian Patent Application CA 2123133. An excellent reference for "like linker arm" can be found in Waggoner, et. al.; U.S. Pat. No. 6,673,943; issued date Jan. 6, 2004 and references incorporated therein.), red enhanced cerium doped yttrium aluminum garnet, a molecular composition different than the underivatized cerium doped yttrium aluminum garnet is isolated with removal of the reaction solvent. The red enhanced yttrium aluminum garnet composition of matter is suspended in a mixture of a casting polymer and a solvent and a film is sequestered within the sealed second enclosure 111 of FIG. 2.

The amount of dyes or fluorescers specifically formulated into the external luminophoric medium, which may for example include a polymeric matrix or other matrix material in which the dyes and/or fluorescers are soluble or dispersible, is not specifically limited, and suitable amount(s) of suitable material(s) for such purpose can be readily determined without undue experimentation, to provide good achromatic, or chromatic light emission (of virtually any tint or hue), as well as a virtually infinite series of chromaticity for all visible hues.

The amount of dyes or fluorescers specifically formulated into the luminophoric medium internal to the chamber or cavity, which may for example include a ceramic non-luminescent dispersant in which the organic dyes and/or fluorescers are adsorbed and or otherwise dispersible, is not specifically limited, and suitable amount(s) of suitable material(s) for such purpose can be readily determined without undue experimentation, to provide good achromatic, or chromatic light emission (of virtually any tint or hue), as well as a virtually infinite series of chromaticity for all visible hues.

The concentrations of the fluorescers may suitably be determined by both their luminescence quantum yields and spectral distribution, as required to define a particular color by its respective chromaticity coordinates, as well as, in the case of radiative energy transfer (but not Forster energy transfer), the absorption extinction coefficients of the associated fluorescer(s). Such fluorescers may for example be blue light fluorescers used with a blue-emitting semiconductor-based LED die, or ultraviolet light fluorescers used with a UV-emitting semiconductor-based LED die. While the concentrations of the various dyes may be suitably adjusted to realize the required colors, the range of dye concentrations typically will be between $10^{-3}$ to 10 mole percent for each individual fluorescent component.

The light-emitting assemblies shown in FIGS. 1 and 2 and 3 may be made in any suitable size and dimensional character. In application to displays, such light-emitting assemblies will generally be of a size commensurate with the size of fluorescent or incandescent lamps used in similar displays.

Figure 4:
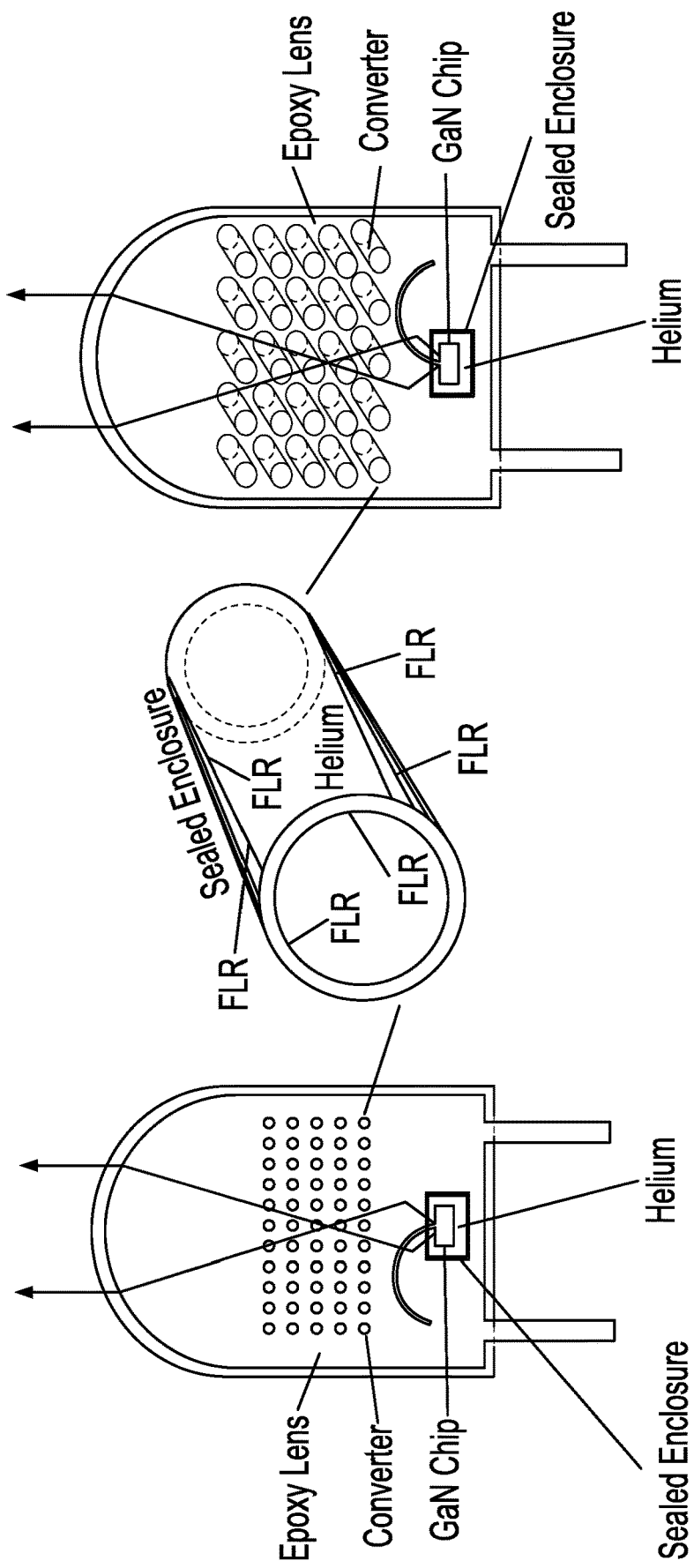
FIG. 4 shows a plurality of embodiments of a lighting element comprising a light emitting diode and a down converting element.

Referring more specifically to FIG. 4, only the down-converting medium is placed within a secondary enclosure and this arrangement is sufficient to protect the down-converting medium from deleterious elements. More specifically, a light emitting assembly may be constructed according to the design of FIG. 3 and at the same time additional down-converting medium—as a luminescent element—may be protected according to the design of FIG. 4.

The following method is sufficient to coat a ceramic phosphor onto the inner wall of the secondary enclosure:

1. An aqueous solution of polyvinyl alcohol (PVA) is made by adding 5 grams of PVA powder to 200 ml of water. The mixture is heated to 85° C. with stirring for one hour, then cooled to room temperature, and refrigerated at 2° C. overnight.

2. YAG:Ce (0.75 gram) having a particle size of from about 2-9 microns, is added to 1.5 ml of the above solution, and shaken for 5 minutes to form a phosphor slurry.

3. The slurry is applied with a micro syringe or an injection nozzle to inner wall of a secondary enclosure. The typical volume of the phosphor slurry applied to each die can be about 1.5 micro liters.

4. The secondary enclosure is baked in an oven at 130.degree. C. for 5 minutes to polymerize the binder.

Another method that may be used to practice the claims of this present invention is using a nanophase binder system as described more completely elsewhere. (M. A. Johnson, et. al.; Canadian Patent Application CA 2330941) The phosphor impregnated binders are coated within the chamber of the present invention where the phosphors selected need not be limited to the luminophors identified by M. A. Johnson et. al. but where the binders identified therein are used to apply phosphors where the phosphors are selected from the embodiments presented in this present invention as disclosed herein.

Ceramic phosphors used in such a manner may also include those from Nemoto Chemie Co., Ltd.; Tokyo 167-0043, Japan: $CaAl2O4:Eu2+,Nd3+$ (blue emitter with an emission maximum at 440 nm; excitation peak at 325 nm); $SrAl14O25:Eu2+,Nd3+$ (blue-green emitter with an emission maximum at 490 nm; excitation peak at 365 nm); $SrAl2O4:Eu2+,Nd3+$ (green emitter with an emission maximum at 530 nm; excitation peak at 365 nm).

In one embodiment, the red, green and or blue luminophors when using an ultraviolet LED die or 1) red and green or 2) red, green and yellow, or 3) red, green yellow and blue, or 4) red, green blue, yellow and cyan luminophors are printed onto the surface of the protecting and enhancing envelope using ink-jet printing where the image of colored luminescent inks is optimized to create the appearance of white light from all viewing angles and or all angle on which the light falls on to a surface.

In one embodiment, the red, green and or blue luminophors when using an ultraviolet LED die or 1) red and green or 2) red, green and yellow, or 3) red, green yellow and blue, or 4) red, green blue, yellow and cyan luminophors are printed onto the surface of the protecting and enhancing envelope using ink-jet printing and where the enhancing envelope is replaceable and interchangeable at will. In this case, for example a white light LED lamp utilized in an automobile, the light will last as long as the functioning of the LED die and the changes in color over time can be immediately reversed by inserting a replacement enhancing envelope or chamber containing different and newer luminescent elements.

Further, while the invention has been described primarily herein in reference to the generation of white light, it will be apparent that the scope of the invention is not thus limited, but rather extends to and encompasses the production of light of other colors than mixed white light, utilizing solid state primary radiation emitters, and down-converting luminophoric media.

Thus, while the invention has been described with reference to various illustrative embodiments, features, aspects, and modifications, it will be apparent that the invention may be widely varied in its construction and mode of operation, within the spirit and scope of the invention as hereinafter claimed.

The invention claimed is:
1. A microelectronic device:
comprising at least one of a light emitting diode with a p-n junction operable to emit radiation when coupled with a power source;
comprising a plurality of an optically transmissive enclosures;
comprising at least one outer optically-transmissive enclosure the boundaries of which contain an inner space within which is a plurality of innermost, second optically-transmissive enclosure, the wall of which form the boundaries of an interior space in each second enclosure;
wherein said interior space has within each at least one said light-emitting diode;
wherein a region of the inner space contains an atmospheric volume that is in thermal contact with the exterior walls of the at least one of the said second enclosures.

2. The device of claim 1, wherein the atmospheric volume is a vacuum with a vacuum pressure less than 501 millibar and more than 0.005 millibars.

3. The device of claim 1, wherein the gas has a protecting or enhancing effect wherein the atmospheric volume contains a gas other than air with a pressure less than 2,001 millibar and more than 500 millibar.

4. The device of claim 3, further comprising a luminescent element covalently attached to the outer wall of a secondary enclosure; wherein said semiconductor light-emitting diodes emit a primary radiation; wherein said luminescent element is radiatively excited by the primary radiation so as to cause the luminescent element to emit secondary radiation, wherein the luminescent element is exposed to a gas.

5. The device of claim 3, further comprising a luminophor coated onto the exterior walls of a second enclosure;
said walls comprising a glass;
said luminophor immersed within the inner space's atmospheric volume;
wherein said luminophor's emission spectrum is variable based on the temperature of the atmospheric volume it experiences;
wherein the gaseous environment reversibly changes during the operation of the device such that the device acts as a sensor.

6. A solid-state light emitting device:
comprising at least one single-die semiconductor light-emitting diode with a p-n junction comprising an optically-transmissive enclosure the boundaries of which form an inner space where in the inner space has a region of a gaseous environment other than air;
comprising a secondary optically-transmissive enclosure within the inner space of the outer enclosure the boundaries of which form an interior space wherein the interior space has a region of a gaseous environment other than air, different than the gaseous environment in the inner space;
wherein the at least one light-emitting diode to emit light when energized with an electrical current is in the inner space of said optically-transmissive enclosure.

7. The device of claim 6, further comprising a fluorescent, a phosphorescent, a thermo-luminescence or an electroluminescent material coated on the exterior walls of the second enclosure.

8. The device of claim 7, wherein the gas in the inner space is ammonia, nitrogen, argon, krypton or xenon or any combination thereof.

9. The device of claim 7, wherein the gas in the interior space contains argon, krypton or xenon or any combination thereof.

10. A light-emission device:
comprising at least one of a single-die, a two-lead GaN semiconductor light-emitting diode die capable of emitting radiation said diode the donor;
comprising a recipient luminophoric element for converting non-radiatively energy transferred from the donor to the luminophoric element;
wherein the ground-state of the acceptor is capable of reducing the excited state lifetime of the donor;
wherein the two-lead diode die is within the interior space of a secondary optically-transmissive enclosure with a layer of luminescent element, said element an acceptor;
wherein the same or different luminescent element is in the interior space of each of a plurality of different secondary optically-transmissive enclosures, said element a converter;
wherein the interior space of both the secondary optically-transmissive enclosure containing a light emitting diode die and the secondary optically-transmissive enclosures containing luminescent element comprises a region of the same or different Noble or otherwise inert gas;
wherein all of the secondary enclosures are within the inner space of an outer optically-transmissive enclosure.

11. The device of claim 10, wherein the luminescent material that is an acceptor comprises cerium doped yttrium aluminum garnet.

12. The device of claim 10, wherein the converter comprises an optically active, chiral luminescent material.

* * * * *